US010566373B2

(12) United States Patent
Goto et al.

(10) Patent No.: US 10,566,373 B2
(45) Date of Patent: Feb. 18, 2020

(54) SOLID STATE IMAGE SENSOR AND MANUFACTURING METHOD THEREOF

(71) Applicant: Renesas Electronics Corporation, Koutou-ku, Tokyo (JP)

(72) Inventors: Yotaro Goto, Ibaraki (JP); Tatsuya Kunikiyo, Tokyo (JP); Hidenori Sato, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/983,029

(22) Filed: May 17, 2018

(65) Prior Publication Data

US 2018/0366508 A1 Dec. 20, 2018

(30) Foreign Application Priority Data

Jun. 15, 2017 (JP) .................................. 2017-117593

(51) Int. Cl.
*H01L 31/062* (2012.01)
*H01L 27/146* (2006.01)
*H01L 23/00* (2006.01)

(52) U.S. Cl.
CPC ........ *H01L 27/14636* (2013.01); *H01L 24/05* (2013.01); *H01L 24/08* (2013.01); *H01L 24/29* (2013.01); *H01L 24/32* (2013.01); *H01L 27/1463* (2013.01); *H01L 27/1469* (2013.01); *H01L 27/14634* (2013.01); *H01L 27/14643* (2013.01); *H01L 2224/0557* (2013.01);
(Continued)

(58) Field of Classification Search
CPC ........... H01L 27/14643; H01L 27/1469; H01L 27/14634; H01L 2224/32145
See application file for complete search history.

(56) References Cited

U.S. PATENT DOCUMENTS 9,171,875 B2 * 10/2015 Hayashi .............. H01L 27/1461
9,197,825 B2 11/2015 Oike
(Continued)

FOREIGN PATENT DOCUMENTS

WO WO 2007/105478 A1 9/2007

OTHER PUBLICATIONS

Reif et al., "Fabrication Technologies for Three-Dimensional Integrated Circuits," International Symposium on Quality Electronic Design (ISQED'02), 2002, pp. 33-37.
(Continued)

*Primary Examiner* — Hsien Ming Lee
(74) *Attorney, Agent, or Firm* — Shapiro, Gabor and Rosenberger, PLLC

(57) ABSTRACT

In a solid state image sensor having two semiconductor substrates or more laminated longitudinally, electrical connection between the semiconductor substrates is made by a fine plug. An insulating film covering a first rear surface of a semiconductor substrate having a light receiving element, and an interlayer insulating film covering a second main surface of a semiconductor substrate mounting a semiconductor element are joined to each other. In its joint surface, a plug penetrating the insulating film and a lug embedded in a connection hole in an upper surface of the interlayer insulating film are joined, and the light receiving element and the semiconductor element are electrically connected through the plugs.

15 Claims, 32 Drawing Sheets

(52) U.S. Cl.
CPC ............... *H01L 2224/05647* (2013.01); *H01L 2224/08146* (2013.01); *H01L 2224/29188* (2013.01); *H01L 2224/32145* (2013.01)

(56) References Cited

U.S. PATENT DOCUMENTS

| | | |
|---|---|---|
| 9,911,870 B2 * | 3/2018 | Sato .................... H01L 27/1461 |
| 2011/0049336 A1 | 3/2011 | Matsunuma |
| 2014/0035083 A1 * | 2/2014 | Wan .................. H01L 27/14634 257/432 |

OTHER PUBLICATIONS

Extended European search report for European Patent Application No. 18173431.0, dated Nov. 16, 2018.

* cited by examiner

FIG. 12
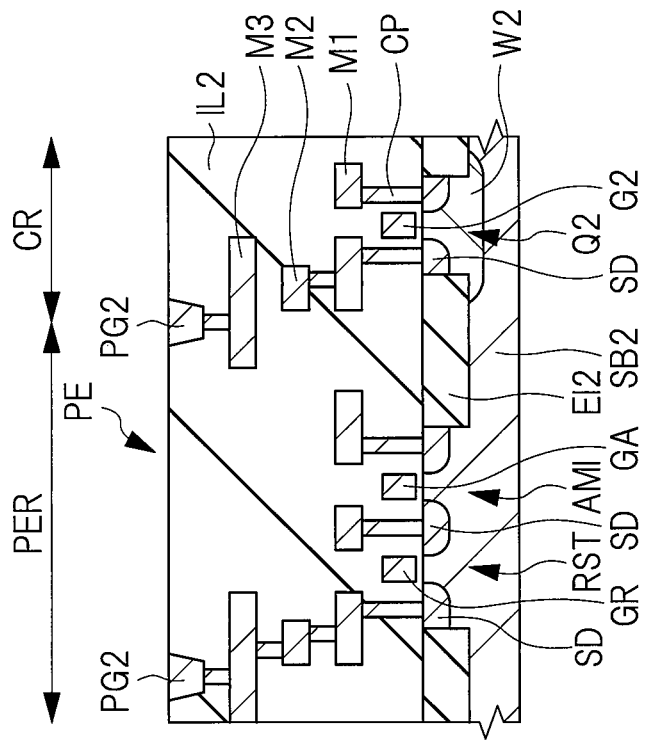
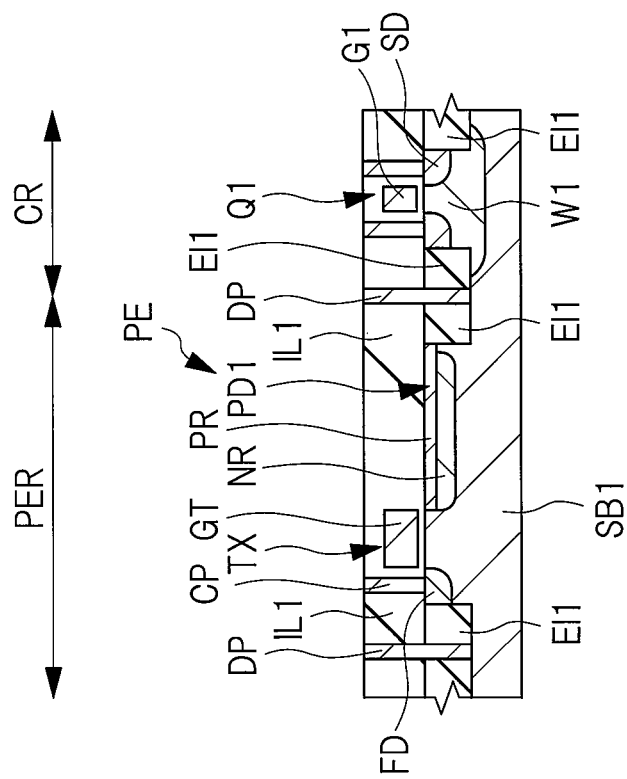

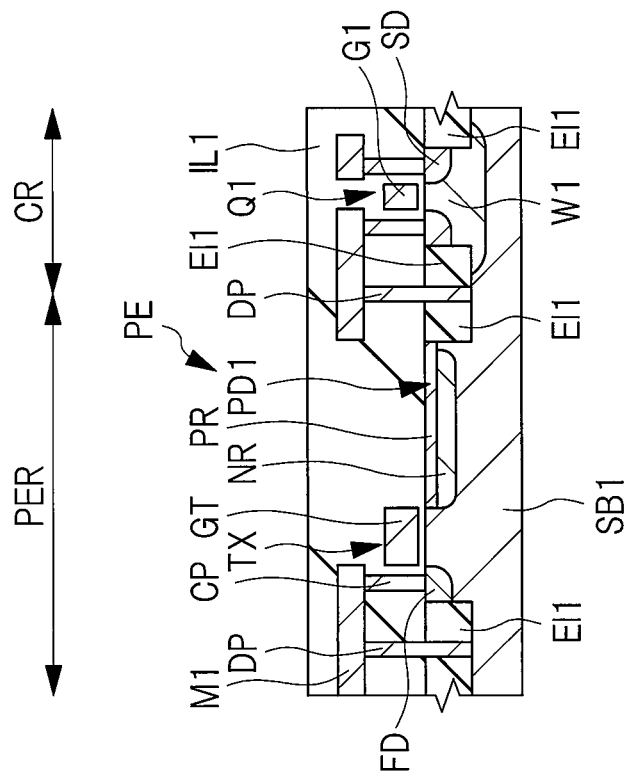
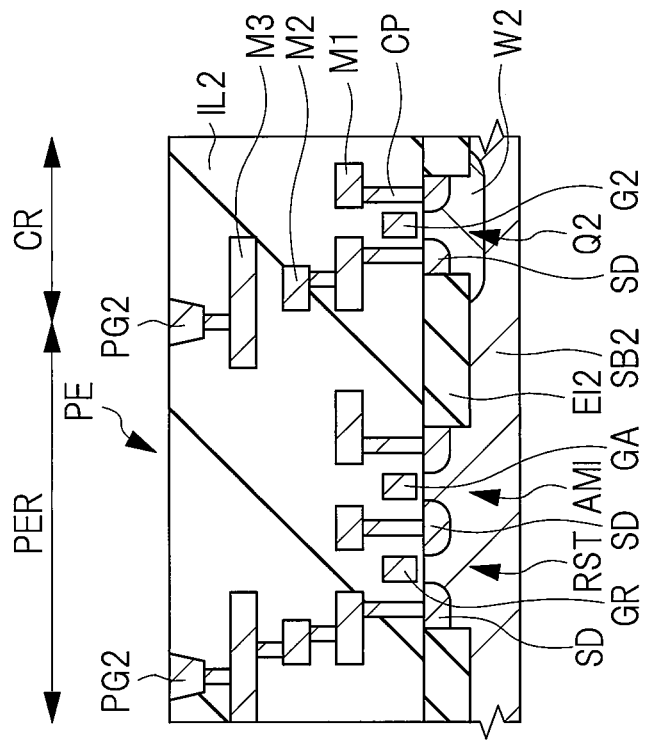
FIG. 13

SOLID STATE IMAGE SENSOR AND MANUFACTURING METHOD THEREOF

CROSS-REFERENCE TO RELATED APPLICATION

The present application claims priority from Japanese Patent Application No. 2017-117593 filed on Jun. 15, 2017, the content of which is hereby incorporated by reference into this application.

TECHNICAL FIELD OF THE INVENTION

The present invention relates to a solid state image sensor and its manufacturing method, particularly, a technique effectively applied to a solid state image sensor laminating two semiconductor substrates or more longitudinally.

BACKGROUND OF THE INVENTION

A plurality of wafers each forming a semiconductor element(s), a wiring(s), or the like are laminated on a semiconductor substrate, and a semiconductor chip is obtained from a laminated semiconductor substrate formed by the laminated wafers. By doing so, it has been known that an integration degree of the semiconductor chip is improved.

Non Patent Document 1 (Fabrication technologies for three-dimensional integrated circuits, International Symposium on Quality Electronic Design (ISQED), 2002, pp. 33-37) discloses that: a plug(s) is formed on a rear surface of an SOI substrate; a wiring(s) exposed from an upper surface of a wiring layer on the SOI substrate is formed; and thereby a plurality of substrates, on each of which an element(s) and a wiring(s) are formed, are electrically connected to one another and are laminated.

SUMMARY OF THE INVENTION

In a case of forming a solid state image sensor having a laminated substrate by bonding a semiconductor wafer, on which a light receiving element(s) is formed, and another semiconductor wafer to each other, it is thought that main surface sides of their semiconductor wafers are joined to each other. However, three semiconductor wafers or more cannot be laminated only by a technique of joining the main surface sides of the semiconductor wafers to each other.

Additionally, it is thought that a Si (silicon) through-electrode (TSV: through-silicon via) formed over a range of an interior of one semiconductor wafer to an interior of another semiconductor wafer is used as a conductive connection part electrically connecting the laminated semiconductor wafers to each other. However, the TSV has a large diameter and is difficult to place in a pixel array in which pixels are arranged. Therefore, if the semiconductor wafers are electrically connected to each other by using the TSV, there arise a problem etc. in which a current path(s) becomes long.

The other objects and novel characteristics of the present invention will be apparent from the description of the present specification and the accompanying drawings.

The following is a brief description of an outline of the typical invention disclosed in the present application.

A solid state image sensor that is one embodiment includes: a first semiconductor substrate; a second semiconductor substrate; an insulating film covering a rear surface of the first semiconductor substrate; an interlayer insulating film covering a main surface of the second semiconductor substrate; a first conductive connection part penetrating the insulating film; and a second conductive connection part embedded in a connection hole in an upper surface of the interlayer insulating film, in which the insulating film and the interlayer insulating film are joined and the first and second conductive connection parts are joined.

According to one embodiment disclosed in the present application, performance of the solid state image sensor can be improved.

BRIEF DESCRIPTIONS OF THE DRAWINGS

FIG. 12 is a sectional view during a manufacturing step of the solid state image sensor that is modification example 1 of embodiment 1 according to the present invention;

FIG. 13 is a sectional view during a manufacturing step of the solid state image sensor subsequently to FIG. 12;

DESCRIPTIONS OF THE PREFERRED EMBODIMENTS

Figure 1:
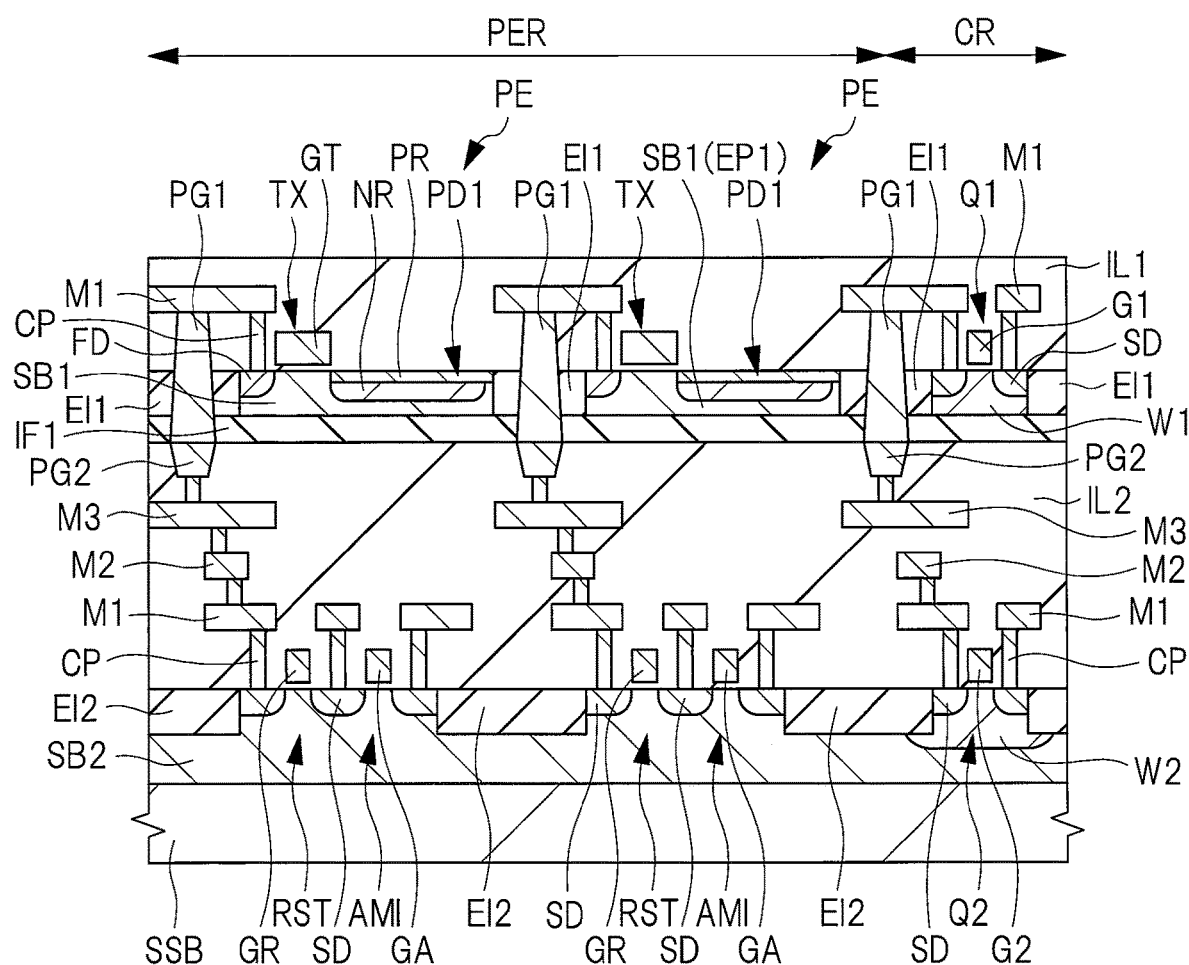
FIG. 1 is a sectional view illustrating a solid state image sensor that is embodiment 1 according to the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

(Embodiment 1)

A solid state image sensor according the present embodiment includes: a semiconductor substrate having a photodiode that is a light receiving element (photoelectric converter, photoelectric conversion element) of each pixel; the other semiconductor substrate laminated on the semiconductor substrate, and a peripheral transistor formed on each pixel being formed on the other semiconductor substrate. Additionally, the solid state image sensor according to the present embodiment is a sensor in which an insulating film and a plug exposed from a main surface side of one semiconductor substrate, and an insulating film and a plug and a plug exposed from a surface on a rear surface side of the other semiconductor substrate are joined.

<Structure of Solid State Image Sensor and Operation of Pixel>

Figure 2:
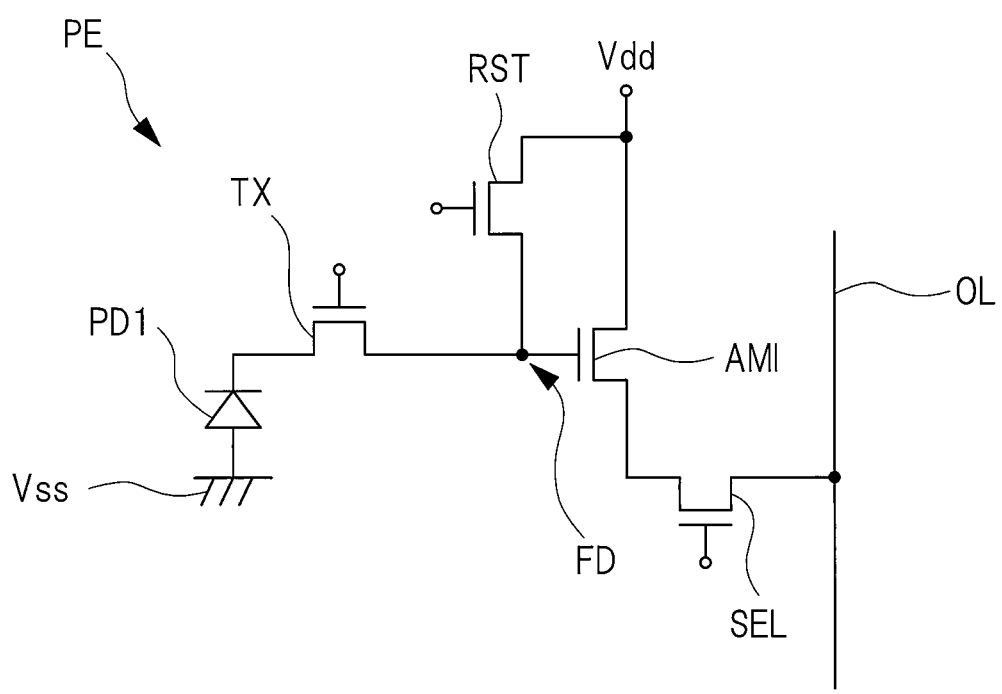
FIG. 2 is an equivalent circuit schematic of pixels configuring the solid state image sensor that is embodiment 1 according to the present invention.

Hereinafter, a structure of a solid state image sensor according to present embodiment 1, and an operation of a pixel(s) configuring the solid state image sensor will be explained with reference to FIGS. 1 and 2. FIG. 1 is a sectional view illustrating a solid state image sensor according to the present embodiment. FIG. 2 is an equivalent circuit schematic illustrating the solid state image sensor according to the present embodiment. FIG. 2 shows an equivalent circuit schematic including, in one pixel, one light receiving element and a peripheral transistor of the light receiving element. FIG. 1 illustrates a pixel region PER and a peripheral circuit region CR in order from left, and only two pixels PE are illustrated in the pixel region PER.

Herein, supposed and explained as one example of the pixel will be a four-transistor type pixel used as a pixel realizing circuit in a CMOS image sensor. However, the four-transistor type pixel is not limited thereto. That is, each pixel has a light receiving element, and a transfer transistor and three transistors serving as a peripheral transistor are arranged in one pixel having a photodiode serving as one light receiving element. Here, the peripheral transistor indicates each of a reset transistor, an amplification transistor, and a selection transistor.

The solid state image sensor according to the present embodiment is a complementary metal oxide semiconductor (CMOS) image sensor. The solid state image sensor that is a semiconductor chip has: a pixel region (pixel array region) PER shown in FIG. 1; and a peripheral circuit region CR surrounding a circumference of the pixel region PER in a plan view. A plurality of pixels PE are arranged in a matrix within the pixel region PER in a plan view. That is, the plural pixels PE are arranged on a main surface (upper surface) of a semiconductor substrate SB1, which configures the solid state image sensor, in an array in X and Y directions extending along the main surface of the semiconductor substrate SB1 configuring the solid state image sensor. The X direction is orthogonal to the Y direction.

Most of an area of each pixel PE is occupied by a photodiode PD1 that is a light receiving unit (light receiving element). The pixel region PER, the pixel PE, and the photodiode PD1 have rectangular shapes in a plan view. The peripheral circuit region CR includes, for example, a pixel reading circuit, an output circuit, a row selecting circuit, and a control circuit, etc.

Each of the plural pixels PE is a portion that generates a signal(s) depending on strength of light to be irradiated. The row selecting circuit selects the plural pixels PE in units of a row. The pixel PE selected by the row selecting circuit outputs the generated signal to an output line. The reading circuit reads the signal outputted from the pixel PE and outputs it to the output circuit. The reading circuit reads signals of the plural pixels PE. The output circuit outputs, outside the solid state image sensor, the signal of the pixel PE read by the reading circuit. The control circuit overall manages operations of the entire solid state image sensor, and controls an operation(s) of other constituent elements of the solid state image sensor.

Out of a first semiconductor substrate and a second semiconductor substrate laminated longitudinally, one pixel in the present embodiment has a photodiode PD1 formed on the first semiconductor substrate and has, on the second semiconductor substrate, the peripheral transistor connected to the photodiode PD1 in each pixel PE.

Next, shown by FIG. 2 is a circuit including the light receiving element (photoelectric converter, photoelectric conversion element) formed in one pixel. That is, each of the plural pixels has the circuit shown by FIG. 2.

As shown in FIG. 2, the pixel has: the photodiode PD1 performing photoelectric conversion; and a transfer transistor TX transferring electric charges generated by the photodiode. The pixel also has: a floating diffusion capacitor (photoelectric diffusion region) FD storing the electric charges to be transferred from the transfer transistor TX; and an amplification transistor AMI amplifying a potential of the floating diffusion capacitor FD. The pixel further has: a selection transistor SEL making a selection about whether the potential amplified by the amplification transistor AMI is outputted to an output line OL connected to the reading circuit (not shown); and a reset transistor RST initializing, to predetermined potentials, potentials of a cathode of the photodiode PD1 and the floating diffusion capacitor FD.

Each of the transfer transistor TX, the reset transistor RST, the amplification transistor AMI, and the selection transistor SEL is, for example, an n type MOSFET. A grounding potential that is a negative-side power supply potential Vss is applied to an anode of the photodiode PD1, and the cathode of the photodiode PD1 is connected to a source of the transfer transistor TX. The floating diffusion capacitor FD is connected to a drain of the transfer transistor TX, a source of the reset transistor RST, and a gate of the amplification transistor AMI. Applied to a drain of the reset transistor RST and a drain of the amplification transistor AMI is a positive-side power supply potential Vdd. A source of the amplification transistor AMI is connected to a drain of the selection transistor SEL. A source of the selection transistor SEL is connected to the output line OL.

Next, an operation of the pixel will be explained. Firstly, a predetermined potential is applied to gate electrodes of the transfer transistor TX and the reset transistor RST, and both of the transfer transistor TX and the reset transistor RST become on-states. After such states, electric charges remaining in the photodiode PD1 and electric charges stored in the floating diffusion capacitor FD flow toward the positive-side power supply potential Vdd, and the electric charges in the photodiode PD1 and the floating diffusion capacitor FD are initialized. Then, the reset transistor RST becomes an Off-state.

Next, incident light is irradiated to a PN junction of the photodiode PD1, and photoelectric conversion occurs in the photodiode PD1. As a result, the electric charges are generated in the photodiode PD1. All of those electric charges are transferred to the floating diffusion capacitor FD by the transfer transistor TX. The floating diffusion capacitor FD stores the electric charges transferred. This brings a change in the potential of the floating diffusion capacitor FD.

Next, when the selection transistor SEL becomes an on-state, the changed potential of the floating diffusion capacitor FD is amplified by the amplification transistor AMI, and then is outputted to the output line OL. The reading circuit reads a potential of the output line OL. Thus, from each of the plural pixels formed in a pixel array part, information on the electric charges is read, and an image(s) photographed by an image element can be obtained.

Next, a sectional structure of the solid state image sensor according to the present embodiment will be explained by using FIG. 1. In the present application, a substrate composed of a semiconductor(s), and an epitaxial layer (epitaxial growth layer, semiconductor layer) formed on the substrate are collectively called a semiconductor substrate in some cases. However, even when the substrate is removed from the semiconductor substrate laminated and formed by the substrate and epitaxial layer, the remaining epitaxial layer is called a semiconductor substrate.

The above photodiode is formed on an upper surface of the semiconductor substrate including the epitaxial layer, and source/drain regions and a channel(s) of a field-effect transistor configuring the above-mentioned various circuits are formed on the main surface of the semiconductor substrate including the epitaxial layer.

Additionally, herein, a first semiconductor substrate having a first main surface and a first rear surface opposite to the first main surface, and a second semiconductor substrate having a second main surface and a second rear surface opposite to the second main surface are prepared, and the solid state image sensor joined and formed by a second main surface side of the second semiconductor substrate and a first rear surface side of the first semiconductor substrate will be explained.

Incidentally, the main surface of the semiconductor substrate herein mentioned indicates a surface on a side of forming semiconductor elements such as a photodiode and a transistor out of the surfaces of the semiconductor substrate. Herein, a surface opposite to the main surface is called a rear surface of the semiconductor substrate. Additionally, when a wiring layer including an interlayer insulating film is formed on the main surface of the semiconductor substrate, a surface on a main surface side of the semiconductor substrate herein mentioned indicates a surface on a side opposite to the main surface side of the semiconductor substrate out of surfaces of the wiring layer, i.e., the uppermost surface of the wiring layer. Further, when an insulating film covering a rear surface of the semiconductor substrate is formed, a surface on a rear surface side of the semiconductor substrate herein mentioned indicates a surface on a side opposite to a rear surface side of the semiconductor substrate out of surfaces of the insulating film, i.e., the lowermost surface of the insulating film.

FIG. 1 shows a cross-section of the solid state image sensor including the pixel region PER and the peripheral circuit region CR. As shown in FIG. 1, the solid state image sensor has a p⁻ type semiconductor substrate SB1 serving as a first semiconductor substrate, and a p⁻ type semiconductor substrate SB2 serving as a second semiconductor substrate. The semiconductor substrate SB1 is composed of an epitaxial layer EP1, and the semiconductor substrate SB2 is composed of: a substrate S2 (see FIG. 3) made of silicon (Si); and an epitaxial layer EP2 (see FIG. 3) formed thereon. In the solid state image sensor shown in FIG. 1, the semiconductor substrate SB1 means the epitaxial layer EP1, and the semiconductor substrate SB2 means the substrate S2 and the epitaxial layer EP2 formed thereon. Incidentally, in the drawing, the substrate S2 and the epitaxial layer EP2 are collectively shown as the semiconductor substrate SB2.

The semiconductor substrate SB1 has a first main surface and a first rear surface opposite to the first main surface, and the semiconductor substrate SB2 has a second main surface and a second rear surface opposite to the second main surface. The semiconductor substrate SB1 is composed of an epitaxial growth layer (semiconductor layer), for example, a Si (silicon) layer.

The first rear surface of the semiconductor substrate SB1 is covered with an insulating film IF1 contacting with the first rear surface. The insulating film IF1 is composed of, for example, a silicon oxide film. A plurality of pixels PE are arranged laterally in the pixel region PER, and one pixel PE out of them is shown in FIG. 1. The "lateral direction" herein mentioned means a direction (horizontal direction) extending along the first main surface of the semiconductor substrate SB1 or the second main surface of the semiconductor substrate SB2. An element isolation region (element isolation part, element isolation film) EI1 for isolating elements is formed on an upper surface (first main surface) of the semiconductor substrate SB1 in the pixel region PER and the peripheral circuit region CR. The element isolation region EI1 is configured by an insulating film that is embedded in a trench formed in the upper surface of the semiconductor substrate SB1 and that is composed of a silicon oxide film etc.

The element isolation region EI1 penetrates the semiconductor substrate SB1. That is, the element isolation region EI1 is formed over a range of the upper surface (first main surface) of the semiconductor substrate SB1 to a lower surface (first rear surface) thereof, and a lower surface of the element isolation region EI1 contacts with the isolating film IF1. Additionally, an upper surface of the element isolation region EI1 contacts with a lower surface of an interlayer insulating film IL1 described below. Height (Position) of the upper surface of the element isolation region EI1 is almost the same as height (position) of the upper surface of the semiconductor substrate SB1. The element isolation region EI1 has a STI (shallow trench isolation) structure.

A photodiode PD1 is formed on the upper surface (active region) of the semiconductor substrate SB1 in a region, which is exposed from the element isolation region EI1, within the pixel PE. The photodiode PD1 has a p$^+$ type semiconductor region PR formed on the upper surface of the semiconductor substrate SB1, and an n type semiconductor region NR that contacts with a bottom surface of the p$^+$ type semiconductor region PR and that is formed in the semiconductor substrate SB1 under the p$^+$ type semiconductor region PR. That is, the photodiode PD1 is configured by a PN junction of the p$^+$ type semiconductor region PR and the n type semiconductor region NR. An n type impurity concentration (e.g., P (phosphorus) or As (arsenic)) of the n type semiconductor substrate SB1 is higher than an impurity concentration of the semiconductor substrate SB1.

In the pixel PE, a floating diffusion capacitor FD separated from the photodiode PD1 and serving as the n type semiconductor region is formed on the first main surface of the semiconductor substrate SB1 in the active region in which the photodiode PDI is formed. Depth of the floating diffusion capacitor FD is shallower than depth of the n type semiconductor region NR. Additionally, a gate electrode GT is formed through a gate insulating film and just on the first main surface between the floating diffusion capacitor FD and the n type semiconductor region NR adjacent to each other in the first main surface of the semiconductor substrate SB1. The gate electrode GT, the floating diffusion capacitor FD, and the n type semiconductor region NR configures the transfer transistor TX. The n type semiconductor region NR configures a source region of the transfer transistor TX, and the floating diffusion capacitor FD configures a drain region of the transfer transistor TX.

A transistor Q1 having a channel region is formed on the upper surface of the semiconductor substrate SB1 in the peripheral circuit region CR. Herein, the transistor Q1 will be explained as an n-channel type MISFET (Metal Insulator Semiconductor Field Effect Transistor), but may be explained as a p-channel type MISFET. Transistors each having an n-channel type and a p-channel type are actually formed in the peripheral circuit region CR. The transistor Q1 has a gate electrode G1, which is formed through the gate insulating film on the upper surface of the semiconductor substrate SB1, in the active region defined by the element isolation region EI1. Source/drain regions SD are formed on the upper surface of the semiconductor substrate SB1 lateral to the gate electrode G1 so as to sandwich the gate electrode G1 in a plan view. The transistor Q1 is composed of the gate electrode G1 and the source/drain regions SD.

A well W1 serving as a p type semiconductor region in which p type impurities (e.g., B (boron)) are introduced is formed on the first main surface of the semiconductor substrate SB1, on which the transistor Q1 is formed, in the peripheral circuit region CR. Depth of the well W1 is larger than those of the source/drain regions SD. Further, a plurality of transistors Q1 and other kinds of semiconductor elements are formed in the peripheral circuit region CR, and a space(s) between those elements is separated from the element isolation region EI1. The element isolation region EI1 has almost the same depth as the element isolation region EI1 formed in the pixel PE.

Each gate insulating film of the transfer transistor TX and the transistor Q1 is composed of, for example, a silicon oxide film, and the gate insulating films GT and G1 are each composed of, for example, a polysilicon film. Each of the source/drain regions SD is composed of an n type semiconductor region, in which n type impurities (e.g., P (phosphorus) or As (arsenic)) are introduced, on the upper surface of the semiconductor substrate SB1. When the transistor Q1 operates, a channel is formed on or over the upper surface of the semiconductor substrate SB1 lying between the source/drain regions SD. Although omitted in the drawing, a silicide layer made of CoSi (cobalt silicide) etc. covers the respective upper surfaces of the source/drain regions SD and the gate electrode G1.

The interlayer insulating film IL1 is formed on the semiconductor substrate SB1 so as to cover the element isolation region EI1, the photodiode PD1, and the transistor Q1. The interlayer insulating film IL1 is composed of an interlayer insulating film configuring each of: a contact layer and a wiring layer that are laminated in order from the first main surface side of the semiconductor substrate SB1. That is, the interlayer insulating film IL1 includes a plurality of interlayer insulating films laminated on the first main surface of the semiconductor substrate SB1. Additionally, the interlayer insulating film IL1 and each of the gate insulating films of the transfer transistor TX and the transistor Q1 in the drawing are shown in an integrally combined state.

The interlayer insulating film configuring the contact layer includes: a liner film (etching stopper film) composed of a silicon nitride film deposited on the semiconductor substrate SB1; and a silicon oxide film deposited on the liner film. In the drawing, a boundary is not shown between the interlayer insulating films adjacent to each other out of the plural interlayer insulating films configuring the interlayer insulating film IL1. Upper surfaces of their interlayer insulating films lying at a position corresponding to the boundary are all made flat. A case in which only one wiring layer lies on or over the semiconductor substrate SB1 will be explained herein. However, two wiring layers or more may be laminated.

A first wiring layer include a wiring M1. The wiring M1 is mainly made of, for example, Cu (copper), Al (aluminum), or the like. Contact plugs CP are embedded in a plurality of contact holes penetrating the interlayer insulating film, which serves as the contact layer, in a longitudinal direction, i.e., a direction (perpendicular direction) perpendicular to the first main surface of the semiconductor substrate SB1. The contact plug CP is a conductive connection part mainly made of, for example, W (tungsten). The contact plug CP electrically connects the wiring M1 and a semiconductor element formed on the first main surface of the first semiconductor substrate. Shown in FIG. 1 is the contact plug CP connected to the floating diffusion capacitor FD and the source/drain regions SD. The interlayer insulating film IL1 covers the wiring M1, and an upper surface of the interlayer insulating film IL1 is made flat. In order to prevent light irradiated to the photodiode PD1 from being shielded by each wiring, the wiring M1 is not formed just on or over the photodiode PD1.

Formed just under the wiring M1 in the pixel region PER and peripheral circuit region CR is the plug PG1 that penetrates: the contact layer configuring the interlayer insulating film IL1; the element isolation region EI1; and the interlayer insulating film IF1. The plug PG1 penetrates the element isolation region EI1, and so does not contact with the semiconductor substrate SB1. In other words, the plug PG1 is separated from the semiconductor substrate SB1 through the element isolation region EL1. A bottom surface of the plug PG1 and a bottom surface of the insulating film IF1 are made flat in almost the same plane. The plug PG1 is a conductive connection part embedded in a connection hole (concave part, trench) formed from a bottom surface side of the insulating film IF1, and has a trapezoid section shape. That is, lateral-directional width of the plug PG1 on an upper surface side of the plug PG1 is smaller than that on a lower surface side thereof.

The semiconductor substrate SB2 is placed under the insulating film IF1 and the plug PG1. The semiconductor substrate SB2 has larger width in a longitudinal direction than the semiconductor substrate SB1. The supporting substrate SSB is bonded to the second rear surface of the semiconductor substrate SB2.

An element isolation region EI2 for separating elements is formed on the upper surface (second main surface) of the second semiconductor substrate SB2 in the pixel region PER and the peripheral circuit region CR. The element isolation region EI2 is configured by an insulating film composed of a silicon oxide film etc. embedded in a trench formed on the upper surface side of the semiconductor substrate SB2. The element isolation region EI2 reaches on the way to depth of the semiconductor substrate SB2. Height of the upper surface of the element isolation region EI2 is almost the same as height of the upper surface of the semiconductor substrate SB2. The element isolation region EI2 has a STI structure.

"Depth" herein mentioned, i.e., each depth of, for example, the trench, the element isolation region, the semiconductor region, or the like formed in the second main surface of the semiconductor substrate SB2 indicates a distance from the second main surface of the semiconductor substrate SB2 in a downward direction of the second main surface of the semiconductor substrate SB2 to the second rear surface of the semiconductor substrate SB2.

Formed near the second main surface of the semiconductor substrate SB2 in each pixel PE are: the reset transistor RST serving as the peripheral transistor; the amplification transistor AMI; and the selection transistor SEL (see FIG. 2). In FIG. 1, the selection transistor SEL is not shown. When an image(s) is taken by the solid state image sensor, electric charges are generated as a signal(s) in the photodiode PD1 receiving light, and the transfer transistor TX transfers the electric charges to the floating diffusion capacitor FD connected to the drain region of the transfer transistor TX. This signal is amplified by the amplification transistor and the selection transistor, and is outputted to the above output line. Thus, the signal obtained by taking the image can be read. Incidentally, the reset transistor is used for resetting the electric charges accumulating in the floating diffusion capacitor FD.

A case in which n-channel type MISFETs such as the reset transistor RS and the amplification transistor AMI are formed near the second main surface of the semiconductor substrate SB2 in each pixel PE will be explained herein. However, a p-channel type MISFET may be formed near the second main surface of the semiconductor substrate SB2 in each pixel PE. The reset transistor RST has: a gate electrode GR formed through a gate insulating film over the upper surface of the semiconductor substrate SB2; and source/drain regions SD on the upper surface of the semiconductor substrate SB2 lateral to the gate electrode GR so as to sandwich the gate electrode GR in a plan view. Additionally, the amplification transistor AMI has: a gate electrode GA formed through a gate insulating film over the upper surface of the semiconductor substrate SB2; and source/drain regions SD formed on the upper surface of the semiconductor substrate SB2 lateral to the gate electrode GA so as to sandwich the gate electrode GA in a plan view. The selection transistor has almost the same structure as those of the reset transistor RST and the amplification transistor AMI.

Formed on the upper surface of the semiconductor substrate SB2 in the peripheral circuit region CR is a transistor Q2 having a channel region. A case in which the transistor Q2 is an n-channel type MISFET will be explained herein. However, the transistor Q2 may be a p-channel type MISFET. The n-channel type transistor and the p-channel type transistor are actually formed in the peripheral circuit region CR. The transistor Q2 has a gate electrode G2, which is formed through a gate insulating film over the upper surface of the semiconductor substrate SB2, in an active region defined by the element isolation region EI2. Source/drain regions SD are formed on the upper surface of the semiconductor substrate SB2 lateral to the gate electrode G2 so as to sandwich the gate electrode G2 in a plan view. The transistor Q2 is composed of the gate electrode G2 and the source/drain regions SD.

A well W2 serving as a p type semiconductor region in which p type impurities (e.g., B (boron)) are introduced is formed on the second main surface of the semiconductor substrate SB2, on which the reset transistor RST, the amplification transistor AMI, the selection transistor (not shown), and the transistor Q2 are formed, in the pixel region PER and the peripheral circuit region CR. Depth of the well W2 is larger than those of the source/drain regions SD and the element isolation region EI2. Further, a bottom surface of the well W2 does not reach the second rear surface of the semiconductor substrate SB2. Incidentally, although not illustrated in the drawing, a well serving as a p type semiconductor region is similarly formed also on the second main surface of the semiconductor substrate SB2 in the active region in which each of the reset transistor RST and the amplification transistor AMI is formed.

In the pixel region PER and the peripheral circuit region CR, each gate insulating film of the reset transistor RST, the amplification transistor AMI, and the transistor Q2 is composed of, for example, a silicon oxide film, and the gate electrodes GR, GA, and G2 are each composed of, for example, a polysilicon film. Each of the source/drain regions SD is composed of an n type semiconductor region obtained by introducing n type impurities (e.g., P (phosphorus) or As (arsenic)) into the upper surface of the semiconductor substrate SB2. When the transistor Q2 operates, a channel is formed on the upper surface of the semiconductor substrate SB2 lying between the source/drain regions.

An interlayer insulating film IL2 is formed on the semiconductor substrate SB2 so as to cover the element isolation region EI2, the reset transistor RST, the amplification transistor AMI, the selection transistor (not shown), and the transistor Q2. The interlayer insulating film IL2 is composed of interlayer insulating films configuring a contact layer and a plurality of wiring layers laminated in order from the main surface side of the semiconductor substrate SB2. That is, the interlayer insulating film IL2 includes the plural interlayer insulating films laminated on the second main surface of the semiconductor substrate SB2. Additionally, the interlayer insulating film IL2 and each gate insulating film of the peripheral transistor and the transistor Q2 are collectively shown in the drawing.

The interlayer insulating film configuring the contact layer includes: a liner film (etching stopper film) composed of a silicon nitride film deposited on the semiconductor substrate SB2; and a silico oxide film deposited on the liner film. A boundary between the interlayer insulating films that are adjacent to each other and that configure the interlayer insulating film IL2 is not shown in the drawing. The plural wiring layers include, for example, a first wiring layer, a second wiring layer, and a third wiring layer laminated in order from the second main surface side of the semiconductor substrate SB2. The number of wiring layers laminated may be more than or less than three.

The first wiring layer includes the wiring M1; the second wiring layer includes a wiring M2 placed on the wiring M1; and the third wiring layer includes a wiring M3 placed on the wiring M2. Each of the wirings M1 to M3 is mainly made of, for example, Cu (copper), Al (aluminum), or the like. Contact plugs CP are embedded in a plurality of contact holes each penetrating, in a longitudinal direction, the interlayer insulating film serving as the contact layer. The contact plug CP is mainly made of, for example, W (tungsten). The contact plug CP electrically connects the wiring M1 and a semiconductor element formed on the second main surface of the semiconductor substrate SB2. Incidentally, the reset transistor RST and the amplification transistor AMI mutually share one of the source/drain regions SD.

In FIG. 1, the contact plug CP connected to the source/drain regions SD is shown. The wiring M1 and the wiring M2 are electrically connected to each other by a via-hole penetrating the interlayer insulating film IL2 lying between the wirings M1 and M2. The wiring M2 and the wiring M3 are electrically connected by a via-hole penetrating the interlayer insulating film IL2 lying between the wirings M2 and M3. Additionally, a via-hole connected to an upper surface of the wiring M3 is formed on the wiring M3. Each of the above-mentioned plural via-holes is mainly made of, for example, Cu (copper). The interlayer insulating film IL2 covers the wirings M1 to M3, and an upper surface of the interlayer insulating film IL2 is flat.

A plurality of connection holes (concave parts, trenches) are formed on the upper surface of the interlayer insulating film IL2 in the pixel region PER and the peripheral circuit region CR. A plug PG2 is embedded in each of the connection holes. The plug PG2 is formed just on the via-hole connected to the upper surface of the wiring M3, and the upper surface of the via-hole is exposed from the interlayer insulating film IL2 in a bottom part of each of the connection holes. A lower surface of the plug PG2 and the upper surface of the via-hole are connected in each bottom part of the connection holes. The plug PG2 is a conductive connection part embedded in each connection hole (concave part, trench) formed from the upper surface side of the interlayer insulating film IL2, and has a converted trapezoid cross-section shape. That is, lateral-directional width of the plug PG2 on an upper surface side of the plug PG2 is larger than that on a lower surface side of the plug PG2.

Although not illustrated in the drawing, a passivation film PF serving as a surface protection film and a microlens ML on the passivation film PF may be formed on the upper surface of the interlayer insulating film IL1. The passivation film is formed by, for example, a silicon oxide film, and a silicon nitride film placed on the silicon oxide film. The microlens ML is composed of a hemispherical film, whose upper surface is a curved surface, and is formed for each of the pixels PE. The microlens ML is formed just on or over the photodiode PD1.

The solid state image sensor according to the present embodiment has a structure of joining: each lower surface of the insulating film IF1 and the plug PG1 formed on the rear surface side of the semiconductor substrate SB1; and each upper surface of the interlayer insulating film IL2 and the plug PG2 formed on the second main surface side of the semiconductor substrate SB2. That is, the lower surface of the insulating film IF1 is joined to the upper surface of the interlayer insulating film IL2, and the lower surface of the plug PG1 is joined to the upper surface of the plug PG2.

In other words, a surface (lower surface) opposite to a surface on the first rear surface side out of surfaces of the insulating film IF1, and a surface (upper surface) opposite to a surface on the second rear surface side out of surfaces of the interlayer insulating film IL2 are joined to each other. Additionally, a surface (lower surface) opposite to a surface on the first rear surface side out of surfaces of the plug PG1, and a surface (upper surface) opposite to a surface on the second rear surface side out of surfaces of the plug PG2 are joined to each other. That is, the insulating film IF1 and the interlayer insulating film IL2 are joined in a direction perpendicular to each main surface of the semiconductor substrates SB1 and SB2, and the plugs PG1 and PG2 are joined to each other in a direction perpendicular to each main surface of the semiconductor substrates SB1 and SB2.

Therefore, the semiconductor element formed near the first main surface of the semiconductor substrate SB1, and the semiconductor element formed near the second main surface of the semiconductor substrate SB2 are electrically connected through the plugs PG1 and PG2. That is, each of the plugs PG1 and PG2 is used as a bonding pad. The plugs PG1 and PG2 are formed at a position overlapping with each other in a plan view.

For example, the floating diffusion capacitor FD serving as a drain region configuring the transfer transistor TX is electrically connected to the source region of the reset transistor RST and the gate electrode GA through: the contact plug CP and wiring M1 formed over the semiconductor substrate SB1; the plugs PG1 and PG2; and the wirings M1 to M3, via-holes, and contact plug CP formed in the interlayer insulating film IL2. Incidentally, the contact plug CP connected to the gate electrode GA is formed in a region not shown in the drawing.

Thus, since the plug PG1 on the first rear surface side of the semiconductor substrate SB1, and the plug PG2 on the second main surface side of the semiconductor substrate SB2 are connected to each other, and electrical connection between the laminated semiconductor substrates SB1 and SB2 can be made. As shown in FIG. 1, electrical connection between the semiconductor substrates SB1 and SB2 can be also made in each of the pixels PE.

In taking the image(s), light irradiated to the image element transmits the microlens ML and each of the wiring layers in order, and reaches the photodiode PD1. When the incident light is irradiated to the PN junction of the photodiode PD1, photoelectric conversion is generated in the photodiode PD1 and the semiconductor substrate SB1 lying under the photodiode PD1. As a result, electrons are generated, and are accumulated, as electric charges, in the n type semiconductor region NR of the photodiode PD1. Thus, the photodiode PD1 is a light receiving element generating therein signal electric charges depending on an amount of incident light, i.e., photoelectric conversion element.

Incidentally, the PN junction between the n type semiconductor region NR and the semiconductor substrate SB1 also configures the photodiode PD1. A case in which $p^+$ type semiconductor regions PR with high concentration are formed on the first main surface of the semiconductor substrate SB1 and on the second main surface of the semiconductor substrate SB2 has been explained herein. However, the photodiode PD1 may not have the $p^+$ type semiconductor region PR. That is, the photodiode PD1 may be configured only by the n type semiconductor region NR and the semiconductor substrate SB1.

<Manufacturing Method of Solid State Image Sensor>

Hereinafter, a manufacturing method of a solid state image sensor according to the present embodiment will be explained with reference to FIGS. 3 to 10. Each of FIGS. 3 to 10 is a sectional views during a manufacturing step of a solid state image sensor according to the present embodiment. In each of FIGS. 3 to 10, the pixel region PER and the peripheral circuit region CR are shown in order from left. FIG. 1 illustrates a range in which two pixels PE are arranged alongside in one pixel region PER, but each pixel region in FIGS. 3 to 8 is illustrated only as one pixel forming region. Additionally, FIG. 10 illustrates a pad region PDR on a right side of the peripheral circuit region CR.

Upper and lower directions of a first semiconductor wafer in a step to be explained with reference to, for example, FIG. 5 among manufacturing steps of a solid state image sensor according to the present embodiment are inversed. That is, a rear surface of the inverted semiconductor wafer is directed upward, and a main surface thereof is directed downward. Herein, when the main surface of the semiconductor wafer is directed upward, a direction on a main surface side of the semiconductor wafer is called an upper direction, and a direction on a rear surface side of the semiconductor wafer is called a lower direction. Inversely, when the rear surface of the semiconductor wafer is directed upward, a direction on a rear surface side of the semiconductor wafer is called an upper direction, and a direction on the main surface side of the semiconductor wafer is called a lower direction.

Figure 3:
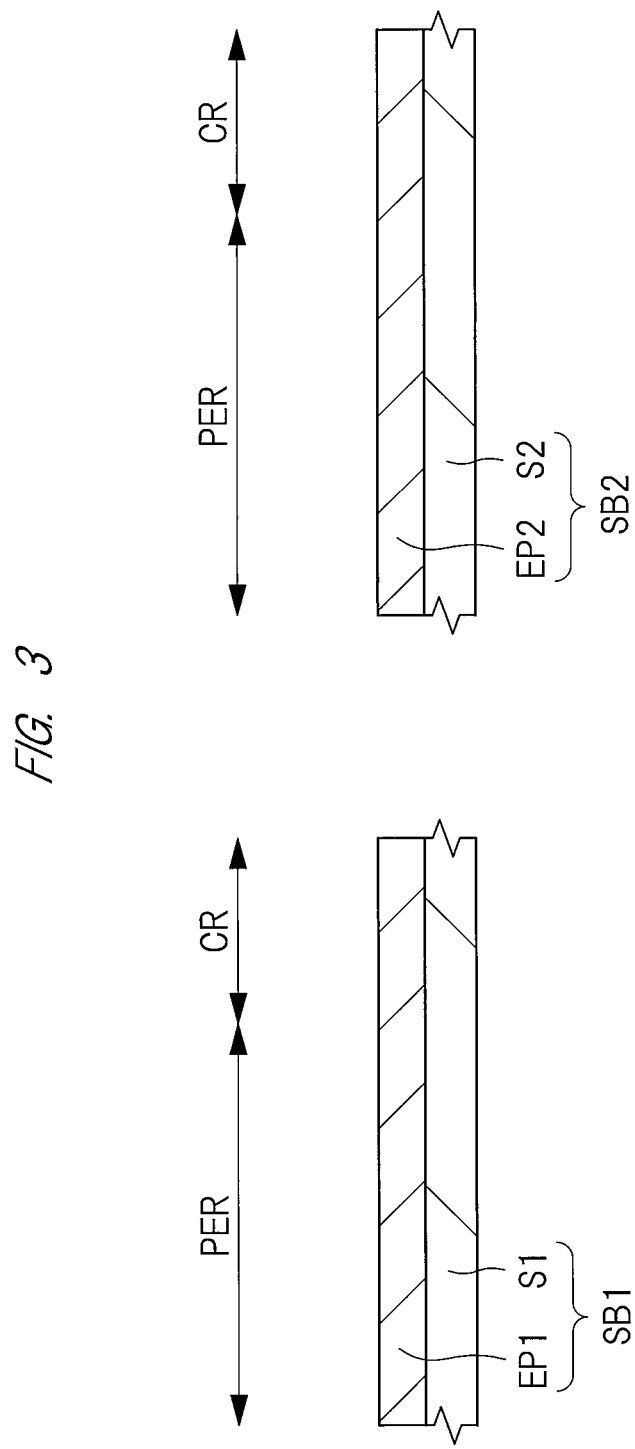
FIG. 3 is a sectional view during a manufacturing step of the solid state image sensor that is embodiment 1 according to the present invention.

In the manufacturing steps of the solid state image sensor, firstly, p type semiconductor substrates (semiconductor wafers) SB1 and SB2 each made of, for example, monocrystalline silicon (Si) are prepared respectively as shown in FIG. 3. The semiconductor substrate SB1 has: a first main surface on which semiconductor elements such as a photodiode and a transistor are formed in a step subsequent thereto; and a first rear surface opposite to the first main surface. The semiconductor substrate SB2 has: a second main surface on which a semiconductor element such as a transistor is formed in a step subsequent thereto; and a second rear surface opposite to the second main surface.

The semiconductor substrate SB1 includes a substrate S1 made of monocrystalline silicon, and an epitaxial layer EP1 formed on the substrate S1 by an epitaxial growth method, and has a laminated structure. The semiconductor substrate SB2 includes a substrate S2 made of monocrystalline silicon, and an epitaxial layer EP2 formed on the substrate S2 by an epitaxial growth method, and has a laminated structure.

Herein, a semiconductor substrate before cut by dicing is called a semiconductor wafer. Additionally, a semiconductor substrate, and an element(s) and a wiring layer(s), etc. formed on the semiconductor substrate during the manufacturing steps are collectively called a semiconductor wafer. The semiconductor substrate SB1 is a first semiconductor wafer, and the semiconductor substrate SB2 is a second semiconductor wafer.

Incidentally, the respective semiconductor substrates SB1 and SB2 are the different semiconductor wafers. A case of performing, at the same timing, each of almost the same steps performed to the semiconductor substrates SB1 and SB2 will be explained herein. However, a processing(s) does not need to be performed at the same progress to each of the semiconductor substrates SB1 and SB2. For example, after performing steps explained about the semiconductor substrate SB1 with reference to FIGS. 3 to 8, steps explained about the semiconductor substrate SB2 with reference to FIGS. 3 to 8 may be performed. That is, until before a step (see FIG. 9) of joining the first semiconductor wafer and the second semiconductor wafer, steps of forming an element(s), forming a wiring layer(s), polishing a rear surface, forming an insulating film covering the rear surface, and the like may be preferentially performed to any of the first semiconductor wafer and the second semiconductor wafer.

Additionally, an epitaxial layer and a substrate lying therebelow are distinctively shown in FIG. 3. However, a laminated substrate composed of an epitaxial layer and a substrate lying therebelow or a substrate composed only of an epitaxial layer is shown as one semiconductor substrate in other figures.

Figure 4:
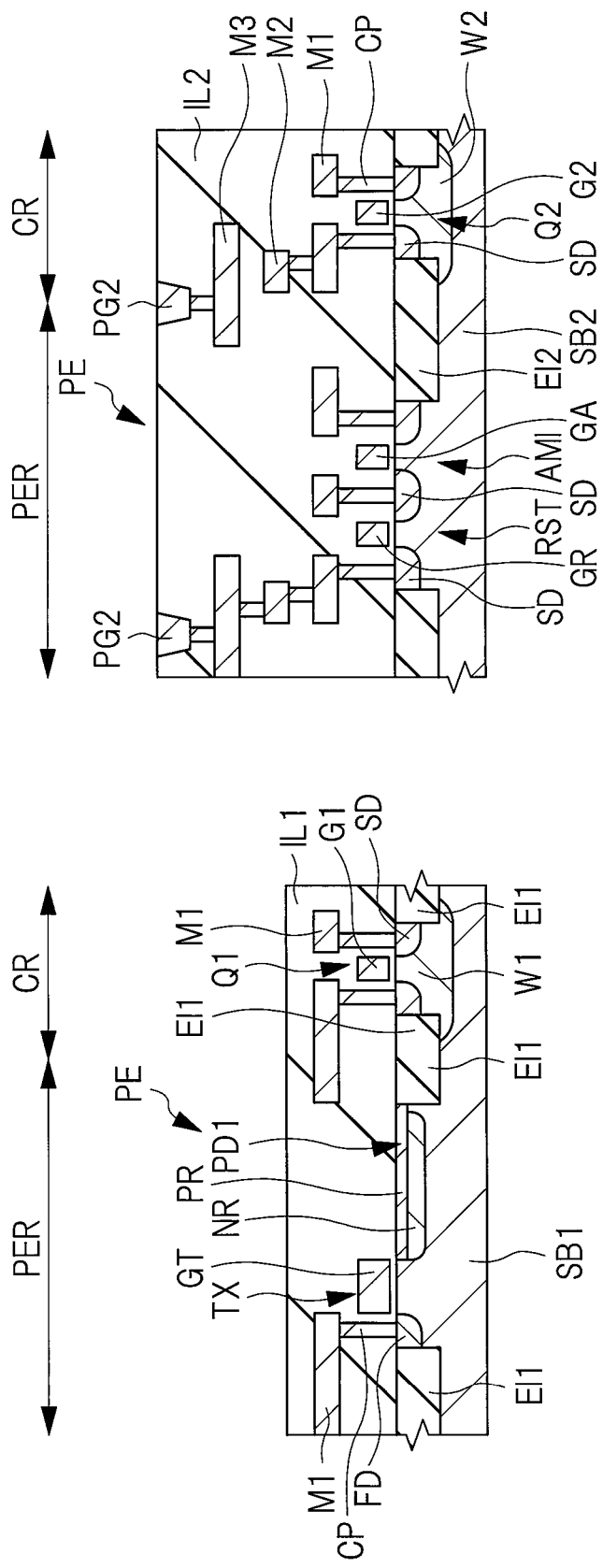
FIG. 4 is a sectional view during a manufacturing step of the solid state image sensor subsequently to FIG. 3.

Next, as shown in FIG. 4, a plurality of trenches are formed on the first main surface of the semiconductor substrate SB1. Those trenches can be formed by using, as a mask (hard mask), a pattern(s) composed of an insulating film formed on the semiconductor substrate SB1 to perform an etching processing. A plurality of trenches are similarly formed also to the second main surface of the semiconductor substrate SB2.

Subsequently, an insulating film is embedded in the trenches, which are formed in the above step, by using, for example, a chemical vapor deposition (CVD) method, and thereafter the insulating film lying on each of the first main surface of the semiconductor substrate SB1 and the second main surface of the semiconductor substrate SB2 is removed by using a chemical mechanical polishing (CMP) method. Therefore, by the insulating film remaining in the shallow trench(s), an element isolation region EI1 is formed in the trench in the first main surface of the semiconductor substrate SB1, and an element isolation region EI2 is formed in the trench(s) in the second main surface of the semiconductor substrate SB2. The element isolation regions EI1 and EI2 are each formed by using a shallow trench isolation (STI) method. The element isolation regions EI1 and EI2 are each composed of, for example, a silicon oxide film. The element isolation regions EI1 and EI2 are formed so as to reach on the way to depth of each of the epitaxial layers EP1 and EP2 (see FIG. 3), and do not penetrate the epitaxial layers (EP1 and EP2).

Subsequently, a p type well W1 is formed on the first main surface of the semiconductor substrate SB1 in the peripheral circuit region CR by using a photolithography technique and an ion-implantation method, and a p type well W2 is formed on the second main surface of the semiconductor substrate SB2 in the pixel region PER and the peripheral circuit region CR. P type impurities (e.g., B (boron)) are implanted through the ion-implantation method. Incidentally, a case in which the n-channel type transistor is formed in the peripheral circuit region CR has been explained in the present embodiment. However, a p-channel type transistor is also formed in a region not illustrated in the peripheral circuit region CR. When the n-channel type transistor is formed, conductivity types of impurity regions to be formed in the semiconductor substrates SB1 and SB2 are set so as to be different from each other at a location of forming the p-channel type transistor.

Subsequently, a photodiode PD1 is formed on the main surface of the semiconductor substrate SB1 in the pixel region PER by using a photolithography technique and an ion-implantation method. Herein, an n type semiconductor region NR is formed by implanting n type impurities (e.g., P (phosphorus) or As (arsenic)) onto the upper surface of the semiconductor substrate SB1 in the pixel region PER by, for example, an ion-implantation method, and a $p^+$ type semiconductor region PR is formed by implanting p impurities (e.g., B (boron)) onto the upper surface of the semiconductor substrate SB1 in the pixel region PER by, for example, an ion-implantation method. Depth of the $p^+$ type semiconductor region NR is shallower than depth of the n type semiconductor region NR. Depth of the n type semiconductor region PR is shallower than depth of the element isolation region EI1. The photodiode PD1 is mainly composed of the n type semiconductor region NR, and is herein configured by the p+ type semiconductor region PR, and a p type semiconductor region serving as the semiconductor substrate SB1 surrounding the n type semiconductor region NR. That is, the photodiode PD1 is configured by a PN junction of the n type semiconductor region and the p type semiconductor region.

The plurality of photodiodes PD1 are formed alongside in the pixel region PER of the semiconductor substrate SB1 in a plan view. Each of the photodiodes PD1 is formed in an active region defined by the element isolation region EI1. Herein, each of regions in which the plural photodiodes PD1 are formed on the main surface of the semiconductor substrate SB1 becomes one pixel PE. In other words, one pixel PE has one photodiode PD1.

Subsequently, a wiring layer is formed on the semiconductor substrate SB1 so as to cover each of the transfer transistor TX, the transistor Q1, the transfer transistor TX, the transistor Q1, and the photodiode PD1. Main features in the manufacturing method of the solid state image sensor according to the present embodiment are nothing in the respective manufacturing steps of the transistor and the wiring layer, and so specific explanation about the manufacturing steps will be omitted herein. The transfer transistor TX serving as an n-channel type MISFET is formed in the pixel region PER, and the transistor Q1 serving as an n type MISFET is formed in the peripheral circuit region CR. The n type semiconductor region NR configures a source region of the transfer transistor TX.

The transfer transistor TX has: a floating diffusion capacitor FD formed on the first main surface of the semiconductor substrate SB1; and a gate electrode GT over the first main surface thereof. The transistor Q1 has: source/drain regions SD formed on the first main surface of the semiconductor substrate SB1; and a gate electrode G1 over the first main surface thereof. An active region in which the transistor Q1 is formed is defined by the element isolation region EI1. The wiring layer includes an interlayer insulating film IL1, and a contact layer CP and a wiring M1 in the interlayer insulating film IL1.

Additionally, a peripheral transistor in each pixel, i.e., a reset transistor RST, an amplification transistor AMI, and a selection transistor (not shown) are formed near the second main surface of the semiconductor substrate SB2 in the pixel region PER. Further, a transistor Q2 is formed near the second main surface of the semiconductor substrate SB2 in the peripheral circuit region CR.

Thereafter, formed is a laminated wiring layer composed of a plurality of wiring layers and covering each of the reset transistor RST, the amplification transistor AMI, the selection transistor (not shown), and the transistor Q2. The reset transistor RST on the semiconductor substrate SB2 has: source/drain regions SD formed on the second main surface of the semiconductor substrate SB2; and a gate electrode GR over the second main surface thereof. The amplification transistor AMI has: source/drain regions formed on the second main surface of the semiconductor substrate SB2; and a gate electrode GA over the second main surface thereof. The selection transistor has almost the same structure as the amplification transistor AMI. The transistor Q2 has: source/drain regions SD formed on the second main surface of the semiconductor substrate SB2; and a gate electrode over the second main surface thereof. An active region in which each of the transistors is formed is defined by the element isolation region EI2. The laminated wiring layer includes: the interlayer insulating film IL2; and the contact layer, plug CP, wirings M1 to M3, and via-hole in the interlayer insulating film IL2.

The wiring M1 in the interlayer insulating film IL1 is electrically connected through the contact plug CP to elements such as the photodiode PD1, transfer transistor TX, and transistor Q2. The wiring M1 in the interlayer insulating film IL2 is electrically connected through the contact plug CP to elements such as the peripheral transistor and transistor Q2. The wirings M1 to M3 in the interlayer insulating film IL2 are electrically connected to each other through the-via holes. An upper surface of the wiring layer on the semiconductor substrate SB1 is configured by the interlayer insulating film IL1, and an upper surface of the wiring layer on the semiconductor substrate SB2 is configured by the interlayer insulating film IL2. A via-hole connected to the wiring M3 is formed just on the wiring M3 in the interlayer insulating film IL2, and an upper surface of the via-hole is covered with an insulting film that configures an upper part of the interlayer insulating film IL2.

Subsequently, a plurality of connection holes (concave parts, tranches) are formed on the upper surface of the interlayer insulating film IL2, and a plug (conductive connection part) PG2 to be embedded in each of those connection holes is formed by using, for example, a so-called damascene method. The plug PG2 is mainly made of, for example, Cu (copper). The connection holes can be formed by, for example, a photolithograph technique and an etching method. The plug PG2 can be formed, for example, as follows: a barrier conductor film containing Ta (tantalum) etc. and a seed film made of Cu (copper) are laminated on the connection hole in order; a copper film serving as a main conductor film is then formed by a plating method; an interior of each connection hole is thereby embedded; and a metal film on the upper surface of the interlayer insulating film IL2 is thereafter removed by, for example, a CMP method. A bottom surface of the plug PG2 is connected to an upper surface of the via-hole connected to the upper surface of the wiring M3. Herein, the plug PG2 is formed in each of the pixel region PER and the peripheral circuit region CR. By a polishing step of the metal film through the above CMP method, the upper surface of the plug PG2 and the upper surface of the interlayer insulating film IL2 are made flat in almost the same plane.

Figure 5:
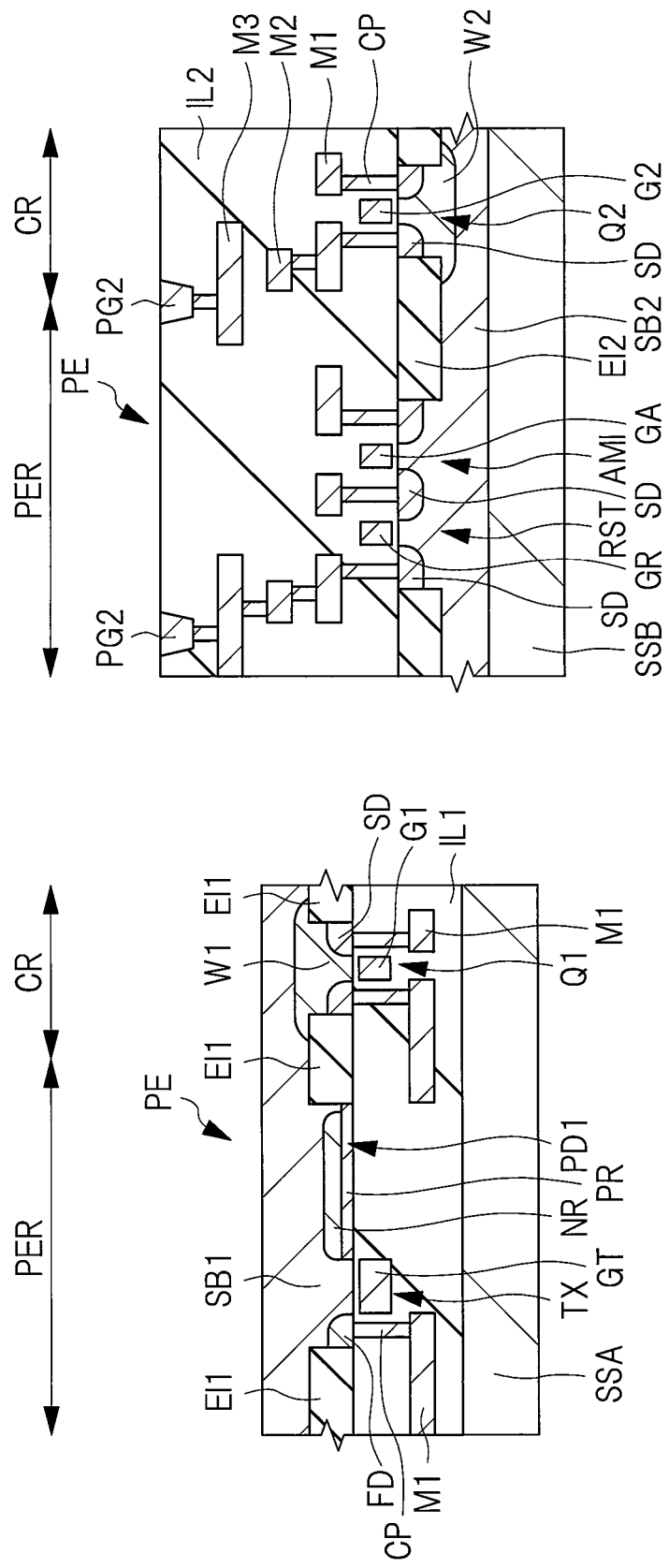
FIG. 5 is a sectional view during a manufacturing step of the solid state image sensor subsequently to FIG. 4.

Next, as shown in FIG. 5, a supporting substrate SSA is bonded on a main surface side of the first semiconductor well, i.e., the upper surface of the interlayer insulating film IL1. The supporting substrate SSA has a role in which a structure including a wiring layer and the semiconductor substrate SB1 on the supporting substrate SSA is prevented from being transformed etc. Similarly, a supporting substrate SSB is bonded to a rear surface of the second semiconductor wafer, i.e., the second rear surface of the semiconductor substrate SB2. Each of the supporting substrates SSA and SSB is composed of, for example, a Si (silicon) substrate. Subsequently, the semiconductor substrate SB1, i.e., the upper and lower surfaces of the first semiconductor wafer is inversed. That is, the first rear surface of the semiconductor substrate SB1 is directed upward. Incidentally, when the semiconductor substrate SB2 has sufficient thickness for keeping strength of the semiconductor wafer, the supporting substrate SSB may not be bonded to the semiconductor substrate SB2.

Figure 6:
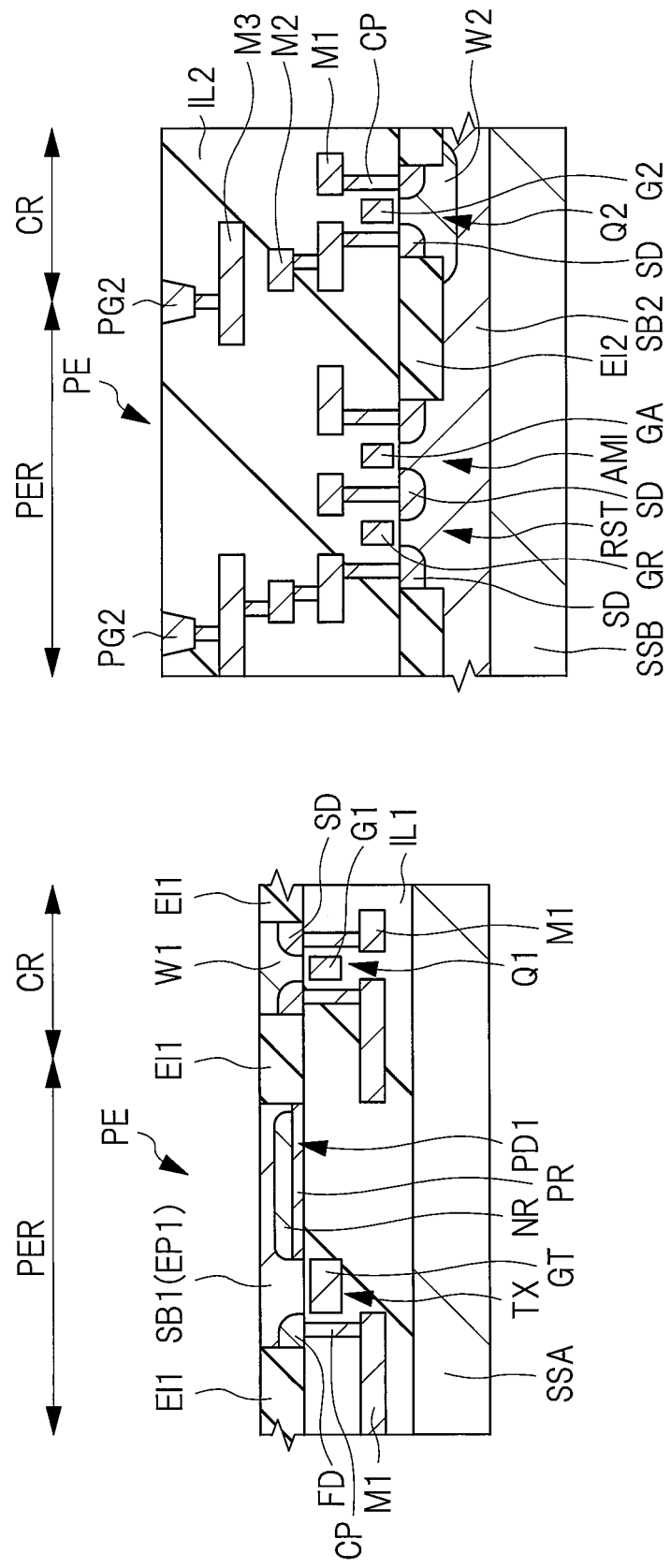
FIG. 6 is a sectional view during a manufacturing step of the solid state image sensor subsequently to FIG. 5.

Next, as shown in FIG. 6, the first rear surface of the semiconductor substrate SB1 is polished (grinded) by, for example, a CMP method. Then, by retreating the first rear surface, the element isolation region EI1 is exposed. The entire substrate S1 (see FIG. 3) is removed through the above step. The rear surface of the epitaxial layer EP1 serving as the first rear surface of the semiconductor substrate SB1 retreats up to the upper surface of the element isolation region EI1, and the rear surface of the epitaxial layer EP2 serving as the second rear surface of the semiconductor substrate SB2 retreats up to the upper surface of the element isolation region EI1. Herein, the n type semiconductor region NR is not exposed from the first rear surface. By this polishing step, each thickness of the semiconductor substrate SB1 and the element isolation region EI1 becomes, for example, about 150 to 350 nm. Incidentally, if necessary, the second rear surface of the semiconductor substrate SB2 may be polished by a CMP method etc. and be retreated.

Figure 7:
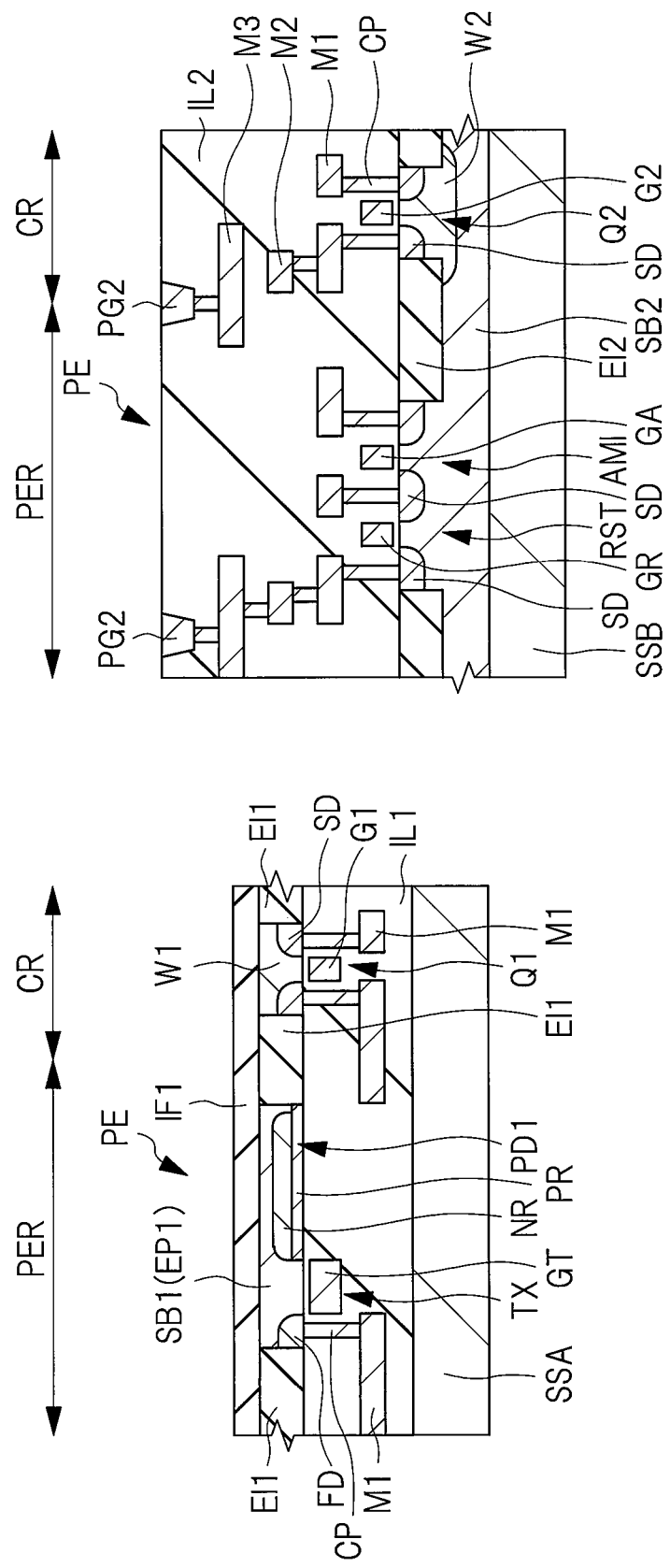
FIG. 7 is a sectional view during a manufacturing step of the solid state image sensor subsequently to FIG. 6.

Next, as shown in FIG. 7, formed (deposited) by using, for example, a plasma CVD method is an insulating film (oxide insulating film) that covers the rear surface of the first semiconductor wafer, i.e., the first rear surface of the semiconductor substrate SB1. The insulating film IF1 contacts with and covers the upper surface of the element isolation region EI1. The insulating film IF1 is composed of, for example, a silicon oxide film.

Use of, for example, a thermal oxidation method is thought as a forming method of the insulating film IF1. However, when the thermal oxidation method is used, the wiring M1 etc. having been already formed are subjected to a thermal load(s). Therefore, the insulating film IF1 is herein formed by using a plasma CVD method serving as a film deposition method in which the semiconductor substrate SB1 has a low rise in temperature.

Figure 8:
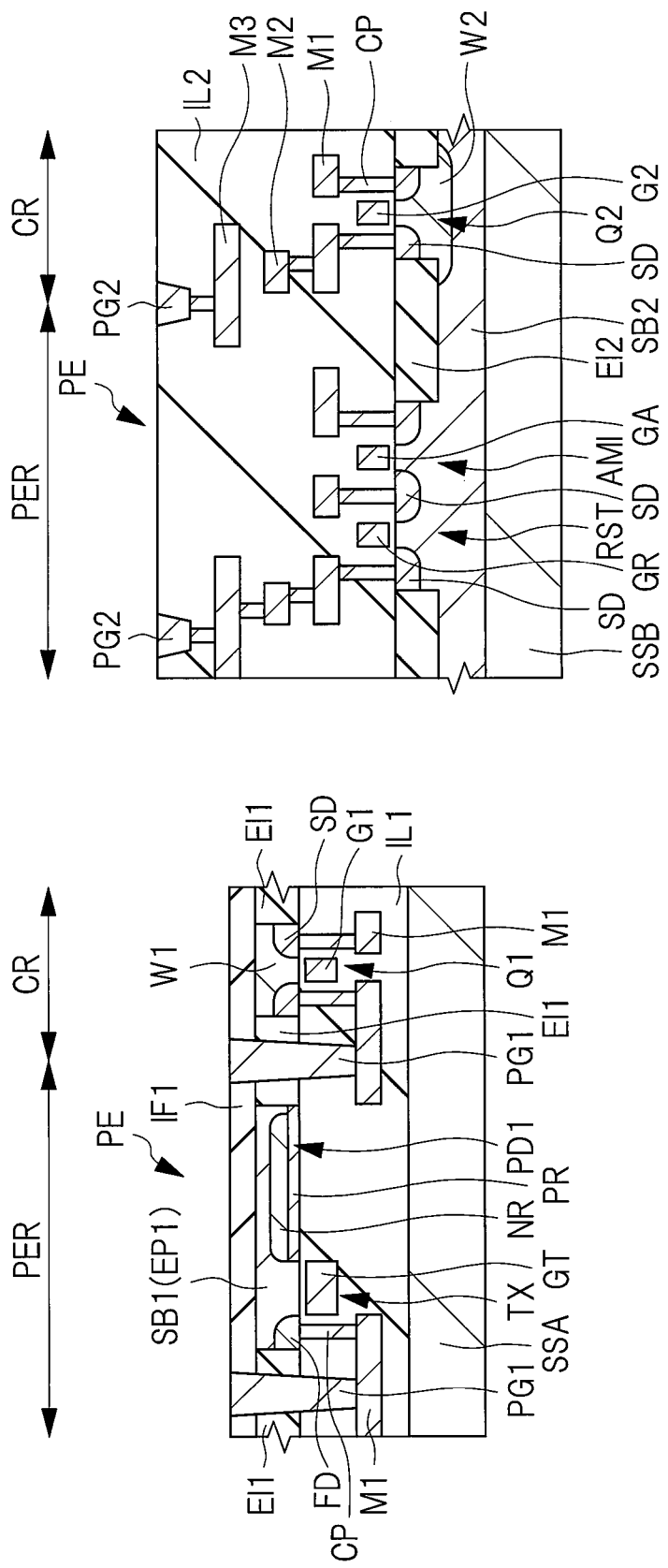
FIG. 8 is a sectional view during a manufacturing step of the solid state image sensor subsequently to FIG. 7.

Next, as shown in FIG. 8, a plurality of relatively deep connection holes (concave parts, trenches) are formed on the rear surface of the first semiconductor wafer by using a photolithography technique and an etching method. That is, formed is each connection hole that penetrates the semiconductor substrate SB1 from the upper surface of the insulating film IF1 and reaches the upper surface of the wiring M1. The connection hole penetrates: the insulating film IF1; the element isolation region EI1; and the contact layer configuring the interlayer insulating film IL1. Since the element isolation region EI1 interposes between the connection hole and the semiconductor substrate SB1, the semiconductor substrate SB1 is not exposed from an interior of each connection hole. The upper surface of the wiring M1 is exposed from a bottom surface of each connection hole.

Subsequently, a plug (conductive connection part) PG1 to be embedded in the interior of each of the plural connection holes is formed by, for example, a so-called damascene method. The plug PG1 is mainly made of, for example, Cu (copper). The plug PG1 can be formed, for example, as follows: a burrier conductor film made of Ta (tantalum) etc. and a seed film made of Cu (copper) are laminated on the connection hole in order; a copper film serving as a main conductor film is then formed by a plating method, thereby being fully embedded in the interior of the connection hole; and thereafter a metal film on or over the upper surface of the insulating film IF1 is removed by, for example, a CMP method. The bottom surface of the plug PG1 is connected to the upper surface of the wiring M1. Herein, the plug PG1 is formed in each of the pixel region PER and the peripheral circuit region CR. Through a polishing step of the metal film by the above CMP method, the upper surface of the plug PG1 and the upper surface of the insulating film IF1 are made flat in almost the same plane.

Incidentally, the plug PG1 is herein connected to the wiring M1, but when a plurality of wiring layers are laminated down or under the semiconductor substrate SB1, the plug PG1 may be connected to a wiring different from the wiring M1 in height.

Figure 9:
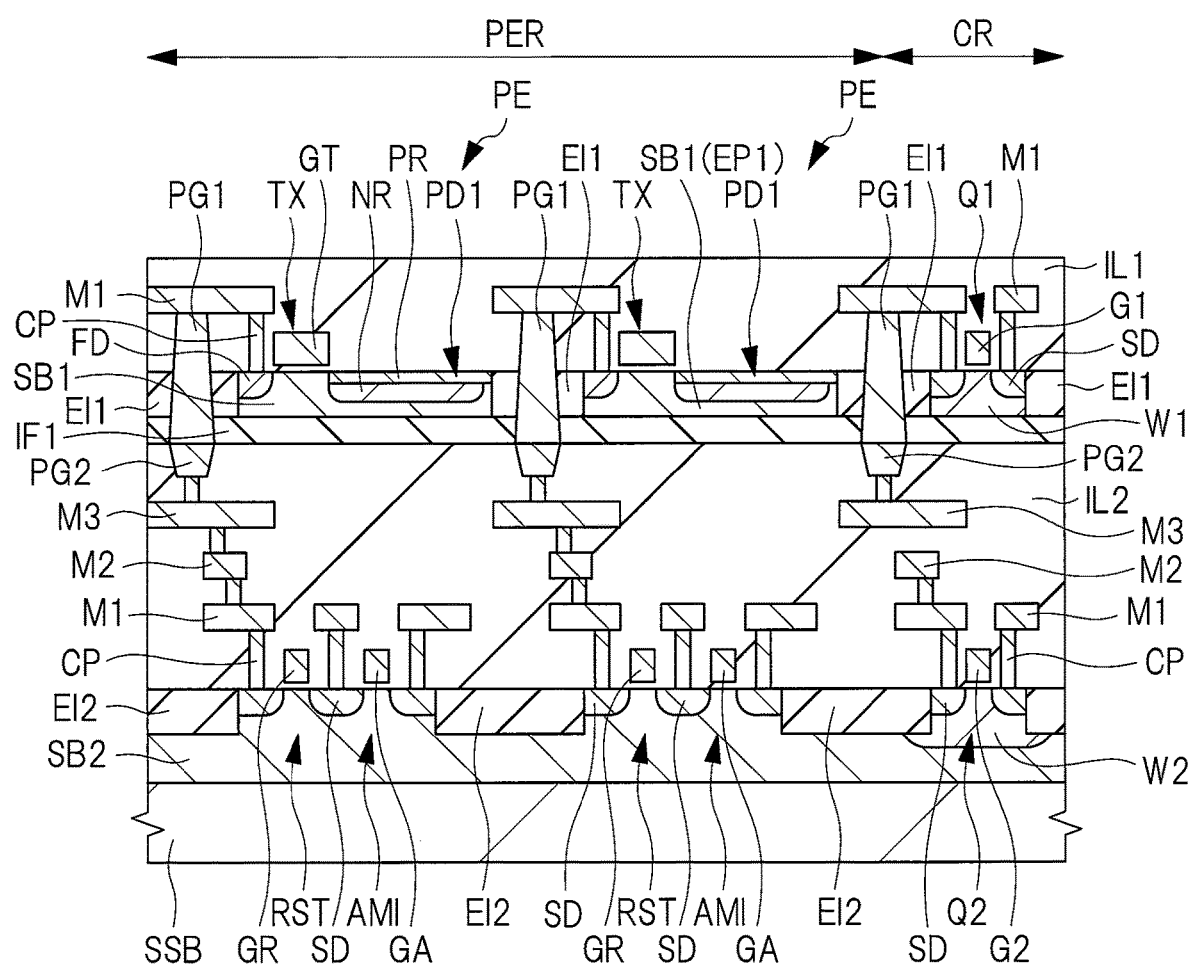
FIG. 9 is a sectional view during a manufacturing step of the solid state image sensor subsequently to FIG. 8.
Figure 10:
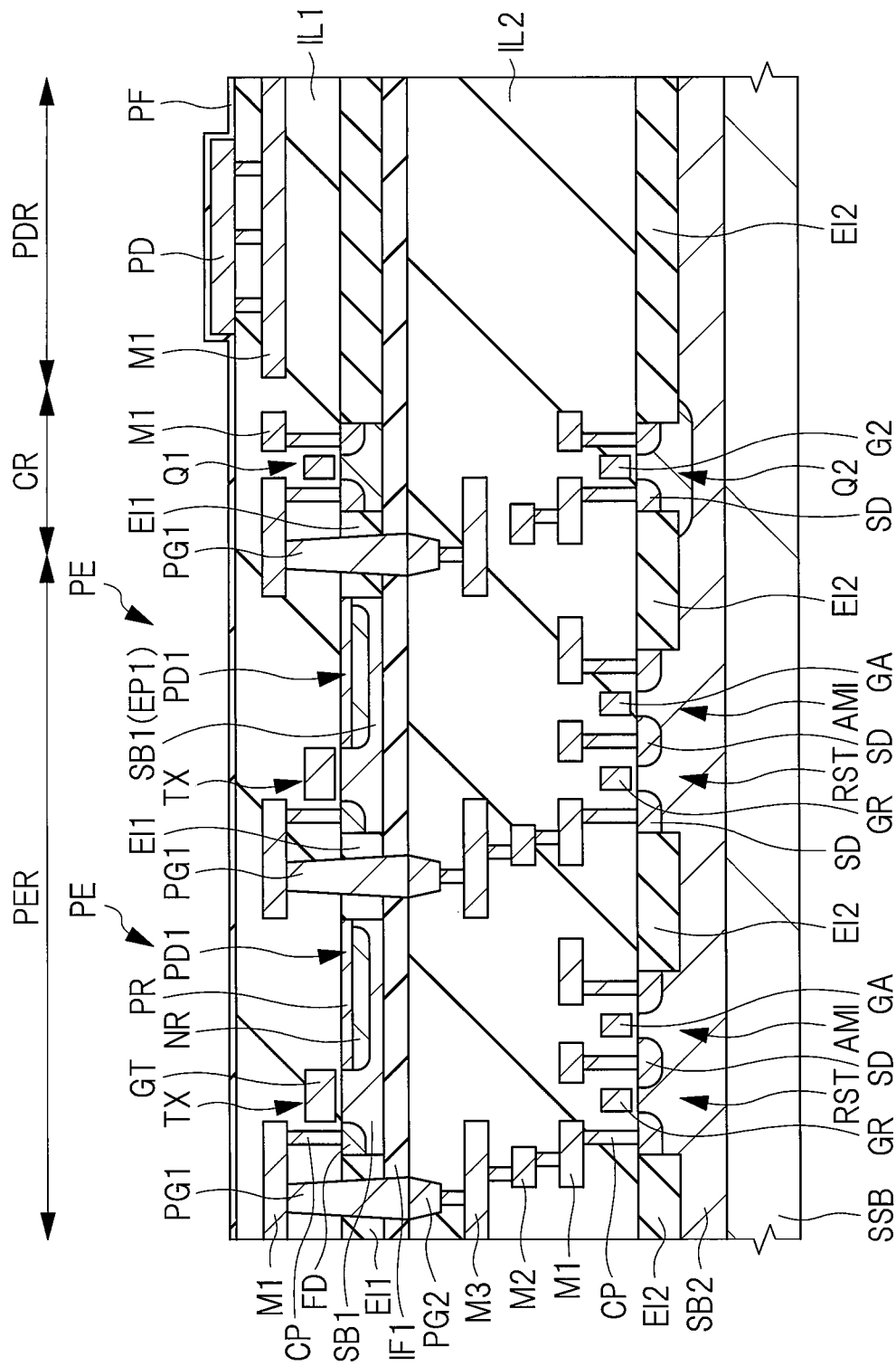
FIG. 10 is a sectional view during a manufacturing step of the solid state image sensor subsequently to FIG. 9.

Next, as shown in FIG. 9, the rear surface of the first semiconductor wafer and the main surface of the second semiconductor wafer are joined. That is, the upper surface of the insulating film IF1 shown by FIG. 8 and the upper surface of the interlayer insulating film IL2 shown by FIG. 8 are bonded and joined to each other. At this time, by inverting the first semiconductor wafer upside down again, the first main surface of the semiconductor substrate SB1 is directed upward. By doing so, a laminated wafer composed of the first semiconductor wafer and the second semiconductor wafer is formed in a state in which the first rear surface of the semiconductor substrate SB1 and the second main surface of the semiconductor substrate SB2 oppose each other.

Herein, after bonding the insulating film IF1 exposed from the rear surface of the first semiconductor wafer and the interlayer insulating film IL2 exposed from the main surface of the second semiconductor wafer, a thermal processing is performed at 400° C. to enhance joint strength. When the thermal processing is performed, an elimination reaction in which moisture is removed from each front surface of the insulating film IF1 and the interlayer insulating film IL2 is caused. Therefore, the insulating film IF1 and the interlayer insulating film IL2 share oxygen atoms at a boundary between the insulating film IF1 and the interlayer insulating film IL2 each made of, for example, SiO (oxide silicon). Thus, since the insulating film IF1 and the interlayer insulating film IL2 are bound covalently at a boundary surface between them, the first semiconductor wafer and the second semiconductor wafer are joined rigidly.

Additionally, in this joining step, the insulating film IF1 and the interlayer insulating film IL2 each composed of a silicon oxide film are joined to each other, and simultaneously the plugs PG1 and PG2 each mainly made of Cu (copper) are joined to each other. That is, the upper surface of the plug PG1 shown by FIG. 8 and the upper surface of the plug PG2 shown by FIG. 8 are joined to each other. Thus, in the step of mutually joining the semiconductor wafers according the present embodiment, a hybrid joint in which the silicon oxide film and the Cu plug are joined to each other is made.

Subsequently, the supporting substrate SSA is removed by peeling it off the upper surface of the interlayer insulating film IL1.

Next, as shown in FIG. 10, a pad PD is formed on the interlayer insulating film IL1 in the pad region PDR, and a passivation film PF covering the pad PD and the upper surface of the interlayer insulating film IL1 is formed subsequently thereto. The wiring M1 is formed in the interlayer insulating film IL1 in the pad region PDR during the step explained with reference to FIG. 4. The pad region PDR is a region for forming a bonding pad(s) etc. on the interlayer insulating film IL1. In the drawing, the peripheral circuit region CR and the pad region PDR are illustrated separately, but the pad region PDR may be considered as a part of an interior of the peripheral circuit region CR.

Herein, a via-hole penetrating the interlayer insulating film IL1 on the wiring M1 is formed in the pad region PDR, and a pad PD connected to an upper surface of the via-hole is then formed in the pad region PDR. The pad PD is a pattern that is composed of a conductor film formed on the interlayer insulating film IL1. The pad PD is formed by processing a metal film (e.g., Al (aluminum) film) through a photolithography technique and an etching method, the metal film being formed on the interlayer insulating film IL1 by, for example, a sputtering method.

A part of a bottom surface of the pad PD is electrically connected through the via-hole to the wiring M1 and the element that are formed on the first semiconductor wafer. Additionally, the part of the bottom surface of the pad PD is electrically connected through the via-hole, the wiring M1, and the plugs PG1 and PG2 to the wiring M1 and the element that are formed on the second semiconductor wafer.

The passivation film PF can be formed on the interlayer insulating film IL1 and the pad PD by laminating a silicon oxide film and a silicon nitride film in this order through, for example, a CVD method. The passivation film PF functions also as an antireflection film. That is, the passivation film PF has a role in which light incident on the photodiode PD1 from the first main surface side of the semiconductor substrate SB1 is prevented from reflecting on the interlayer insulating film IL1. A part of the passivation film PF is subsequently removed by using, for example, a photolithography technique and an etching method, so that a part of an upper surface of the pad PD is exposed. Incidentally, a location(s) at which the passivation film PF is opened during this step is not illustrated in the drawing. The exposed pad PD is used as, for example, a bonding pad that is an object for adhering to a bonding wire(s).

Thereafter, although being omitted in the drawing, a microlens may be formed just on the passivation film PF in each pixel PE. The microlens is formed, for example, as follows: an insulating film formed on the passivation film PF is processed so as to have a circular pattern(s) in a plan view; and thereafter a front surface composed of an upper surface and a side surface(s) of the passivation film is rounded by, for example, heating the insulating film; and the heated insulating film is thereby processed into a lens shape.

Then, a laminated wafer composed of the first semiconductor wafer and the second semiconductor wafer is cut by a dicing method and is individuated. Thus, a solid state image sensor that is each of the plural semiconductor chips is obtained. By the steps mentioned above, the solid state image sensor according to the present embodiment, which includes the semiconductor substrates SB1 and SB2, is substantially completed.

Incidentally, although being illustrated in the drawing, a Si (silicon) through-electrode (penetration via, upper/lower chip conductive connection part, TSV: Through-Silicon Via) penetrating the interlayer insulating film IL1, the semiconductor substrate SB1, and the insulating film IF1 to reach on the way to the depth of the interlayer insulating film IL2 may be formed in the pad region PDR prior to the step of forming the pad PD during the step explained with reference to FIG. 10.

When the Si through-electrode is formed, a through-hole (connection hole) penetrating the interlayer insulating film IL1, the semiconductor substrate SB1, and the insulating film IF1 to reach on the way to the depth of the interlayer insulating film IL2 is formed by using a lithography technique and a dry etching method. By doing so, the upper surface of the wiring M3 inside the interlayer insulating film IL2 is exposed from a bottom part of the through-hole. Then, an insulating film composed of, for example, a silicon oxide film is deposited on the interlayer insulating film IL1 by a CVD method etc. Thereafter, the insulating film on the interlayer insulating film IL1, and the insulating film covering the bottom surface of the through-hole are removed by performing dry etching. Therefore, the insulating film is caused to remain only on a side surface of the through-hole, and the upper surface of the wiring M3 in the interlayer insulating film IL2 is exposed in a bottom part of the through-hole.

Subsequently, a burrier conductor film containing, for example, Ta (tantalum) and a thin seed film made of, for example, Cu (copper) are formed so as to cover a side surface and a bottom surface of the through-hole, and then a main conductor film made of, for example, Cu (copper) is formed on the seed film by a plating method, thereby being fully embedded in the through-hole. Thereafter, the burrier conductive film, the seed film, and the main conductor film superfluous on the interlayer insulating film are removed by, for example, a CMP method, and are exposed from the upper surface of the interlayer insulating film IL1. By doing so, the Si through-electrode composed of the burrier conductive film, the seed film, and the main conductor film that are embedded in the through-hole is formed.

<Effects of Present Embodiment>

Figure 32:
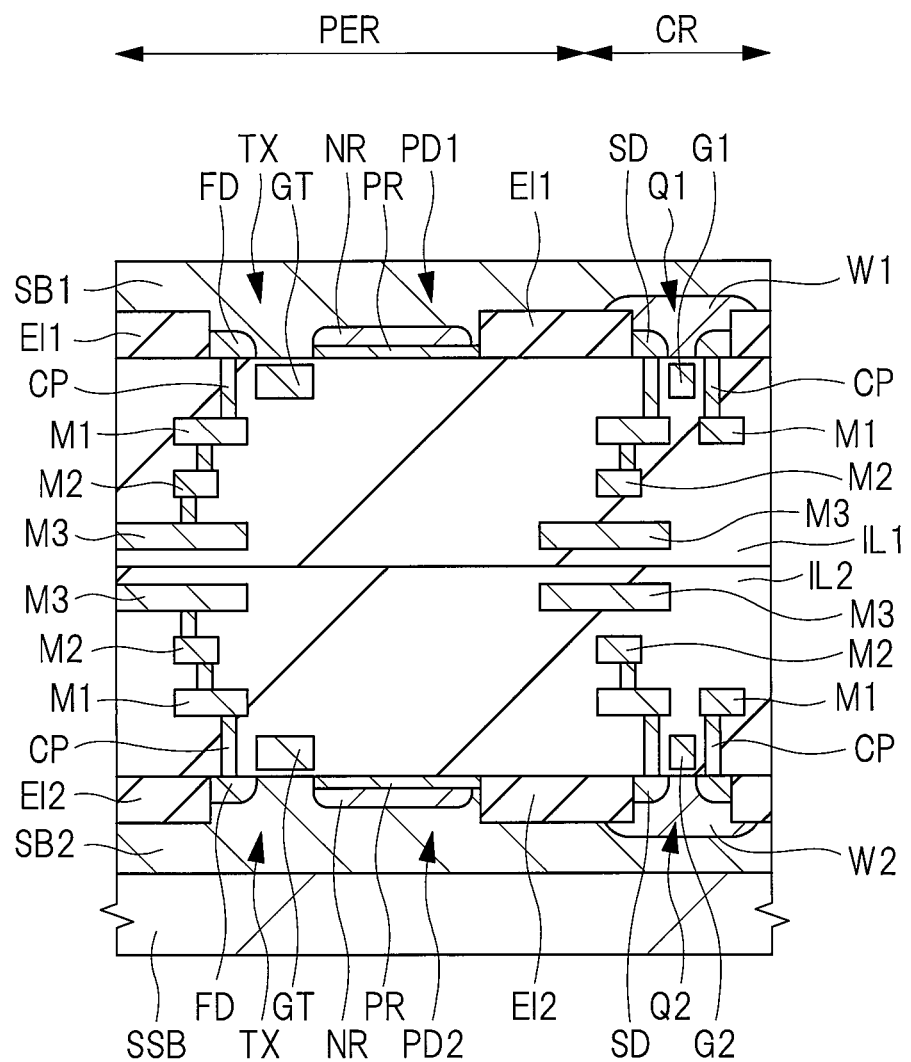
FIG. 32 is a sectional view illustrating a solid state image sensor that is a comparative example.

Hereinafter, an effect(s) of the manufacturing method of the solid state image sensor according to the present embodiment will be explained by using a comparative example shown by FIG. 32. FIG. 32 is a sectional view of a solid state image sensor that is a comparative example.

A solid state image sensor that is a comparative example shown by FIG. 32 has a structure of laminating the semiconductor substrates SB1 and SB2, and includes a photodiode PD1 in the semiconductor substrate SB1 and a photodiode PD2 in the semiconductor substrate SB2 in one pixel. Herein, since the first main surface of the semiconductor substrate SB1 is directed downward, the semiconductor substrates SB1 and SB2 are laminated in a state in which the first main surface of the semiconductor substrate SB1 and the second main surface of the semiconductor substrate SB2 oppose each other.

As shown in FIG. 32, the photodiode PD1 is formed on the first main surface (lower surface) of the semiconductor substrate SB1 in the pixel region PER, and the photodiode PD2 is formed on the second main surface (upper surface) of the semiconductor substrate SB2 in the pixel region PER. A transistor Q1 is formed near the first main surface in the peripheral circuit region CR, and a transistor Q2 is formed near the second main surface in the peripheral circuit region CR. Formed on or under the first main surface of the semiconductor substrate SB1 is a laminated wiring layer including an interlayer insulating film IL1 that covers the photodiode PD1 and the transistor Q1. Formed on or over the second main surface of the semiconductor substrate SB2 is a laminated wiring layer including an interlayer insulating film IL2 that covers the photodiode PD2 and the transistor Q2. A supporting substrate SSB is bonded to a lower surface of the semiconductor substrate SB2, and the semiconductor substrate SB1 is made thin.

Formed inside each of the interlayer insulating films IL1 and IL2 are wirings M1 to M3, via-holes, and contact plugs CP. By joining a lower surface of the interlayer insulating film IL1 and an upper surface of the interlayer insulating film IL2, the semiconductor substrates SB1 and SB2 are laminated. Herein, in the same plane as a boundary surface between the interlayer insulating films IL1 and IL2, there is no boundary surface, on which two connection parts (plugs) are connected to each other. That is, to join a first laminated body including the semiconductor substrate SB1 and the interlayer insulating film IL1 and a second laminated body including the semiconductor substrate SB2 and the interlayer insulating film IL2 is realized by joining the interlayer insulating films IL1 and IL2, i.e., only by joining silicon oxide films to each other.

In a pad region (peripheral circuit region) not illustrated in the drawing, the Si through-electrode penetrates the semiconductor substrate SB1 and the interlayer insulating film IL1, and is connected to the wiring M1 in the interlayer insulating film IL2. The Si through-electrode is electrically connected to the wirings M1 and M2 in the interlayer insulating film IL1 through the via-hole connected to a bottom surface of the pad. That is, a semiconductor element(s) formed near the first main surface of the semiconductor substrate SB1, and a semiconductor element(s) formed near the second main surface of the semiconductor substrate SB2 are electrically connected to each other through the wirings M1 and M2, the via-hole, and the contact plug CP inside each of the interlayer insulating films IL1 and IL2 and through the Si through-electrode and the pad.

In the solid state image sensor that is the comparative example, there is a method of increasing an occupied area of the photodiode PD1 in one pixel in a plan view, for example, in order to improve sensitivity performance of the photodiode PD1. For this reason, it is considered that all of peripheral transistors to be formed in each pixel PE are formed near the second main surface of the semiconductor substrate SB2. At this case, the photodiode PD1 and the peripheral transistor are electrically connected to each other through the Si through-electrode formed in the pad region.

In other words, unless the Si through-electrode is interposed, the photodiode PD1 and the peripheral transistor in one pixel cannot be electrically connected to each other.

This is because: the first laminated body including the semiconductor substrate SB1 and the second laminated body including the semiconductor substrate SB2 are joined only by joining the silicon oxide films to each other; and the element etc. on the semiconductor substrate SB1 side and the element etc. on the semiconductor substrate SB2 side are electrically connected to each other by the Si through-electrode. Depth of the Si through-electrode is large, and its width is further larger than those of the connection parts such as the contact plug and the via-hole in order to need to form the Si through-electrode with its fixed aspect ratio kept. Therefore, the Si through-electrode is unsuitable for a connection part for electrically connecting the element on the semiconductor substrate SB1 side and the element on the semiconductor substrate SB2 side in each of the pixels PE that are arranged in an array in the pixel region PER.

Therefore, there arises a problem of increasing an area of the solid state image sensor when the photodiode PD1 formed on the semiconductor substrate SB1 and the peripheral transistor formed on the semiconductor substrate SB2 are intended to be connected by the Si through-electrode in, for example, one pixel PE like the above. This is because the Si through-electrode connecting the photodiode PD1 and the peripheral transistor in each pixel PE needs to be formed more in number depending on the number of pixels PE.

A current path(s) between the transfer transistor and the peripheral transistor connected to the photodiode PD1 is used as a floating diffusion capacitor temporarily storing electric charges obtained by taking an image(s). However, the current path in the above comparative example includes the Si through-electrode, and so becomes very long, which brings occurrence of an increase in power consumption of the solid state image sensor, an increase in noises, and the like. Additionally, since length of the current path in each pixel PE is difficult to keep constant, variations in capacities of the floating diffusion capacitor are caused, which brings a problem of deteriorating performance of the solid state image sensor.

It is also considered to form the Si through-electrode at each pixel PE in order to prevent the variations in the capacities of the floating diffusion capacitor by the pixel PE. In this case, however, the occupied areas of the photodiodes PD1 and PD2 to the pixel PE in each pixel PE remarkably decrease, which brings the deterioration in the sensitivity performance of the solid state image sensor. That is, in the solid state image sensor as the comparative example, there is a problem of being unable to make electrical connection between the laminated semiconductor substrates SB1 and SB2 by the fine conductive connection part.

Additionally, in the comparative example, the semiconductor substrates SB1 and SB2 are laminated by a technique of connecting the main surface sides of the semiconductor substrates SB1 and SB2 to each other. That is, since the silicon oxide films are easily joined to each other, the interlayer insulating films IL1 and IL2 are joined to each other in the comparative example. However, three semiconductor substrates or more cannot be laminated by using only the technique of connecting the main surface sides of the semiconductor substrates to each other. In the comparative example, since each rear surface of the semiconductor substrates SB1 and SB2 is not covered with the silicon oxide film, the rear surface of one of the semiconductor substrates SB1 and SB2 is difficult to join to the interlayer insulating film etc. formed on the main surface side of the other semiconductor substrate.

In a case of using a SOI (Silicon On Insulator) substrate composed of a silicon substrate and a silicon layer(s) formed over the silicon substrate through a BOX (Buried Oxide, layer embedded oxide) film, a semiconductor element(s) and a wiring layer(s) are formed on or over the silicon layer, and then the silicon substrate is removed. By doing so, a bottom surface of the BOX film is exposed on a rear surface side of the silicon layer. Therefore, it is considered that a bottom surface of the BOX film and upper surfaces of the interlayer insulating film etc. on the other semiconductor substrate are joined. In this case, the rear surface side of the semiconductor substrate and the main surface side of the other semiconductor substrate can be joined, but there arises a problem in which manufacture costs of the solid state image sensor increase by using the SOI substrate.

In contrast, as shown in FIG. 1, the solid state image sensor according to the present embodiment joins the insulating film IF1 on the rear surface side of the semiconductor substrate SB1 and the interlayer insulating film IL2 on the second main surface side of the semiconductor substrate SB2. Here, an element(s) formed on the semiconductor substrate SB1 and an element(s) formed on the semiconductor substrate SB2 are electrically connected to each other by not the Si through-electrode but the current path(s), the current path being formed by mutually joining the plug PG1 embedded in the connection hole in the lower surface of the insulating film IF1 and the plug PG2 embedded in the connection hole in the upper surface of the interlayer insulating film IL2. For this reason, the element etc. on the semiconductor substrate SB1 side and the element etc. on the semiconductor substrate SB2 side in the pixel PE can be electrically connected without using the Si through-electrode. Similarly, by forming the plugs PG1 and PG2 also in the peripheral circuit region CR, the element etc. on the semiconductor substrate SB1 side and the element etc. on the semiconductor substrate SB2 side can be electrically connected by the connection part finer than the Si through-electrode.

The plug PG1 is different from the Si through-electrode, and does not reach the wiring and the via-hole in the interlayer insulating film IL2. In other words, the plug PG1 is separated on the semiconductor substrate SB1 side from the closest wiring M3 and via-hole to the semiconductor substrate SB1 side among the wirings and via-holes in the interlayer insulating film IL2. The plug PG2 is different from the Si through-electrode, and does not reach the contact plug CP, wiring, and via-hole in the interlayer insulating film IL1. In other words, the plug PG2 is separated on the semiconductor substrate SB2 side from the closest contact plug CP, wiring M1, and via-hole to the semiconductor substrate SB2 side among the contact plugs CP, wirings, and via-holes in the interlayer insulating film IL1. That is, the plug PG1 is positioned above the interlayer insulating film IL2 (on the semiconductor substrate SB1 side), and the plug PG2 is positioned below the insulating film IF1 (on the semiconductor substrate SB2 side).

In the present embodiment, an electrical connection(s) between the above-mentioned substrates is realized by using a hybrid joint technique of joining the insulating films each containing oxide silico to each other and concurrently joining the plugs (bonding pads) to each other. Herein, since use of the SOI substrate is necessary, the manufacture costs of the solid state image sensor can be prevented from increasing.

Additionally, when the first laminated body including one substrate and the second laminated body including another substrate are joined, it is considered that the silicon oxide film and the plug (bonding pad) coexist on each surface of the laminated bodies in a joint surface. Here, in a case of joining only the silicon oxide films on the surface of each laminated body to each other and a case of joining only the plugs on the surface of each laminated body to each other, there is a fear of deteriorating joint strength between the laminated bodies. In contrast, in the solid state image sensor according to the present embodiment, the insulating film IF1 and the interlayer insulating film IL2 each composed of a silicon oxide film are joined to each other, and concurrently the plugs PG1 and PG2 each mainly made of Cu (copper) are joined to each other. That is, in the joint surface between the first laminated body including the semiconductor substrate SB1, plug PG1, interlayer insulating film IL1, and insulating film IF1, and the second laminated body including the semiconductor substrate SB2, plug PG2, and interlayer insulating film IL2, the insulating film IF1 and the interlayer insulating film IL2 are connected to each other and concurrently the plugs PG1 and PG2 are connected to each other. This makes it possible to enhance the joint strength between the laminated bodies.

The plug PG1 is a connection part penetrating only the insulating film IF1, semiconductor substrate SB1, and contact layer, and the plug PG2 is a connection part penetrating only the uppermost insulating film of the interlayer insulating film IL2. Therefore, each of the plugs PG1 and PG2 is shallower in depth than the Si through-electrode. For this reason, each of the plugs PG1 and PG2 can be formed with a width smaller than that of the Si through-electrode. Thus, by the connection part finer than the Si through-electrode, the element etc. on the semiconductor substrate SB1 side and the element etc. on the semiconductor substrate SB2 side can be electrically connected. This makes it possible to shorten the current path for electrically connecting the element etc. on the semiconductor substrate SB1 side and the element etc. on the semiconductor substrate SB2 side in the pixel PE. By doing so, power consumption and noises of the solid state image sensor can be reduced. Further, since the current path between the substrates can be shortened, a degree of freedom of layout of the solid state image sensor can be improved.

Additionally, when the solid state image sensor operates, the electric charges generated by the photoelectric conversion are stored in a capacitor (floating diffusion capacitor) that is the current path for connecting the drain region of the transfer transistor TX and the source region and gate electrode GA of the reset transistor RST to each other. In the present embodiment, the drain of the transfer transistor TX formed near the first main surface of the semiconductor substrate SB1, and the source region and gate electrode GA of the reset transistor RST formed near the second main surface of the semiconductor substrate SB2 are connected through the plugs PG1 and PG2 in each pixel PE. By doing so, since the current paths serving as the floating diffusion capacitors are unified in length in each pixel PE, variations in the capacities of the floating diffusion capacitor can be prevented. Therefore, the performance of the solid state image sensor can be improved.

Further, since the current paths serving as the floating diffusion capacitor are unified in length in each pixel PE, variations in the volume of noises can be prevented. That is, the noises generated by the predetermined pixel PE can be prevented from becoming louder in volume than noises generated by other pixels PE.

Moreover, herein, the photodiode PD1 and the transfer transistor TX are formed on or over the semiconductor substrate SB1 in each pixel PE, and all of the peripheral transistors connected to the transfer transistor TX are formed on the semiconductor substrate SB2. For this reason, the occupied area of the photodiode PD1 in each pixel PE in a plan view can be increased in comparison with a case of forming the photodiode and the peripheral transistor on one semiconductor substrate in each pixel PE. Therefore, the sensitivity performance of the solid state image sensor can be improved.

Additionally, since the peripheral transistor is formed on the semiconductor substrate SB2 side, the number of wirings formed in the interlayer insulating film IL1 on the semiconductor substrate SB1 can be decreased. Therefore, since the number of wiring layers to be laminated in the interlayer insulating film IL1 can be reduced, the interlayer insulating film IL1 can be thinned. As a result, light irradiated to the photodiode PD1 can be prevented from attenuating due to thickness of the interlayer insulating film IL1. Further, shielding (shading) of light due to the upper wiring(s) is caused, which makes it possible to prevent a light receiving amount of the photodiode PD1 from decreasing. For this reason, the sensitivity performance of the solid state image sensor can be improved.

Additionally, since the plug PG1 penetrating the element isolation region EI1 is formed herein, the plug PG1 and the semiconductor substrate SB1 are insulated from each other. Therefore, it is possible to prevent the plug PG1 and the semiconductor substrate SB1 from being short-circuited and to prevent the noises from being generated in the signal(s) that is obtained from the photodiode PD1 due to an influence of the current(s) etc. flowing in the plug PG1.

Further, since the electrical connection(s) between the laminated semiconductor substrates SB1 and SB2 can be made by the fine plugs PG1 and PG2, the solid state image sensor can be made fine. Moreover, if the technique of joining the first main rear surface side of the semiconductor substrate SB1 and the second main surface side of the semiconductor substrate SB2 to each other is used similarly to the present embodiment, three semiconductor substrates or more can be laminated. Incidentally, lamination of the three semiconductor substrate or more will be explained in embodiment 2.

<Modification Example 1>

Figure 11:
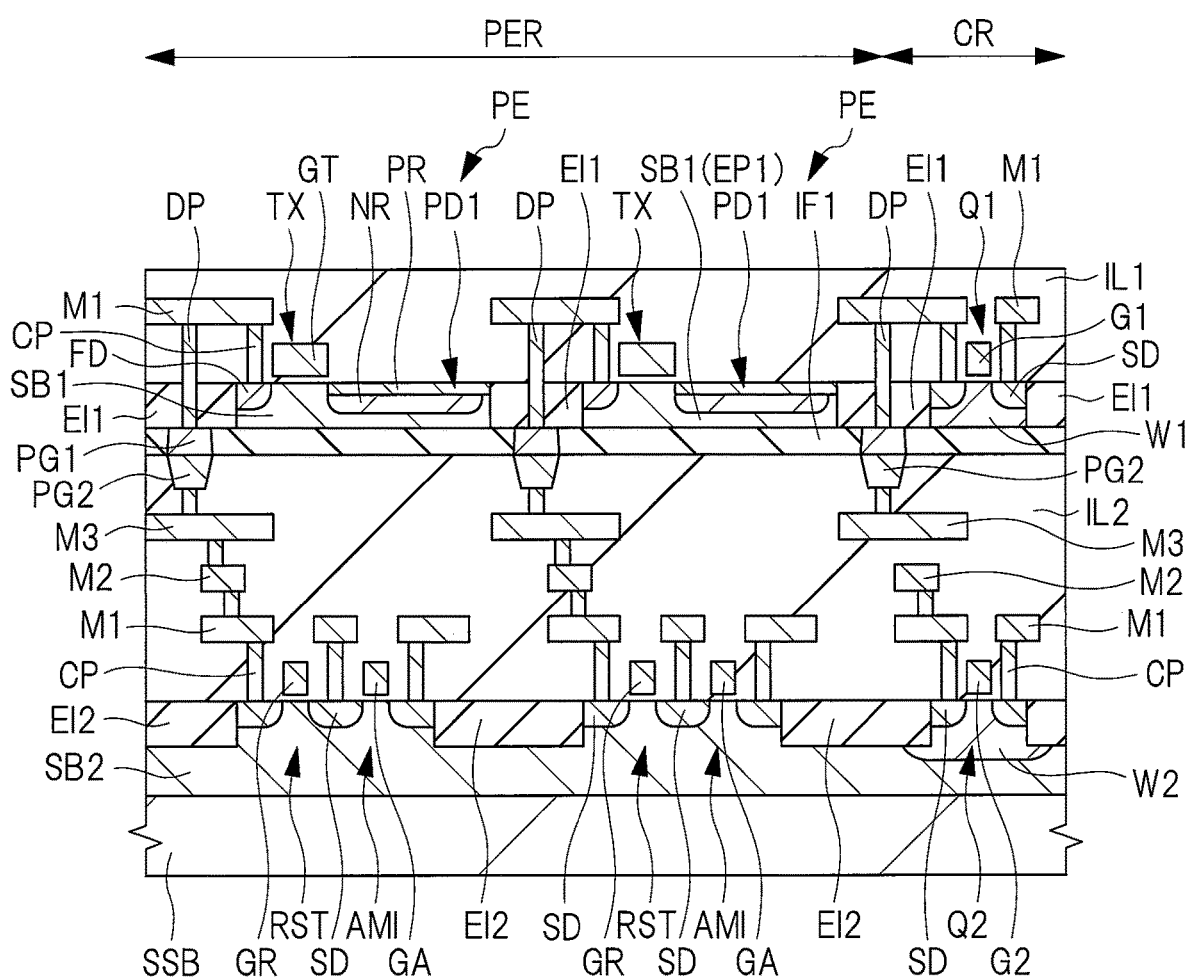
FIG. 11 is a sectional view illustrating a solid state image sensor that is modification example 1 of embodiment 1 according to the present invention.

FIG. 11 shows a sectional view of a solid state image sensor that is modification example 1 of the present embodiment. FIG. 11 is a sectional view of a location corresponding to FIG. 11. Herein, the followings will be explained: a plug that is larger in depth than a contact plug to be connected to an element(s) and that penetrates an element isolation region is formed just under a wiring(s) over a first semiconductor substrate; and depth of a plug formed on a first rear surface side of the first semiconductor substrate is reduced.

As shown in FIG. 11, a structure of a solid state image sensor according to the present modification example is almost the same as that of the solid state image sensor shown in FIG. 1. However, the structure shown in FIG. 11 is different from that shown in FIG. 1 in that the depth of the plug PG1 is shallow, and a plug (conductive connection part) DP penetrating the element isolation region EI1 is formed between the plug PG1 and the wiring M1 over the semiconductor substrate SB1. The plug DP is connected to the bottom surface of the wiring M1, and is made of almost the same material as that of the contact plug CP. The plug DP is formed deeper than the contact plug CP, and is formed so as to penetrate the element isolation region EI1 and the contact layer configuring the interlayer insulating film IL1.

The plug PG1 is formed so as to be embedded in a trench formed in a bottom surface of the insulating film IF1, and penetrates the insulating film IF1. Depth of the plug PG1 shown in FIG. 11 and directed upward from the bottom surface (lower surface) of the insulating film IF1 is shallower than that of the plug PG1 shown in FIG. 1. For example, the plug PG1 shown in FIG. 1 is formed over a range of the bottom surface of the insulating film IF1 to the bottom surface (lower surface) of the element isolation region EI1 penetrating the semiconductor substrate SB1. The upper surface of the plug PG1 is connected to the bottom surface of the plug DP near the bottom surface of the element isolation region EI1.

That is, the wiring M1 in the interlayer insulating film IL1 and the wiring M3 in the interlayer insulting film IL2 are electrically connected to each other through the plugs DP, PG1, and PG2 and the via-hole. Incidentally, a position of the lower surface of the plug DP may be set higher than that of the lowermost surface of the element isolation region EI1. In this case, an upper end of the plug PG1 reaches on the way to depth of the element isolation region EI1. Additionally, a part of the plug PG1 may cover a lower end of a side surface of the plug DP.

Figure 14:
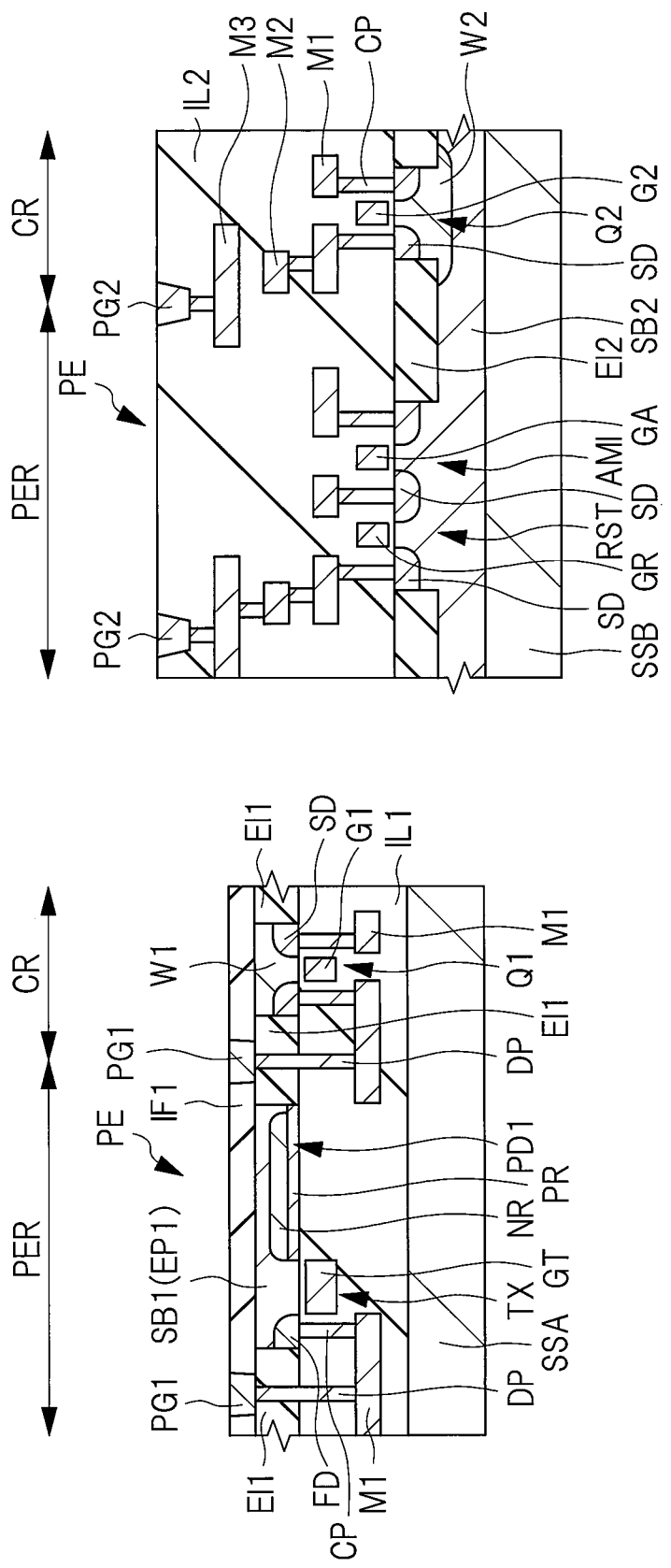
FIG. 14 is a sectional view during a manufacturing step of the solid state image sensor subsequently to FIG. 13.

Next, manufacturing steps of the solid state image sensor according to the present modification example will be explained with reference to FIGS. 12 to 14. FIGS. 12 and 13 are sectional views during manufacturing steps of the solid state image sensor according to the present modification example.

Firstly, the step explained with reference to FIG. 3 is performed, and then the semiconductor elements such as the photodiode PD1, the reset transistor RST, the amplification transistor AM1, and the transistors Q1 and Q2 are formed as explained with reference to FIG. 4. Subsequently, as shown in FIG. 12, a contact layer configuring the interlayer insulating film IL1 is formed on the semiconductor substrate SB1, and then a contact plug CP and a plug DP that penetrate the contact layer are formed.

Herein, for example, connection holes for embedding the contact plugs CP are opened in the contact layer, and then the connection holes for embedding the plugs DP are formed so as to penetrate the contact layer and the element isolation region EI1. Thereafter, a conductive member mainly made of, for example, Cu (copper) is embedded in each contact hole, which makes it possible to form the contact plugs CP and the plug DP. Incidentally, the plug DP may be formed with such depth as to reach on the way to the depth of the element isolation region EI1 without penetrating the element isolation region EI1. Additionally, the interlayer insulating film IL2 serving as a contact layer, and the contact plug CP penetrating the contact layer are formed on the semiconductor substrate SB2.

Next, as shown in FIG. 13, a wiring layer including the interlayer insulating film IL1 is formed on the contact layer, the plug DP, and the contact plug CP by performing the step explained with reference to FIG. 4. Further, a laminated wiring layer including the interlayer insulating film IL2 and the plug PG2 is formed on the semiconductor substrate SB2. Herein, formed is the wiring M1 connected to each upper surface of the plug DP and the contact plug CP.

Next, as shown in FI. 14, the steps explained with reference to FIGS. 5 to 7 are performed, and then the plug PG1 is formed as explained with reference to FIG. 8. However, the plug PG1 is formed so as to be shallow in depth differently from the step explained with reference to FIG. 8. That is, the plug PG1 is herein formed over a range of the lower surface of the insulating film IF1 to the upper surface of, for example, the element isolation region EI1. By doing so, the lower surface of the plug PG1 is connected to the upper surface of the plug DP. Incidentally, when the plug DP terminates on the way to the depth of the element isolation region EI1 in the longitudinal direction, the position of the upper surface of the element isolation region EI1 is removed by an etching method during the step of forming the connection hole that embeds the plug PG1, and an upper surface of the plug DP is thereby exposed from the bottom surface of the connection hole. Thereafter, since a conductive film is embedded in the connection hole, the plug PG1 connected to the upper surface of the plug DP can be formed.

Steps subsequent thereto are performed similarly to the steps having been explained with reference to FIGS. 9 and 10, so that the solid state image sensor according to the present modification example shown by FIG. 11 is completed.

The present modification example can obtain almost the same effects as those of the present embodiment having been explained with reference to FIGS. 1 to 10.

Additionally, in the present modification example, when the contact plug CP is formed on the semiconductor substrate SB1, the plug DP reaching an interior of the element isolation region EI1 is formed. For this reason, the depth of the plug PG1 to be formed from the first rear surface side of the semiconductor substrate SB1 can be inhibited so as to become shallow in comparison with a case of forming the plug PG1 that reaches the wiring M1. The plug PG1 with shallow depth can be easily formed in comparison with a case of forming a plug embedded in a deeper connection hole. Further, width of the plug PG1 embedded in a shallow connection hole can be reduced in comparison with that of the plug formed in the deeper connection hole. Therefore, the solid state image sensor can be made finer.

<Modification Example 2>

Figure 15:
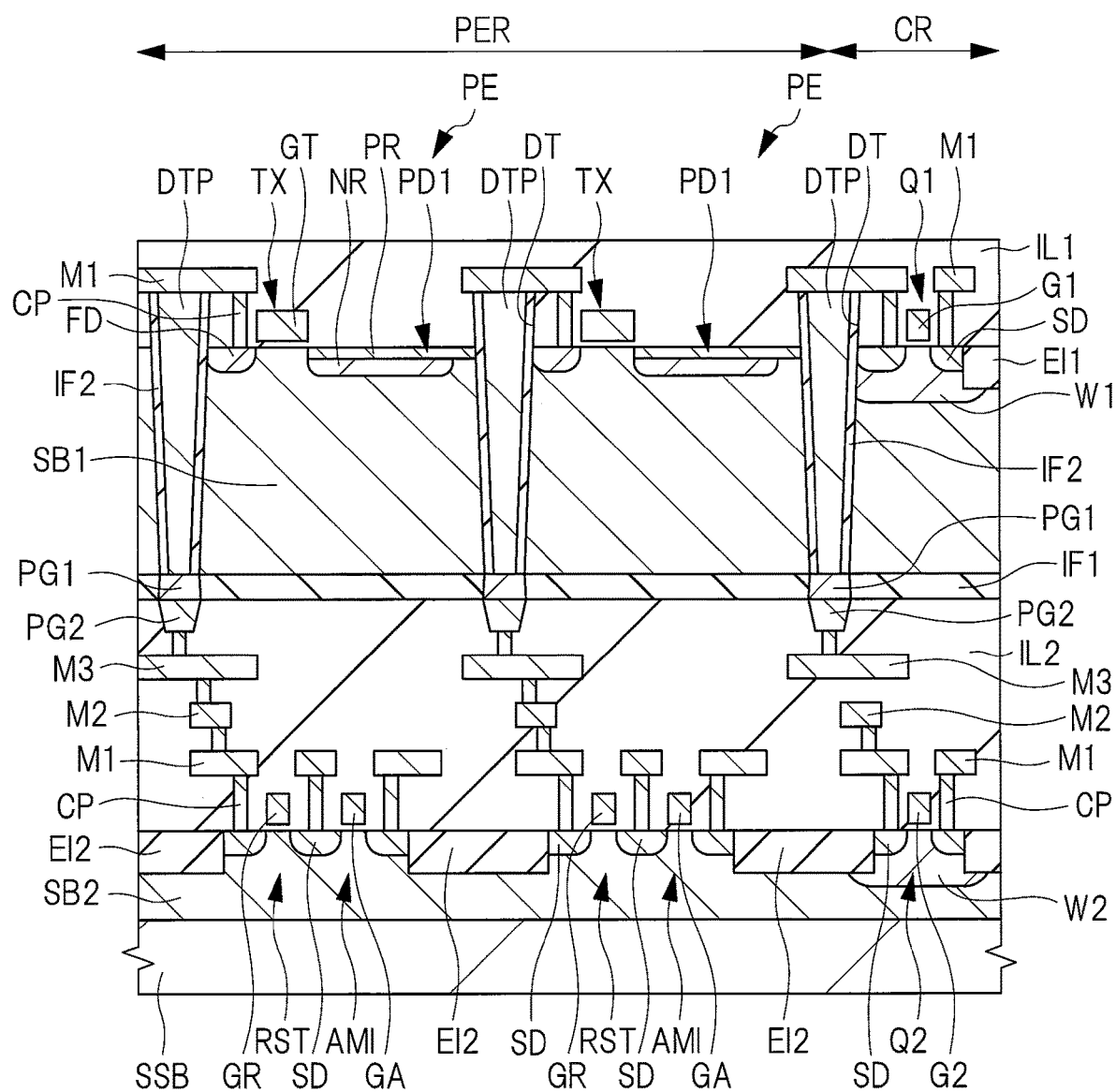
FIG. 15 is a sectional view illustrating a solid state image sensor that is modification example 2 of embodiment 1 according to the present invention.

FIG. 15 shows a sectional view of a solid state image sensor that is modification example 2 of the present embodiment. FIG. 15 is a sectional view of a location corresponding to FIG. 1. Herein, the followings will be explained: sensitivity performance is improved by forming a first semiconductor substrate so as to become thick; and a wiring over the first semiconductor substrate and a plug (bonding pad) on a rear surface side of the first semiconductor substrate are connected through a plug lying in a DTI (Deep Trench Isolation). Incidentally, FIGS. 15 to 18 each show a semiconductor substrate SB1 having larger film thickness than that of a semiconductor substrate SB2, but the semiconductor substrate SB2 may have film thickness equal to or larger than the semiconductor substrate SB1.

As shown in FIG. 15, a structure of the solid state image sensor according to the present modification example is different from the structure shown in FIG. 1 in that: thickness of the semiconductor substrate SB1 is larger than thickness of an element isolation region EI1; and a deep plug DTP whose side surface(s) is protected by an insulating film IF2 is formed between the lower surface of the wiring M1 over the semiconductor substrate SB1 and the plug PG1. The other structure is almost the same as the structure shown by FIG. 1. FIG. 15 does not illustrate an element isolation region EI1 in a pixel region PER, but the element isolation region EI1 may be formed.

The present modification example can obtain almost the same effects as those of the present embodiment explained with reference to FIGS. 1 to 10.

Additionally, the thickness of the semiconductor substrate SB1 is, for example, about several tens μm. In the present modification example, since the thickness of the semiconductor substrate SB1 is kept largely, a region in which light irradiated to the semiconductor substrate SB1 is photoelectrically converted can be increased. Therefore, since electric charges stored in the photodiode PD1 in taking an image(s) can be increased, sensitivity performance of the solid state image sensor can be improved. Here, depth of an n type semiconductor region NR may be larger than the depth of the n type semiconductor region NR shown by FIG. 1.

In order to use the semiconductor substrate SB1 having the larger film thickness like this and to electrically connect a wiring M1 and a plug PG1 over the semiconductor substrate SB1, a plug (conductive connection part) DTP embedded in a deep insulating part (DTI) is formed. That is, formed are trenches (connection holes) DT penetrating a contact layer and the semiconductor substrate SB1 and reaching an upper surface of the plug PG1, the contact layer configuring the interlayer insulating film IL1 under the wiring M1. A plug DTP is fully embedded in the trench DT through an insulating film IF2 covering a side surface of the trench DT.

Depth of the plug DTP is larger than that of the contact plug CP. An upper surface of the plug DTP is connected to a bottom surface of the wiring M1, and a bottom surface of the plug DTP is connected to the upper surface of the plug PG1. That is, the bottom surface of the plug DTP is positioned at almost the same height as that of a boundary surface between the semiconductor substrate SB1 and the insulating film IF1. The insulating film IF2 is composed of, for example, a silicon oxide film, and the plug DTP is made of, for example, W (tungsten). The insulating film IF2 is interposed also between the plug DTP and the interlayer insulating film IL1.

Like this, since the relatively deep plug DTP is formed in each pixel PE, an element(s) etc. on the semiconductor substrate SB1 side and an element(s) etc. on the semiconductor substrate SB2 can be electrically connected even if the film thickness of the semiconductor substrate SB1 is larger. Herein, a structure in which the plug DTP does not penetrate the element isolation region EI1 has been explained. However, the plug DTP may penetrate the element isolation region EI1. Even if the plug DTP does not penetrate the element isolation region EI1, the plug DTP and the semiconductor substrate SB1 can be prevented from being short-circuited since a region between the plug DTP and the semiconductor substrate SB1 is isolated by the insulating film IF2.

Additionally, the shallow plug PG1 is herein formed similarly to the plug PG1 having been explained with reference to FIGS. 11 to 14. Therefore, the plug PG1 can be formed with relatively narrow width similarly to modification example 1 of the present embodiment as mentioned above.

Figure 16:
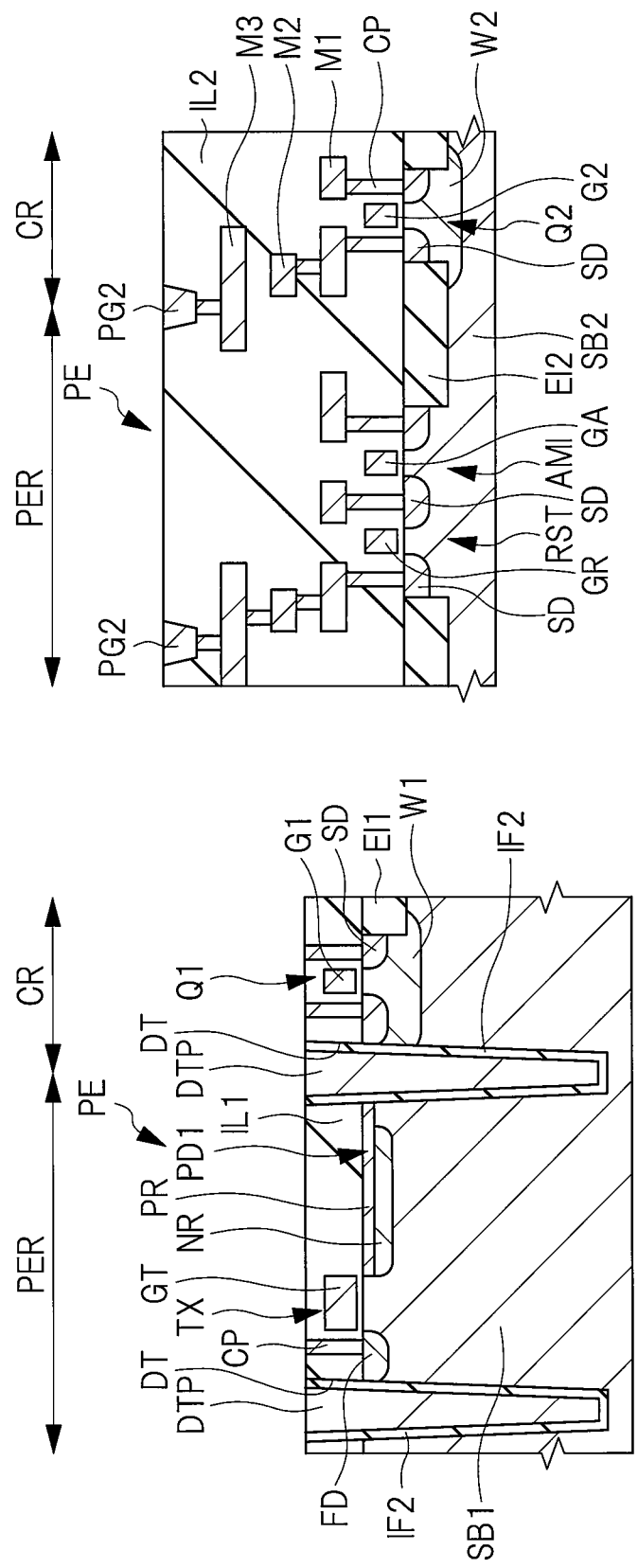
FIG. 16 is a sectional view during a manufacturing step of the solid state image sensor that is modification example 2 of embodiment 1 according to the present invention.
Figure 17:
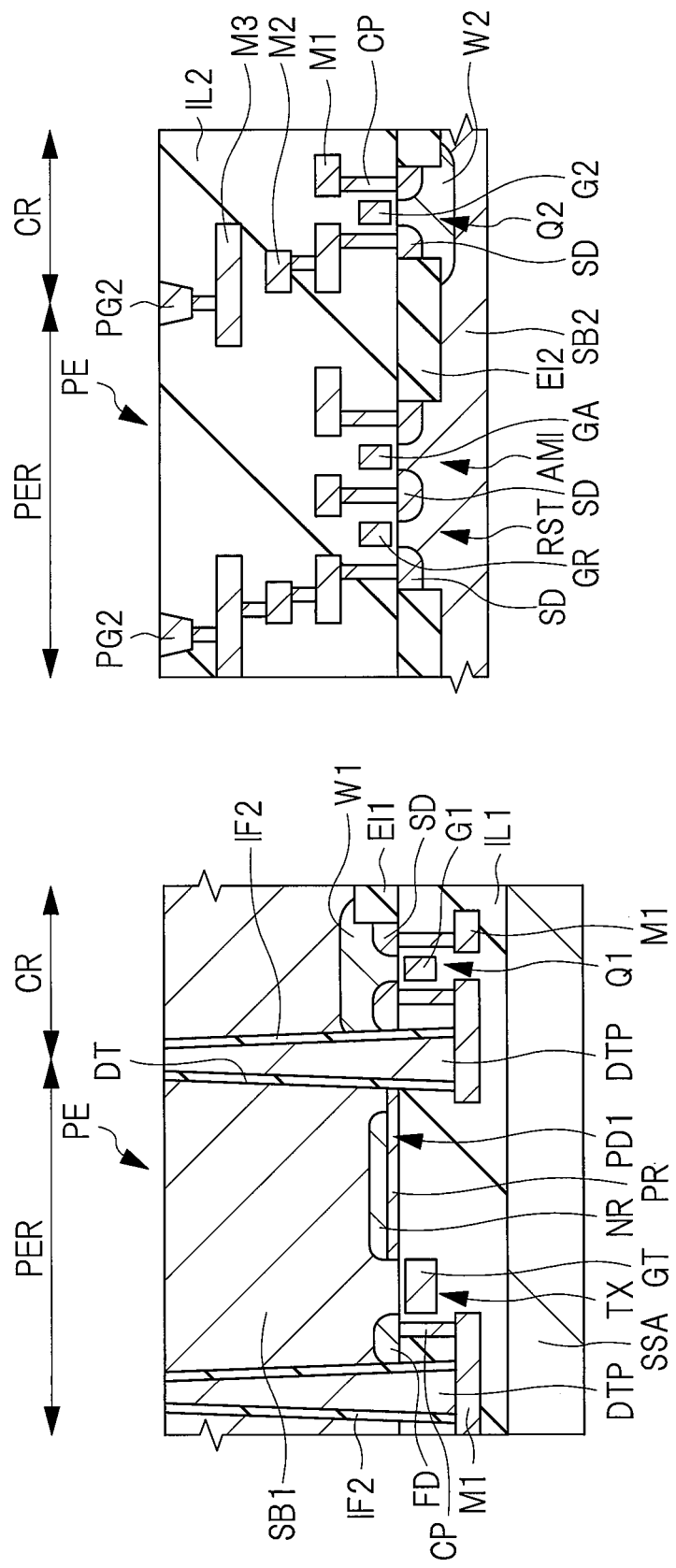
FIG. 17 is a sectional view during a manufacturing step of the solid state image sensor subsequently to FIG. 16.
Figure 18:
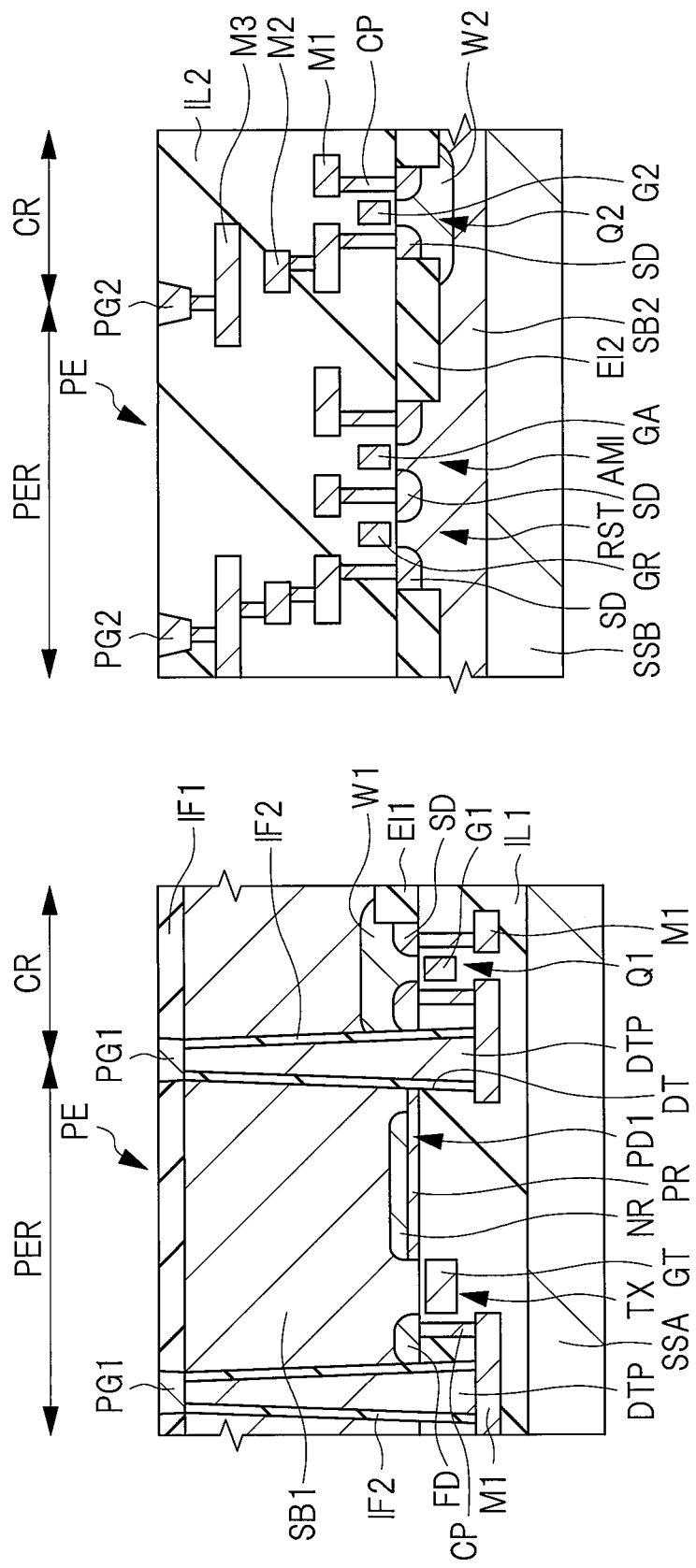
FIG. 18 is a sectional view during a manufacturing step of the solid state image sensor subsequently to FIG. 17.

Next, manufacturing steps of the solid state image sensor of the present modification example will be explained with reference to FIGS. 16 to 18. FIGS. 16 to 18 are sectional views during the manufacturing steps of the solid state image sensor of the present modification example.

Firstly the step explained with reference to FIG. 3 is performed, and then semiconductor elements such as a photodiode PD1, a reset transistor RST, an amplification transistor AM1, and transistors Q1 and Q2 are formed as explained with reference to FIG. 4. Subsequently, as shown in FIG. 16, a contact layer configuring the interlayer insulating film IL1 is formed on the semiconductor substrate SB1, and then a contact plug CP penetrating the contact layer is formed.

Subsequently, a deep trench reaching on the way to depth of the semiconductor substrate SB1 is formed by a lithography technique and an etching method. The trench DT reaches at a position deeper than that of a bottom surface of the element isolation region EI1, and has a depth of about several tens μm. Then, an insulating film IF2 is formed by, for example, a CVD method on the interlayer insulating film IL1 which includes an interior of the trench DT. Thereafter, by performing a dry etching proceeding, the insulating film IF2 on the interlayer insulating film IL1 and the insulating film IF2 on a bottom part of the trench DP are removed. A bottom surface of the trench DT may be exposed or not by this dry etching processing.

Subsequently, an interior of the trench DT is fully embedded by a conductive film made of, for example, W (tungsten) by using a sputtering method. Incidentally, a burrier conductive film made of, for example, Ti (titanium) or TiN (titanium nitride) may be formed so as to cover a surface of the insulating film IF2 before forming the above conductive film. After forming the conductive film, the burrier conductive film and the above conductive film on or over the interlayer insulating film IL1 are removed by using, for example, a CMP method to expose an upper surface of the interlayer insulating film IL1. By doing so, a plug DTP composed of the above burrier conductive film and the above conductive film is formed in the trench DT through the insulating film IF2.

Next, as shown in FIG. 17, the step explained with reference to FIG. 4 is performed, and a wiring layer, which covers the contact layer, the contact plug CP, and the plug DTP and includes the interlayer insulating film IL1, is thereby formed. Herein, a wiring M1 connected to each of the plug DTP and the contact plug CP is formed. Additionally, a laminated wiring layer including the interlayer insulating film IL2 and the plug PG2 is formed on the semiconductor substrate SB2.

Subsequently, the semiconductor substrate SB1 is inverted upside down, and then a first rear surface of the semiconductor substrate SB1 is polished by, for example, a CMP method. A retreat amount (polishing amount) of the first rear surface due to the polishing in this case is less than a polishing amount of the first rear surface of the semiconductor substrate SB1 explained with reference to FIG. 6. For this reason, the thickness of the semiconductor substrate SB1 is set at several tens μm. By this polishing step, the upper surface of the plug DTP is exposed in almost the same plane as the first rear surface.

Next, as shown in FIG. 18, the step explained with reference to FIG. 7 is performed, and then the plug PG1 is formed as explained with reference to FIG. 8. However, the plug PG1 is formed with shallow depth similarly to the step explained with reference to FIG. 14. By doing so, the plug PG1 whose lower surface is connected to the upper surface of the plug DTP is formed.

Steps subsequent thereto are performed similarly to the steps explained with reference to FIGS. 9 and 10, and the solid state image sensor of the present modification example shown by FIG. 15 is thereby completed.

The manufacturing step of the solid state image sensor according to the present modification example can obtain the effects explained with reference to FIG. 15.

<Modification Example 3>

Figure 19:
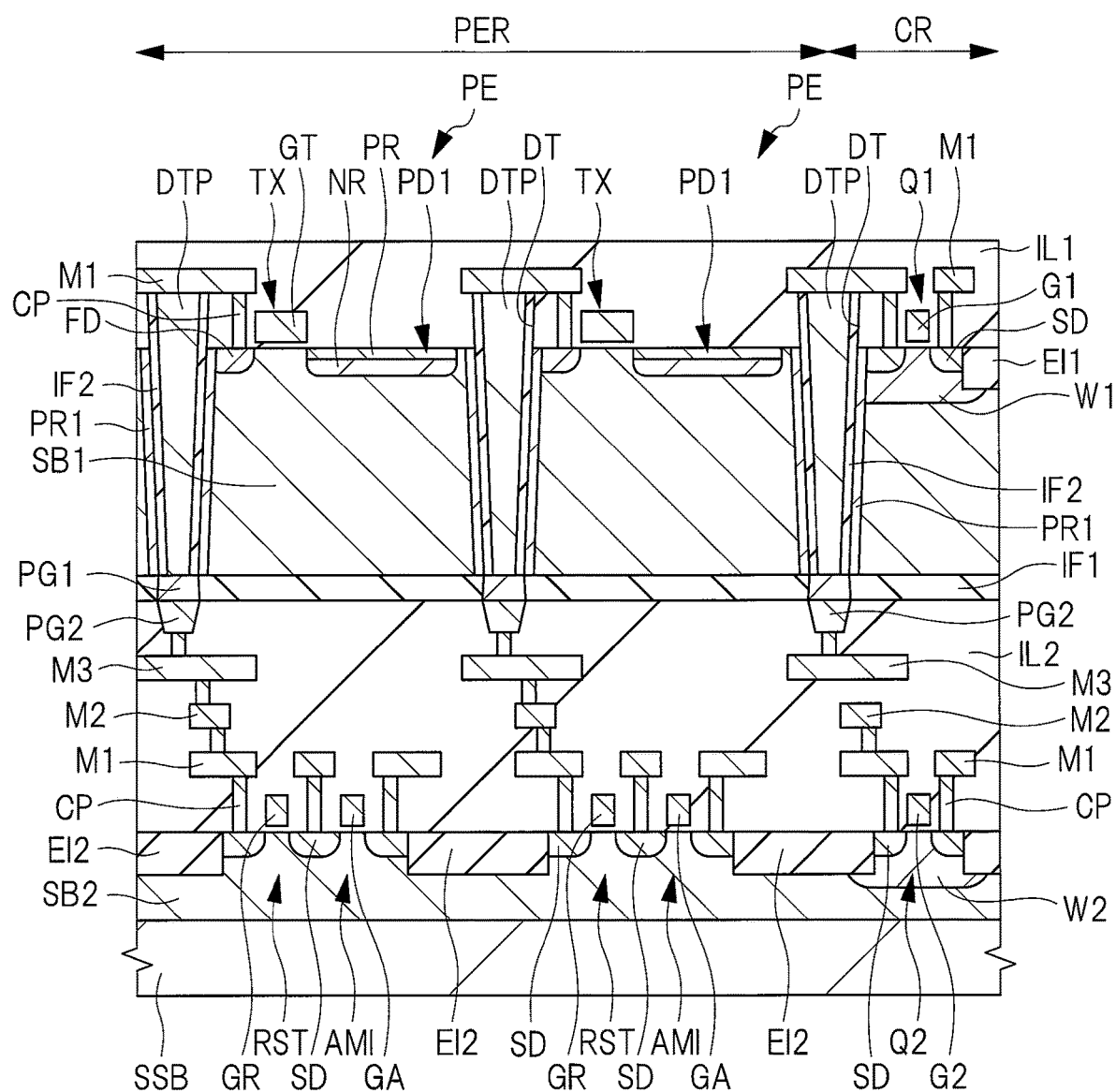
FIG. 19 is a sectional view illustrating a solid state image sensor that is modification example 3 of embodiment 1 according to the present invention.

Illustrated in FIG. 19 is a sectional view of a solid state image sensor that is modification example 3 of the present embodiment. FIG. 19 is a sectional view of a location corresponding to FIG. 1. Herein, when the first semiconductor substrate SB1 and the second semiconductor substrate SB2 are connected through the plug lying in the deep insulating part (DTI) similarly to the solid state image sensor that is modification example 2 of the present embodiment explained with reference to FIGS. 15 to 18, a case in which a protective layer composed of a p type semiconductor region is formed onto the first semiconductor substrate serving as a side surface of the deep trench will be explained.

As shown in FIG. 19, a structure of the solid state image sensor of the present modification example is almost the same as the structure shown in FIG. 15. However, the structure shown in FIG. 19 is different from the structure shown in FIG. 15 in that p type impurities (e.g., B (boron)) are introduced into the semiconductor substrate SB1 on the side surface of the trench DT. That is, a p type semiconductor region PR1 is formed in the semiconductor substrate SB1 contacting with an insulating film IF2 composed of, for example, a silicon oxide film.

Figure 20:
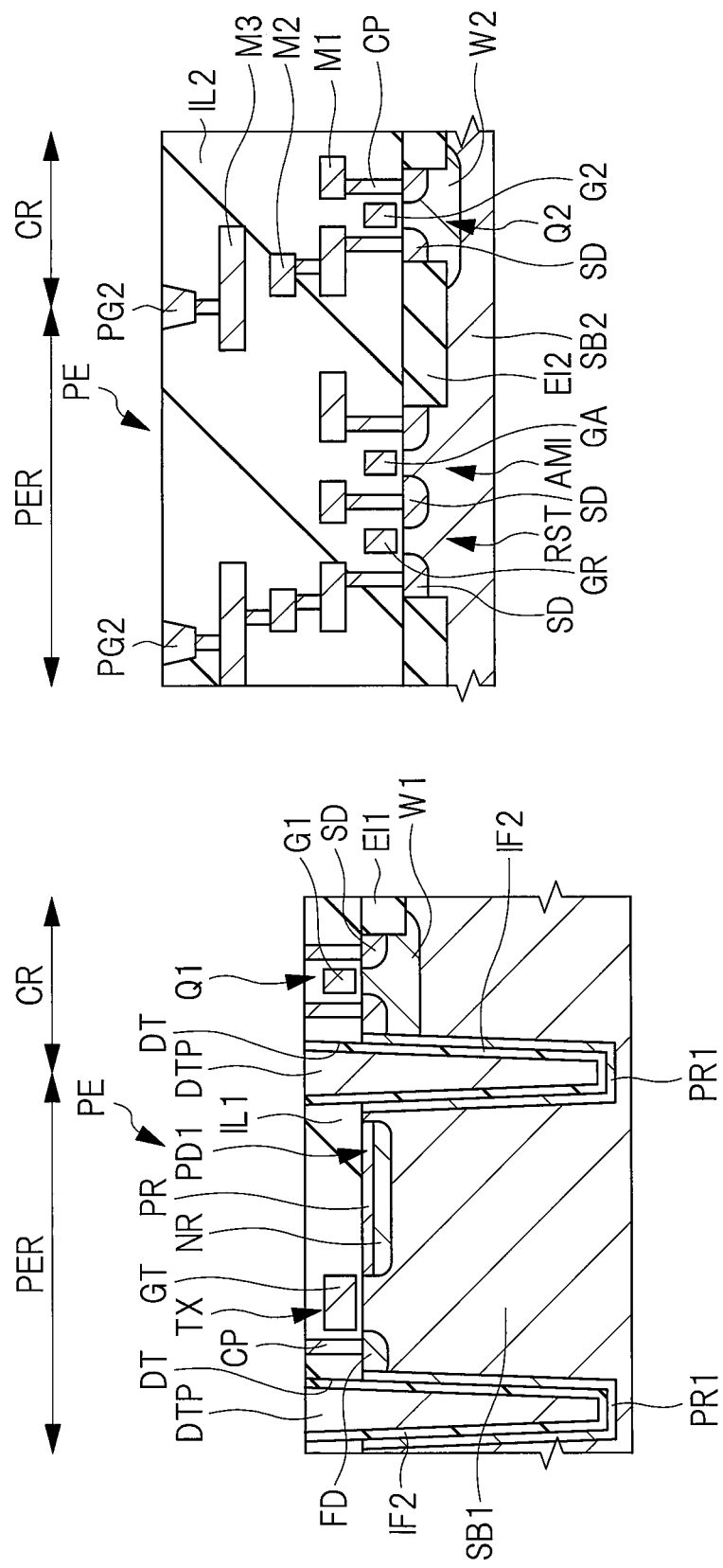
FIG. 20 is a sectional view during a manufacturing step of the solid state image sensor that is modification example 3 of embodiment 1 according to the present invention.
Figure 21:
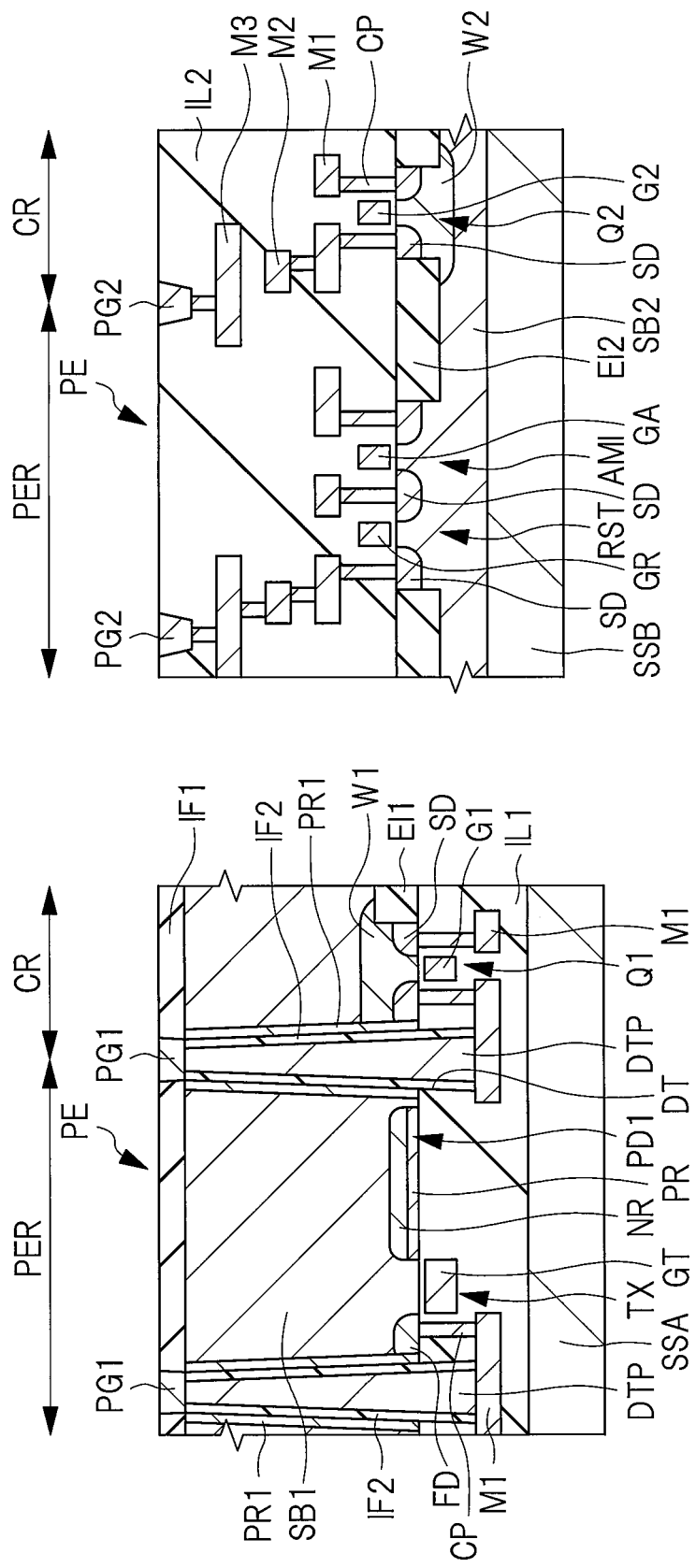
FIG. 21 is a sectional view during a manufacturing step of the solid state image sensor subsequently to FIG. 20.

Next, manufacturing steps of the solid state image sensor of the present modification example will be explained with reference to FIGS. 20 and 21. FIGS. 20 and 21 are each a sectional view during a manufacturing step of the solid state image sensor of the present modification example.

Next, the step explained with reference to FIG. 3 is performed, and then semiconductor elements such as a photodiode PD1, a reset transistor RST, an amplification transistor AMI, and transistors Q1 and Q2 are formed as explained with reference to FIG. 4. Subsequently, as shown in FIG. 20, a contact layer configuring the interlayer insulating film IL1 is formed on the semiconductor substrate SB1, and then a contact plug CP penetrating the contact layer is formed.

Subsequently, a deep trench DT reaching on the way to depth of the semiconductor substrate SB1 is formed by a lithography technique and an etching method. Then, p type impurities (e.g., B (boron)) are implanted into the side surface of the trench DT by using, for example, an ion implantation method. By doing so, a p type semiconductor region PR1 is formed on the side surface of the trench DT. Herein, the p type semiconductor region PR1 is formed also on the bottom surface of the trench DT. Subsequently, a plug DTP is formed in the trench DT through the insulating film IF2 similarly to the step explained with reference to FIG. 16.

Next, as shown in FIG. 21, the steps explained with reference to FIGS. 17 and 18 are performed, and the insulating film IF1, the plug PG1, and a wiring layer(s) including the interlayer insulating film IL1 are thereby formed. Additionally, a laminated wiring layer including an interlayer insulating film IL2 and the plug PG2 is formed over the semiconductor substrate SB2.

Steps subsequent thereto are performed similarly to the steps explained with reference to FIGS. 9 and 10, and the solid state image sensor of the present modification example as shown by FIG. 19 is thereby completed.

In the present modification example, the p type semiconductor region PR1 is formed as a protective layer on the side surface of the trench DT, so that electric charges generated in the semiconductor substrate SB1 can be prevented from moving on a plug DTP side, and that a current(s) in the plug DTP can affect the photodiode PD1. As a result, it is possible to prevent sensitivity performance of the solid state image sensor from deteriorating, and to suppress generation of noises.

Additionally, in a silicon layer having a photodiode, it is easy for electrons to be generated at a boundary surface in which the contact layer and the insulating film contact with each other. This existence of the electrons brings a problem of generating a dark current. The dark current is a current resulting from the electrons generated at a pixel(s), to which light is not irradiated, in the pixel region of the solid state image sensor. For this reason, if the dark current is generated, imaging performance of the solid state image sensor deteriorates.

In the solid state image sensor according to the present modification example, the electros generated at the boundary surface between the semiconductor substrate SB1 and the insulating film IF2 can be caused to be captured and disappear by positive holes in the p type semiconductor region PR1. Therefore, since the generation of the dark current can be prevented, the performance of the solid state image sensor can be improved.

<Modification Example 4>

Figure 22:
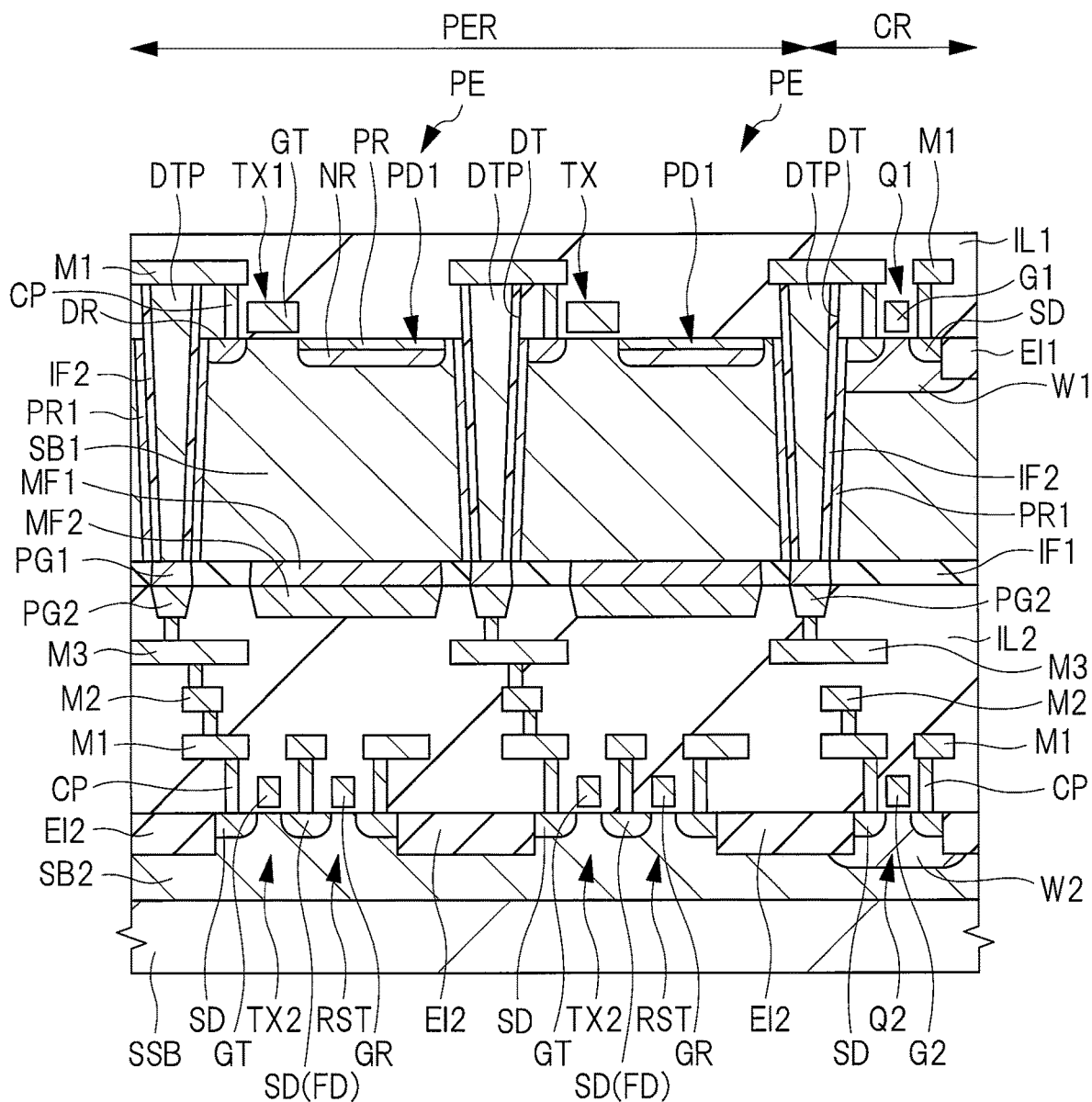
FIG. 22 is a sectional view illustrating a solid state image sensor that is modification example 4 of embodiment 1 according to the present invention.
Figure 23:
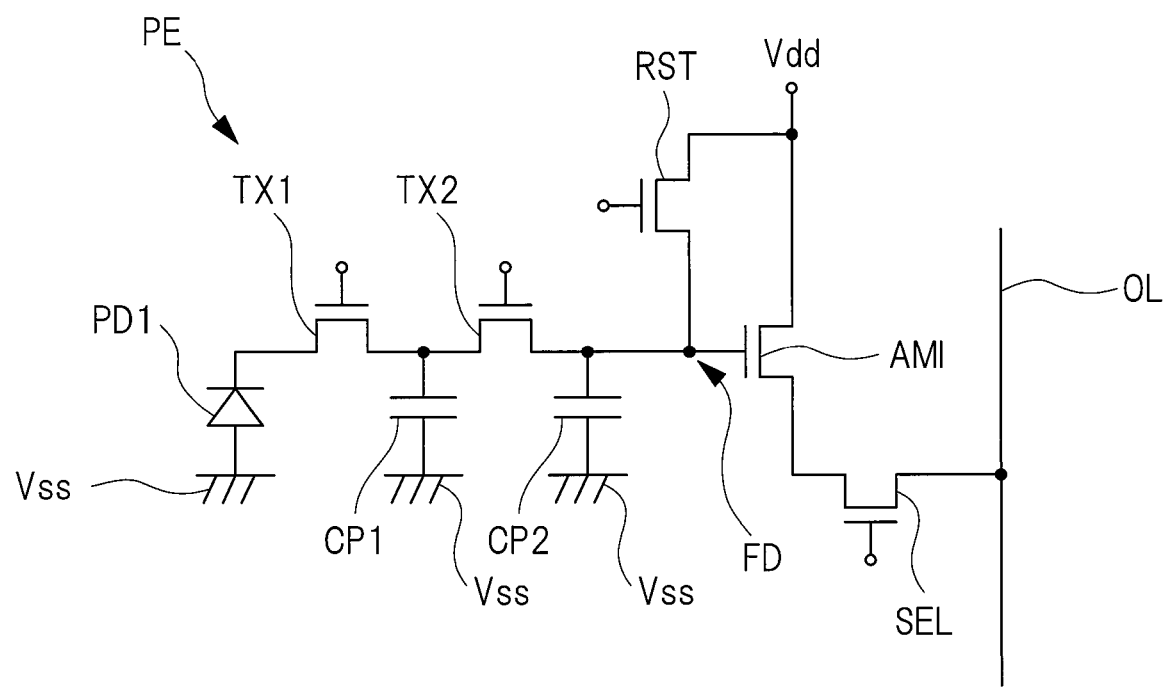
FIG. 23 is an equivalent circuit schematic of pixels configuring the solid state image sensor that is modification example 4 of embodiment 1 according to the present invention.

Illustrated in FIG. 22 is a sectional view of a solid state image sensor that is modification example 4 of the present embodiment. FIG. 22 is a sectional view of a location corresponding to FIG. 1. Additionally, illustrated in FIG. 23 is an equivalent circuit schematic of each pixel in the solid state image sensor according to the present modification example. Herein explained will be a solid state image sensor having a global shutter function and having almost the same structure as that of the solid state image sensor which is modification example 3 of the present embodiment and which has been explained with reference to FIGS. 19 to 21.

As shown in FIG. 22, a structure of the solid state image sensor according to present modification example is almost the same as the structure shown by FIG. 19. However, the solid state image sensor of the present modification example has a global shutter function. An imaging method utilizing the solid state image sensor includes a method utilizing a rolling shutter, and a method utilizing a global shutter.

The rolling shutter is also called line-exposure sequentially reading, and is a method in which: a pixel(s) in one line or more lines among a plurality of pixels arranged in a matrix format in the pixel region of the solid state image sensor is set as one block; a sub-image(s) is sequentially taken for each block; and one image is obtained by collecting the sub-images obtained from the respective blocks. To take the sub-images is performed not concurrently at all of the blocks but with a time difference at each block. For this reason, if an object to be imaged moves, an outline of the imaged object is distorted in the image obtained by taking the sub-images in some cases.

In contrast, the global shutter is also called simultaneous exposure batch reading, and is a method of taking images simultaneously at all of the pixels in the pixel region. For this reason, even when a moving object to be imaged is imaged, the imaged object in the image can be prevented from being distorted unlike the rolling shutter method.

As shown in FIG. 23, an image by the solid state image sensor according to the present modification example has, unlike the image shown by FIG. 2, two transfer transistors TX1 and TX2 connected to each other in series between the photodiode PD1 and each of the reset transistor RST and amplification transistor AMI. In other words, the transfer transistors TX1 and TX2 are connected in series in this order to a cathode of the photodiode PD1. That is, a drain region DR (see FIG. 22) of the transfer transistor TX1 whose source region is connected to the photodiode PD1 is connected to a source region of the transfer transistor TX2, and a floating diffusion capacitor FD that is a drain region of the transfer transistor TX2 is connected to a source electrode of the reset transistor RST and a gate electrode of the amplification transistor AMI.

Additionally, the drain region (drain electrode) DR of the transfer transistor TX1 and a source region (source electrode) of the transfer transistor TX2 are connected to one electrode of a capacitive element CP1. The floating diffusion capacitor FD serving as a drain region (drain electrode) of the transfer transistor TX2, the source electrode of the reset transistor RST, and the gate electrode of the amplification transistor AMI are connected to the one electrode of a capacitive element CP2. A grounding potential that is a negative-side power supply potential Vss is applied to each of capacitive elements (capacitor) CP1 and CP2. That is, used as the floating diffusion capacitor FD is a current path coupling the drain region of the transfer transistor TX2, the capacitive element CP2, the source electrode of the reset transistor RST, and the gate electrode of the amplification transistor AMI. The capacitive element CP1 that is a memory node (memory part) is an element for temporarily retaining the electric charges obtained from the photodiode PD1 by taking the image.

As shown in FIG. 22, the photodiode PD1 is connected to the transfer transistor TX1 formed near the first main surface of the semiconductor substrate SB1. Additionally, the reset transistor RST, and the transfer transistor TX2 having almost the same structure as that of the reset transistor RST are formed near the second main surface of the semiconductor substrate SB2. A drain region (floating diffusion capacitor FD) out of source/drain regions configuring the transfer transistor TX2 is integrated with the source region of the reset transistor RST. The transfer transistor TX2 that is an n-channel type field-effect transistor has a gate electrode GT that is formed on the semiconductor substrate SB2 through a gate insulating film. Incidentally, the drawing illustrates no transfer transistor and no amplification transistor formed in the pixel PE.

The drain region DR of the transfer transistor TX1 is electrically connected on the semiconductor substrate SB2 side through: the contact plug CP and wiring M1 on the semiconductor substrate SB1; and the plugs DTP, PG1, and PG2. Although not shown in the drawing, a capacitive element C1 (see FIG. 23) is connected to a current path between the drain region DR and the source region of the transfer transistor TX2, and the capacitive element CP1 is formed, for example, near the main surface of the semiconductor substrate SB2 or in the interlayer insulating film IL2. Further, although not shown in the drawing, a capacitive element CP2 (see FIG. 23) is connected to source/drain regions (floating diffusion capacitor FD) which are shared by the transfer transistor TX2 and the reset transistor RST, and the capacitive element CP2 is formed, for example, near the main surface of the semiconductor substrate SB2 or in the interlayer insulating film IL2.

When the capacitive elements CP1 and CP2 are formed on the semiconductor substrate SB2, the capacitive elements CP1 and CP2 are considered to be diffusion regions configured from diffusion regions (semiconductor regions) formed by introducing p or n type impurities into the second main surface of the semiconductor substrate SB2. Additionally, a case in which the capacitive elements CP1 and CP2 are formed in the interlayer insulating film IL2 will be explained below as modification example 5 of the present embodiment with reference to FIG. 24.

Additionally, a trench (concave part) is formed in a lower surface of the insulating film IF1 in each pixel PE, and a metal film MF1 is embedded in the trench. Further, a trench (concave part) is formed in an upper surface of the interlayer insulating film IL2 in each pixel PE, and a metal film MF2 is embedded in the trench. The metal films MF1 and MF2 are formed at such a position as to overlap each other in a plan view. Moreover, the metal films MF1 and MF2 are formed at such a position as to overlap the photodiode PD1 in a plan view. The metal films MF1 and MF2 occupy most of each pixel PE and are formed so as to expand horizontally in a plan view.

The metal film MF1 can be formed, for example, in a forming step of the plug PG1, and the metal film MF2 can be formed, for example, in a forming step of the plug PG2. For this reason, the metal film MF1 has almost the same depth as, for example, that of the plug PG1, and the metal film MF2 has almost the same depth as, for example, that of the plug PG2. Each of the metal films MF1 and MF2 is mainly made of, for example, Cu (copper).

Each of the metal films MF1 and MF2 has a role of a light-shielding film (reflection film) for preventing electric charges (signal, information) from fluctuating by light permeated from above the insulating film IF1 to an interlayer insulating film IL2 side, the electric charges being stored in the capacitive element CP1 connected to a memory node and the capacitive element CP2 connected to the floating diffusion capacitor FD. Therefore, the metal films MF1 and MF2 are formed just on or over the respective capacitive elements CP1 and CP2 so as to cover the capacitive elements CP1 and CP2. The metal films MF1 and MF2 are not connected to a wiring(s) etc. and are in electrically floating states. That is, the metal films MF1 and MF2 do not configure any circuit.

The present modification example can obtain almost the same effect as that of modification example 3 of the present embodiment. Additionally, in the solid state image sensor having a global shutter function, the capacitive elements CP1 and CP2, the transfer transistor TX, and the peripheral transistor in each pixel PE can be formed near the main surface of the second semiconductor substrate SB2 and in the interlayer insulating film IL2. Therefore, since their elements and the photodiode PD1 do not need to be collectively formed on one semiconductor substrate, an occupied area of the photodiode PD1 in each pixel PE in a plan view can be increased. Thus, the sensitivity performance of the solid state image sensor can be improved.

Additionally, the element etc. on the semiconductor substrate SB1 side and the element etc. on the semiconductor substrate SB2 side are electrically connected by using the plugs DTP, PG1 and PG2 which are connection parts finer than the Si through-electrode, so that length of a current path configuring the memory node and the floating diffusion capacitor FD in each pixel PE can be prevented from varying.

Moreover, in the solid state image sensor of the comparative example explained with reference to FIG. 32, a laminated substrate is formed by opposing the main surfaces of the semiconductor substrates SB1 and SB2 to each other. If such a solid state image sensor is used as, for example, a contact image sensor (CSI), the upper photodiode PD1 becomes a BSI (back side illumination, rear-surface irradiation type, rear-surface irradiation type), so that there arises a problem of deterioration in sensitivity with respect to blue light. The BSI is a device in which a light source and the solid state image sensor are integrated.

In contrast, as shown in FIG. 22 in the present modification example, a laminated substrate is formed by opposing the first rear surface of the semiconductor substrate SB1 and the second main surface of the semiconductor substrate SB2. Therefore, since all of the photodiodes PDI become FSIs (Front Side Illumination, front-surface irradiation type), their sensitivity with respect to blue light can be prevented from deteriorating.

Incidentally, it is considered to form one of the metal films MF1 and MF2 and not to form the other. In this case, since the metal film and the insulating film contact in a surface of joining the laminated bodies to each other, there is a fear of deterioration in strength for joining the laminated bodies to each other. For this reason, the metal film MF1 and the metal film MF2 opposing the metal film MF1 are herein formed, and the metal films MF1 and MF2 are joined to each other, so that joint strength between a first laminated body including the semiconductor substrate SB1 and a second laminated body including the semiconductor substrate SB2 is enhanced.

<Modification Example 5>

Figure 24:
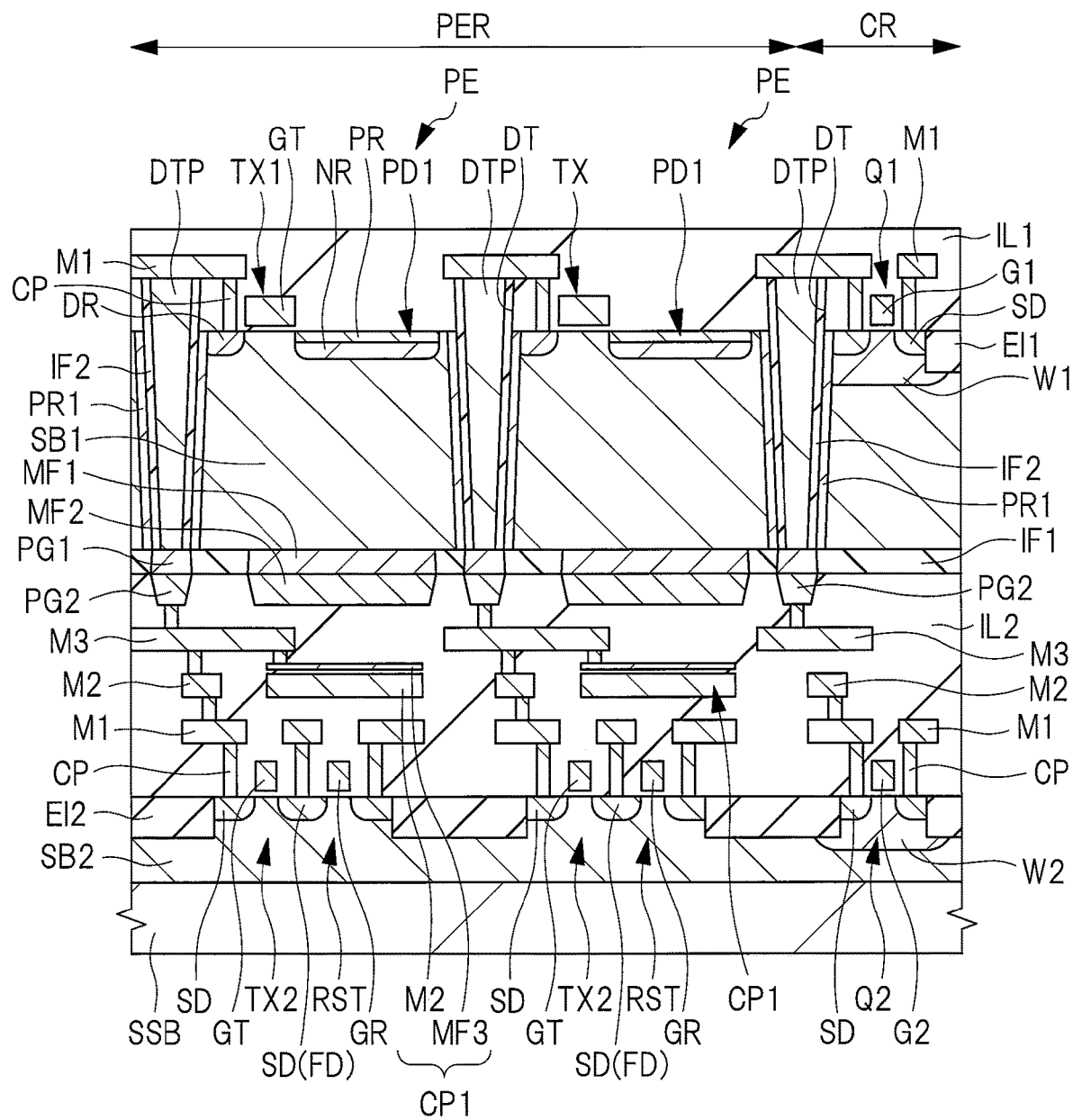
FIG. 24 is a sectional view illustrating a solid state image sensor that is modification example 5 of embodiment 1 according to the present invention.

Illustrated in FIG. 24 is a sectional view of a solid state image sensor that is modification example 5 of the present embodiment. FIG. 24 is a sectional view of a location corresponding to FIG. 1. Herein explained will be a case in which a solid state image sensor has almost the same structure as that of modification example 4 of the present embodiment as explained with reference to FIGS. 22 and 23, and which a capacitive element(s) is provided in a wiring layer on the second semiconductor substrate SB2 side.

As shown in FIG. 24, a structure of a solid state image sensor of the present modification example is almost the same as that shown by FIG. 22, and has a circuit similar to an equivalent circuit schematic shown by FIG. 23 in each pixel PE. That is, the solid state image sensor of the present modification example has a global shutter function.

A capacitive element CP1 formed in the interlayer insulating film IL2 is illustrated in FIG. 24 unlike the structure shown by FIG. 22. The capacitive element CP1 is formed, in the interlayer insulting film IL2 in each pixel PE, on the wiring M1 and in a region just under the metal film MF2. The capacitive element CP1 is configured by a wiring M2 and a metal film M3 formed on the wiring M2 through an insulating film. The insulating film is composed of, for example, a silicon oxide film. Additionally, the metal film M3 is composed of a Cu (copper) film or an Al (aluminum) film. Incidentally, the insulating film is shown in the drawing so as to be integrated with the interlayer insulating film IL2.

In forming such a capacitive element CP1, a wiring layer including the wiring M2 is formed during, for example, the step explained with reference to FIG. 4. That is, the interlayer insulting film IL in whose upper surface the wiring M2 is embedded is formed. At this time, an upper surface of the wiring M2 is exposed. Next, the insulating film and the metal film M3 are formed over the wiring M2 in order by using a CVD method and a sputtering method etc. Thereafter, the metal film M3 is processed by using a lithography technique and an etching method. By doing so, the capacitive element CP1 composed of the wiring M2 and the metal film MF3 is formed. Then, the interlayer insulating film IL2 including the wiring M3 and a via-hole(s) etc. is formed over the metal film MF3. Although not shown in the drawing, the capacitive element CP2 (see FIG. 23) can be also formed in the interlayer insulating film IL2 similarly to the capacitive element CP1.

The capacitive element CP1 configures a memory node, and is electrically connected, through the via-hole connected to the upper surface of the metal film MF3 and the wiring M3 connected to an upper surface of the via-hole, to a drain region DR configuring a transfer transistor TX1 and a source region of a transfer transistor TX2.

The present modification example can obtain almost the same effect as that of modification example 4 of the present embodiment as mentioned above. Additionally, since the capacitive element CP1 is formed in the interlayer insulating film IL2 over the semiconductor substrate SB2, it becomes unnecessary to form the capacitive element CP1 over the semiconductor substrate SB1. Therefore, since an element(s) other than the photodiode PD1 and the transfer transistor TX1 does not need to be formed near the first main surface of the semiconductor substrate SB1 and in the interlayer insulating film IL1 on the first main surface, the occupied area of the photodiode PD1 in each pixel PE in a plan view can be increased. Thus, the sensitivity performance of the solid state image sensor can be improved.

<Modification Example 6>

Figure 25:
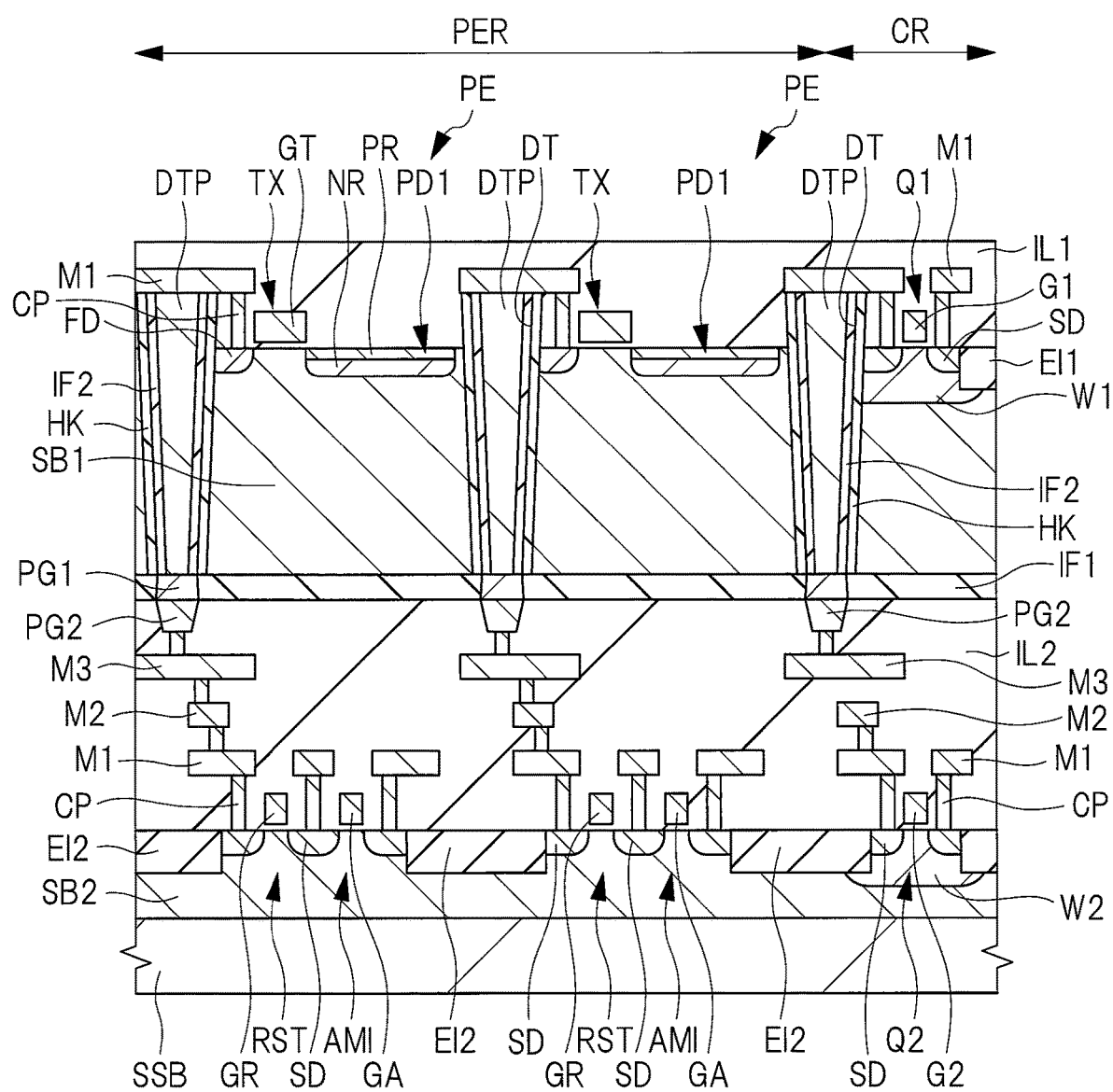
FIG. 25 is a sectional view illustrating a solid state image sensor that is modification example 6 of embodiment 1 according to the present invention.

Illustrated in FIG. 25 is a sectional view of a solid state image sensor that is modification example 6 of the present example. FIG. 25 is a sectional view of a location corresponding to FIG. 1. Herein explained similarly to the solid state image sensor of modification example 2 of the present embodiment explained with reference to FIGS. 15 to 18 will be a case of connecting a first semiconductor substrate SB1 and a second semiconductor substrate SB2 through plugs lying in deep trenches (DTI) and a case of forming a high dielectric film between a side surface of the deep trench and the insulating film IF2.

As shown in FIG. 25, a structure of the solid state image sensor of the present modification example is almost the same as that shown by FIG. 15. The structure shown in FIG. 25 is different from that shown in FIG. 15 in that an insulting film HK is formed between a side surface of a trench DT and an insulating film IF2. That is, the insulating film HK, the insulating film IF2, and the plug DTP are formed in the trench DT in this order from a side surface of the trench DT. The insulting film HK is formed not only between the insulating film IF2 and the semiconductor substrate SB1 but also between the insulating film IF2 and the interlayer insulating film IL1, and covers the side surface of the trench DT. The insulating film HK is a film (high dielectric-constant film, high-k film) having a higher dielectric constant than those of silicon oxide and silicon nitride. The insulating film HK contains, for example, Hf (hafnium).

Figure 26:
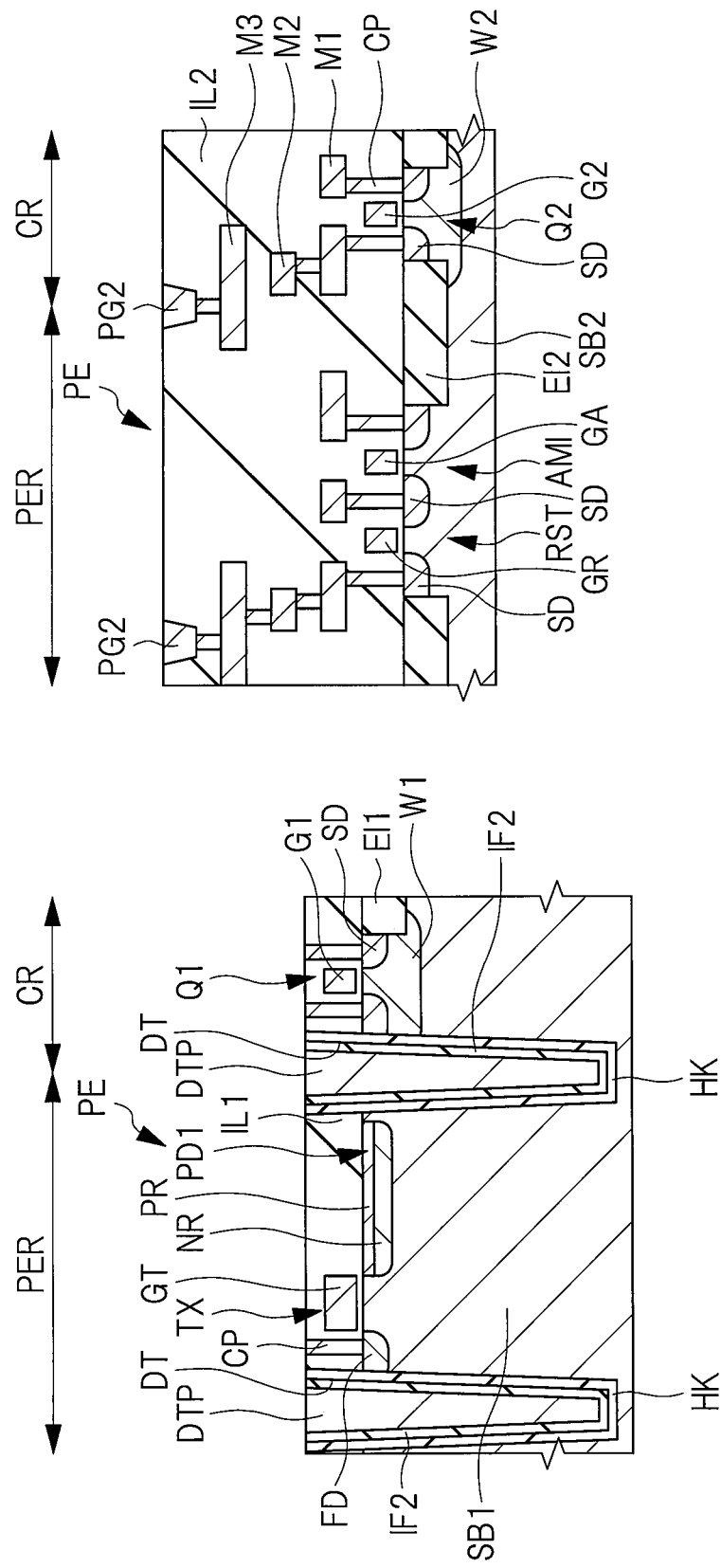
FIG. 26 is a sectional view during a manufacturing step of the solid state image sensor that is modification example 6 of embodiment 1 according to the present invention.

Next, a manufacturing step of the solid state image sensor of the present modification example will be explained with reference to FIG. 26. FIG. 26 is a sectional view during a manufacturing step of the solid state image sensor that is the present modification example.

Firstly, the step explained with reference to FIG. 3 is performed, and then semiconductor elements such as the photodiode PD1, the resent transistor RST, the amplification transistor AMI, and the transistors Q1 and Q2 are formed as explained with reference to FIG. 4. Subsequently, as shown in FIG. 26, a contact layer configuring the interlayer insulating film IL1 is formed on the semiconductor substrate SB1, and then a contact plug CP penetrating the contact layer is formed.

Subsequently, the deep trench DT reaching on the way to depth of the semiconductor substrate SB1 is formed by a lithography technique and an etching method. Then, the insulating film HK is formed on the semiconductor substrate SB1 including an interior of the trench DT. By doing so, the insulating film HK covering the side surface and a bottom surface of the trench DT is formed. Subsequently, a plug DTP is formed in the trench DP through the insulating film IF2 similarly to the step explained with reference to FIG. 16. That is, the interior of the trench DT is embedded by the insulating film IF2 and a conductor film; then the insulting films HK and IF2 and the conductor film are removed by using, for example, a CMP method; and the plug DT composed of the above-mentioned conductive film is formed in the trench DT through the insulating films HK and IF2 in this order.

Next, the steps explained with reference to FIGS. 17 and 18 is performed; and a wiring layer including the interlayer insulating film IL1, the insulating film IF1, and the plug PG1 connected to the plug DTP are formed. Additionally, a laminated wiring layer including the interlayer insulating film IL2 and the plug PG2 is formed on the semiconductor substrate Sb2.

A step(s) subsequently thereto is performed similarly to the steps explained with reference to FIGS. 9 and 10, and the solid state image sensor of the present modification example shown by FIG. 25 is thereby completed.

The present modification example can obtain almost the same effect as that of modification example 2 of the present embodiment explained with reference to FIGS. 15 to 18.

Additionally, in the present modification example, since the insulating film HK is formed as a protective film covering the side surface of the trench DT, it is possible to prevent the electric charges generated in the semiconductor substrate SB1 from moving on the plug DTP side and to affect the photodiode PD1 by the current in the plug DTP. As a result, it is possible to prevent the sensitivity performance of the solid state image sensor from deteriorating and to inhibit the noises from being generated.

(Embodiment 2)

Figure 27:
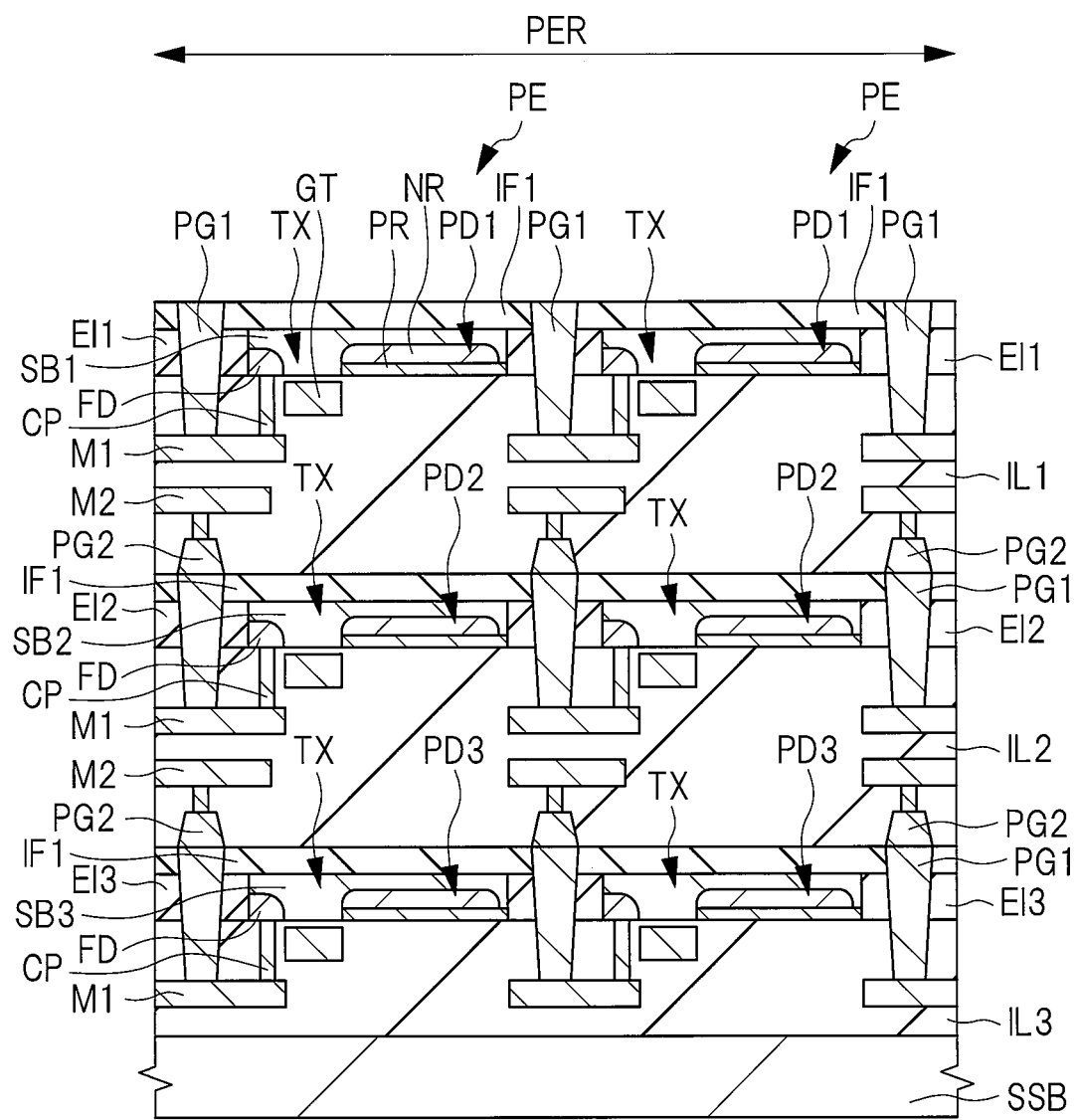
FIG. 27 is a sectional view illustrating a solid state image sensor that is embodiment 2 according to the present invention.

Illustrated in FIG. 27 is a sectional view of a solid state image sensor that is present embodiment 2. FIG. 27 shows only a pixel region PER and omits illustration of a peripheral circuit region. Shown in a pixel region PER of FIG. 27 are two pixels PE arranged alongside in a lateral direction. Herein explained will be a case of laminating three semiconductor substrates each having a photodiode.

As shown in FIG. 27, a structure of a solid state image sensor according to the present embodiment has a photodiode on a main surface, and has a structure of laminating three semiconductor substrates whose rear surfaces are directed upward. Herein, the semiconductor substrate SB2 is laminated over the semiconductor substrate SB3, and the semiconductor substrate SB1 is laminated over the semiconductor substrate SB2. The semiconductor substrate SB1 has a first main surface, and a first rear surface on a semiconductor side of the first main surface. The semiconductor substrate SB2 has a second main surface, and a second rear surface on a semiconductor side of the second main surface. The semiconductor substrate SB3 has a third main surface, and a third rear surface on a semiconductor side of the third main surface.

A structure of the semiconductor substrate SB3, a semiconductor element(s) formed near the third main surface, the interlayer insulating film IL3 covering the semiconductor element is obtained by inverting upside down the structure of the semiconductor substrate SB1, the semiconductor element formed near the first main surface of the semiconductor substrate SB1, the interlayer insulating film IL1 covering the semiconductor element as explained with reference to FIG. 1. That is, a photodiode PD3 is formed on the third main surface of the semiconductor substrate SB3 in each pixel PE, and the insulating film IF1 is formed on the third rear surface of the semiconductor substrate SB3. Additionally, formed is the plug PG1 that penetrates the insulating film IF1, an element isolation film EI3 penetrating the semiconductor substrate SB3, and apart of the interlayer insulating film IL3 and that is connected to the upper surface of the wiring M1 in the interlayer insulating film IL3. The pluge PG1 is electrically connected to the transfer transistor TX lying near the third main surface of the semiconductor substrate SB3 through the wiring M1 and the contact plug CP in the interlayer insulating film IL3. The supporting substrate SSB is bonded to a lower surface of the interlayer insulating film IL3.

A structure of the semiconductor substrate SB2, a semiconductor element(s) formed near the second main surface, and the interlayer insulating film IL2 covering the semiconductor element is partly, i.e., except a structure under the wiring M1 in the interlayer insulating film IL2, the same as a structure of the semiconductor substrate SB3, a semiconductor element(s) formed near the third main surface, the interlayer insulating film IL3 covering the semiconductor element. That is, the photodiode PD2 is formed on the second main surface of the semiconductor substrate SB2 in each pixel PER, and the insulating film IF1 is formed on the second rear surface of the semiconductor substrate SB2. Additionally, formed is the plug PG1 that penetrates the insulating film IF1, the element isolation region EI2 penetrating the semiconductor substrate SB2, and a part of the interlayer insulating film IL2 and that is connected to the upper surface of the wiring M1 in the interlayer insulating film IL2. The plug PG1 is electrically connected to the transfer transistor TX lying near the second main surface of the semiconductor substrate SB2 through the wiring M1 and the contact plug CP in the interlayer insulating film IL2.

Additionally, formed in the interlayer insulating film IL2 is the wiring M2 under the wiring M1. Incidentally, formed also in the interlayer insulating film IL3 may be the wirings M2 and M3 etc. different from the wiring M1 in height. In the interlayer insulating film IL2, a via-hole is connected to the lower surface of the wiring M2, and an upper surface of the plug PG2 to be embedded in a connection hole (trench) formed on the lower surface of the interlayer insulating film IL2 is connected to the lower surface of the via-hole. That is, the plug PG2 shown by FIG. 27 has a structure obtained by inverting upside down the plug PG2 shown by FIG. 1.

The structure of the semiconductor substrate SB1, a semiconductor element(s) formed near the first main surface, the interlayer insulating film IL1 covering the semiconductor element is the same as the structure of the semiconductor substrate SB2, a semiconductor element(s) formed near the second main surface, and the interlayer insulating film IL2 covering the semiconductor element. That is, the photodiode PD1 is formed on the first main surface of the semiconductor substrate SB1 in each pixel PE, and the insulating film IF1 is formed on the first rear surface of the semiconductor substrate SB1. Additionally, formed is the plug PG1 that penetrates the insulating film IF1, the element isolation region EI1 penetrating the semiconductor substrate SB1, and a part of the interlayer insulating film IL1 and that is connected to the upper surface of the wiring M1 in the interlayer insulting film IL1. The plug PG1 is electrically connected, through the wiring M1 and the contact plug CP in the interlayer insulating film IL1, the transfer transistor TX lying near the first main surface of the semiconductor substrate SB1. In the interlayer insulating film IL1, the wiring M2 is formed under the wiring M1, and the plug PG2 is connected to the lower surface of the wiring M2 through the via-hole.

The rear surface sides of the semiconductor substrates SB1 to SB3 on which the photodiodes PD1 to PD3 are formed are all directed upward. That is, all of the photodiodes PD1 to PD3 are rear-surface irradiation type light reciting elements (photoelectric converters). That is, when an image(s) is taken by using the solid state image sensor, light beams irradiated from the rear surface sides of the respective semiconductor substrates SB1 to SB3 are received and photoelectrically converted by the corresponding photodiodes PD1 to PD3.

Each pixel PE has three photodiodes PD1 to PD3 laminated in a longitudinal direction. The respective photodiodes PD1 to PD3 are light receivers photoelectrically converting light beams different from each other in wavelength. For example, the photodiode PD1 photoelectrically converts blue light, the photodiode PD2 photoelectrically converts green light, and the photodiode PD3 photoelectrically converts red light. In the present embodiment, since the plurality of photodiodes are laminated and provided in one pixel, the respective light beams having a plurality of kinds of wavelengths can be received separately in one pixel. Therefore, improvement in the sensitivity performance of the solid state image sensor, high integration of the pixels, and minuteness of the solid state image sensor become easy in comparison with a case of arranging alongside, on the main surface of one semiconductor substrate, the plurality of pixels photoelectrically converting the light beams different from each other in wavelength. Thus, the performance of the solid state image sensor can be improved.

Incidentally, the peripheral transistor is not illustrated herein, but the peripheral transistors such as amplification transistors are respectively formed in each pixel PE near the same main surfaces of the semiconductor substrates SB1 to SB3, on which the photodiodes PD1 to PD3 are formed, or near the main surface(s) of any of the semiconductor substrates SB1 to SB3. That is, the peripheral transistor connected to the photodiode PD1 through the transfer transistor TX is formed near the first main surface of the semiconductor substrate SB1.

Herein, the lower surface of the plug PG2 embedded in the trench formed in the lower surface of the interlayer insulating film IL1 in each pixel PE is connected to the insulating film IF1 contacting with the second rear surface of the semiconductor substrate SB2, and to the upper surface of the plug PG1 penetrating the element isolation region EI2. Additionally, the lower surface of the plug PG2 embedded in the trench formed in the lower surface of the interlayer insulating film IL2 in each pixel PE is connected to the insulating film IF1 contacting with the third rear surface of the semiconductor substrate SB3, and to the upper surface of the plug PG1 penetrating the element isolation region EI3. By doing so, electrically connected to one another through the plugs PG1 and PG2 are: a semiconductor element(s) near the first main surface of the semiconductor substrate SB1 and the wirings M1 and M2 in the interlayer insulating film IL1; a semiconductor element(s) near the second main surface of the semiconductor substrate SB2, and the wirings M1 and M2 in the interlayer insulating film IL2; and a semiconductor element(s) near the third main surface of the semiconductor substrate SB3, and the wiring M1 in the interlayer insulating film IL3.

Thus, three semiconductor substrates or more each having the plug PG1 exposed from the rear surface side and the plug PG2 exposed from the main surface side can be laminated in the longitudinal direction.

The solid state image sensor according to the present embodiment can be formed by mutually overlapping and joining a first laminated body and a plurality of laminated bodies each having the same structure as the first laminated body, the first laminated body having the semiconductor substrate SB1, the insulating film IF1 covering the first rear surface of the semiconductor substrate SB1, the interlayer insulating film IL1 covering the first main surface of the semiconductor substrate SB1, the plug PG1 exposed from the first rear surface side, and the plug PG2 exposed from the first main surface side. In a joint surface of joining the laminated bodies to each other, the interlayer insulating film IL1 or IL2 composed of a silicon oxide film and the insulating film IF1 composed of a silicon oxide film are joined, and the plugs PG1 and PG2 are joined. Such hybrid joint realizes joint of the rear surface side of one of the semiconductor substrates and the main surface side of the other semiconductor substrate, thereby realizing electrical connection between the laminated bodies due to the fine connection part per pixel PE.

That is, electrically connected by the fine connection part in each pixel PE without using the Si through-electrode are: the first laminated body including the semiconductor substrate SB1; a second laminated body including the semiconductor substrate SB2; and a third laminated body including the semiconductor substrate SB3. Therefore, the solid state image sensor can be made finer. Additionally, since a current path(s) electrically connecting the semiconductor substrates SB1 to SB3 to each other in each pixel PE can be shortened, power consumption and noises of the solid state image sensor can be reduced.

Additionally, since the plug PG1 penetrating the element isolation region EI1, EI2, or EI3 is formed herein, the plug PG1 and the semiconductor substrates SB1 to SB3 are insulated from each other. Therefore, it is possible to prevent the plugs PG1 and the semiconductor substrates SB1 to SB3 from being short-circuited, and prevent noises from being generated in signals obtained from the photodiodes PD1 to PD3 due to an influence of a current etc. flowing in the plug PG1.

Moreover, in manufacturing steps of the solid state image sensor according to the present embodiment, since the SOI substrate does not need to be used, manufacture costs for the solid state image sensor can be prevented from increasing.

Further, like the solid state image sensor that is modification example 1 of embodiment 1 as explained with reference to FIG. 11, the plug DP penetrating the element isolation region EI1, EI2, or EL3 may be provided between the wiring M1 and the plug PG1 in each laminated body.

Additionally, herein explained has been a case of using, as the rear-surface irradiation type light receiving element, each of the photodiodes PD1 to PD3. However, by inverting the structure shown by FIG. 27 upside down and bonding the supporting substrate SSB to the insulating film IF1 covering the first rear surface of the semiconductor substrate SB1, each of the photodiodes PD1 to PD3 may be used as a front-surface irradiation type light receiving element.

<Modification Example>

Figure 28:
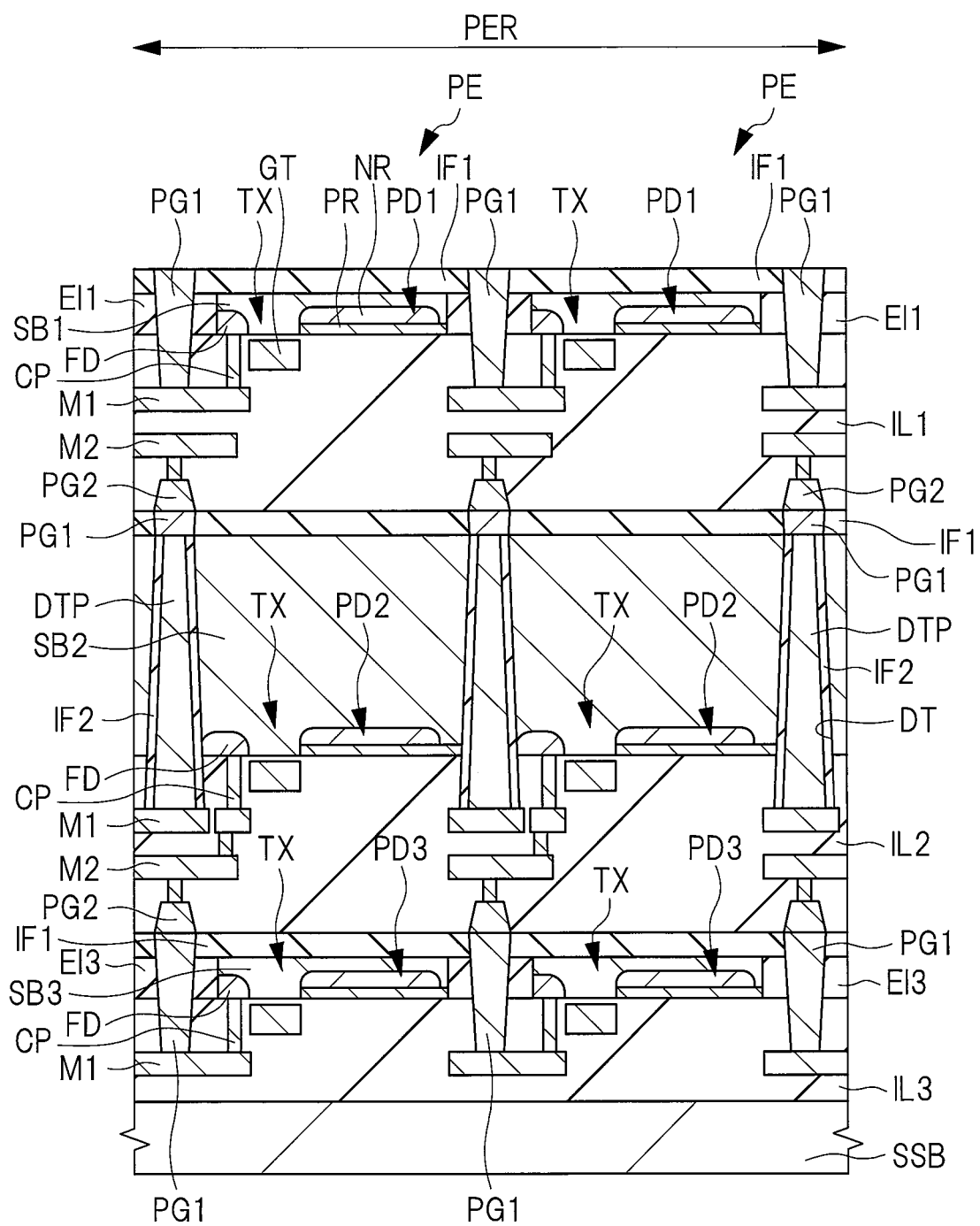
FIG. 28 is a sectional view illustrating a solid state image sensor that is a modification example of embodiment 2 according to the present invention.

Illustrated in FIG. 28 is a sectional view of a solid state image sensor that is a modification example of the present embodiment. FIG. 28 is a sectional view of a location corresponding to FIG. 27. A case in which a laminated body including apart of a semiconductor substrate has a plug in a deep plug (DTI) will be herein explained in a structure including three semiconductor substrates or more similarly to a solid state image sensor shown by FIG. 28.

As shown in FIG. 28, a structure of the solid state image sensor of the present modification example is almost the same as the structure shown by FIG. 27 except the point that the semiconductor substrate SB2 has large thickness and a deep plug DTP penetrating the semiconductor substrate SB2 is formed. A structure from the wiring M1 in the interlayer insulating film IL2 covering the second main surface (lower surface) of the semiconductor substrate SB2 to the insulating film IF1 covering the second rear surface (upper surface) of the semiconductor substrate SB2 is the same as a structure obtained by inverting upside down the structure from the wiring M1 in the interlayer insulating film IL1 covering the first main surface (upper surface) of the semiconductor substrate SB1 shown by FIG. 15 to the insulating film IF1 covering the first rear surface (lower surface) of the semiconductor substrate SB1.

That is, each of thickness of the semiconductor substrate SB2 and depths of the trench DT and the plug DTP as shown by FIG. 28 is about several tens μm. The upper surface of the plug DTP is connected to the lower surface of the plug PG1 lying in the connection hole that is formed in the insulating film IF1 covering the second rear surface of the semiconductor substrate SB2. The lower surface of the plug DTP is connected to the upper surface of the wiring M1 in the interlayer insulating film IL2.

The present modification example can obtain the effect of the solid state image sensor shown by FIG. 27. Additionally, by enlarging and ensuring the film thickness of the semiconductor substrate SB2, a region in which light irradiated to the semiconductor substrate SB2 is photoelectrically converted can be increased. Therefore, since the electric charges to be stored in the photodiode PD2 can be increased in taking an image(s), the sensitivity performance of the solid state image sensor can be improved. Further, the thickness of the semiconductor substrate SB2 can be also adjusted in accordance with, for example, the wavelength of the light serving as an object to be photoelectrically converted in the photodiode PD2.

Incidentally, not only the semiconductor substrate SB2 but also the other semiconductor substrate SB1 or SB3 may have a film thickness of about several tens μm, and have the deep plug DTP.

(Embodiment 3)

Figure 29:
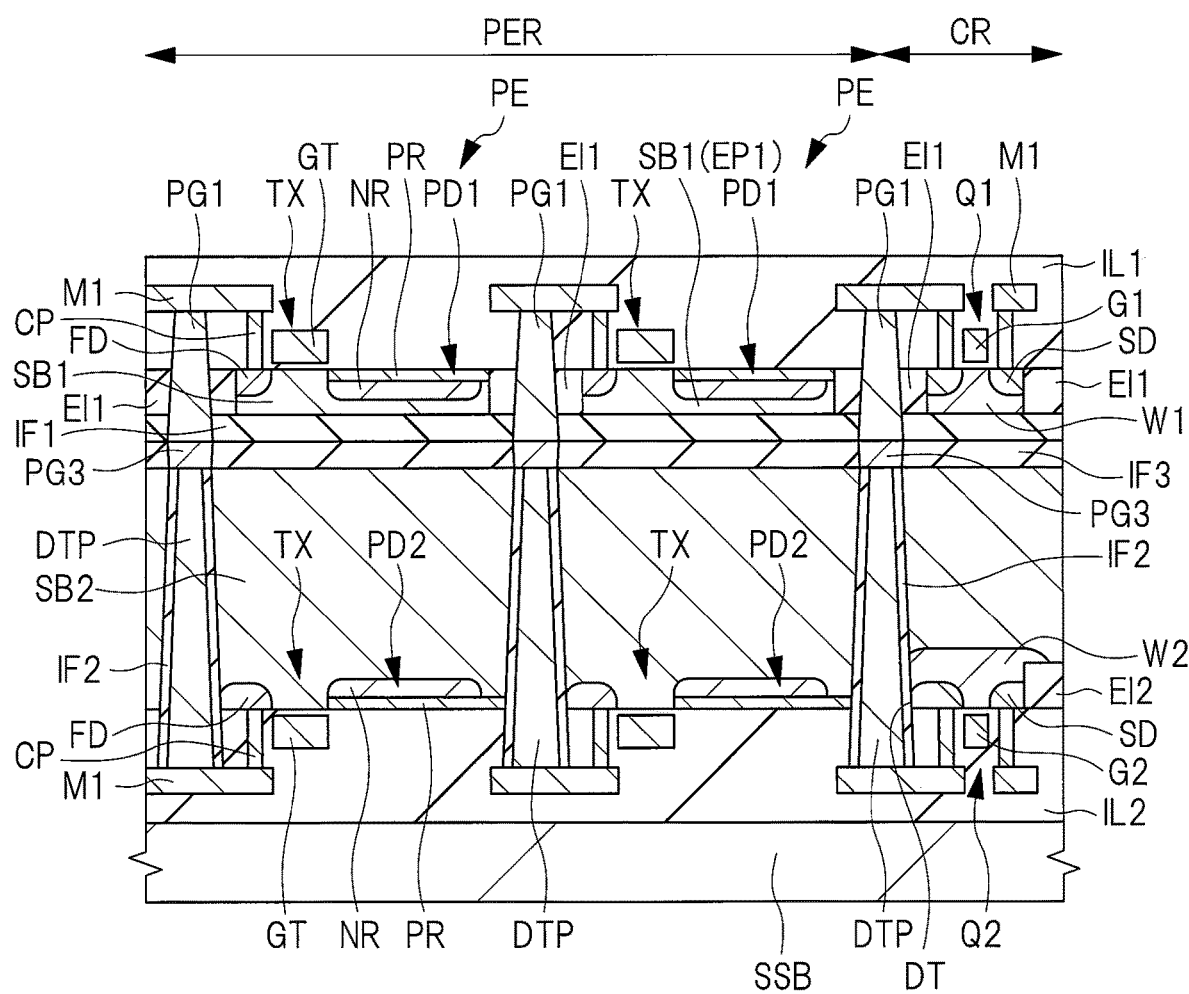
FIG. 29 is a sectional view illustrating a solid state image sensor that is embodiment 3 according to the present invention.

Illustrated in FIG. 29 is a sectional view of a solid state image sensor that is present embodiment 3. FIG. 29 is a sectional view of a location corresponding to FIG. 1. Herein explained will be a case of opposing rear surfaces of two semiconductor substrates to each other and laminating the two semiconductor substrates.

As shown in FIG. 29, the solid state image sensor according to present embodiment 3 has a structure of laminating, over the supporting substrate SSB, the semiconductor substrate SB2 and the semiconductor substrate SB1 over the semiconductor substrate SB2. In each pixel PE, the photodiode PD2 is formed on the second main surface of the semiconductor substrate SB2, and the photodiode PD1 is formed on first main surface of the semiconductor substrates B1. That is, one pixel PE has two photodiodes PD1 and PD2 arranged alongside in the longitudinal direction. The first main surface of the semiconductor substrate SB1 is directed upward, while the second main surface of the semiconductor substrate SB2 is directed downward. Namely, the photodiode PD1 is a front-surface irradiation type (FSI) light receiving element, and the photodiode PD2 is a rear-surface irradiation type (BSI) light receiving element.

A structure of a first laminated body having the semiconductor substrate SB1, the insulating film IF1 covering the semiconductor substrate SB1, the interlayer insulating film IL1 covering the first main surface of the semiconductor substrate SB1, and the plug PG1 exposed from the first rear surface side is a laminated body formed on the interlayer insulating film IL2 shown by FIG. 1, and is the same as the structure of the first laminated body including the semiconductor substrate SB1, the insulating film IF1, and the interlayer insulating film IL1. Additionally, a structure of a third laminated body having the semiconductor substrate SB2 shown by FIG. 29, an insulating film IF3 covering the second rear surface of the semiconductor substrate SB2, an insulating film IL2 covering the second main surface of the semiconductor substrate SB2, and the plug PG3 exposed from the second rear surface side is the same as a structure obtained by inverting upside down the laminated body formed on the interlayer insulating film IL2 shown by FIG. 15. That is, the structure of the third laminated body is the same as a structure obtained by inverting upside down the first laminated body including the semiconductor substrate SB1, the insulating film IF1, and the interlayer insulating film IL1. Namely, the insulating film IF3 shown by FIG. 15 corresponds to the insulating film IF1 shown by FIG. 1, and the plug PG3 shown in FIG. 15 corresponds to the plug PG1 shown by FIG. 1.

As shown in FIG. 29, the upper surface of the plug DTP penetrating the semiconductor substrate SB2 having a thickness of several tens μm is connected to the plug (conductive connection part) PG3 embedded in the connection hole penetrating the insulating film IF3 covering the second rear surface (upper surface) of the semiconductor substrate SB2. The insulating film IF3 is composed of, for example, a silicon oxide film. The supporting substrate SSB is bonded to the lower surface of the interlayer insulating film IL2 covering the second main surface (lower surface) of the semiconductor substrate SB2.

Incidentally, although the peripheral transistor is not illustrated herein, the peripheral transistors such as the amplification transistors are formed, in each pixel PE, near the main surfaces of the same semiconductor substrates SB1 and SB2, on which the respective photodiodes PD1 and PD2 are formed, or near the main surface of any of the semiconductor substrates SB1 and SB2. That is, for example, the peripheral transistor connected to the photodiode PD1 through the transfer transistor TX is formed near the maim surface of the semiconductor substrate SB1.

For example, in the predetermined pixel PE, blue light is photoelectrically converted by the photodiode PD1, and red light is photoelectrically converted by the photodiode PD2. Additionally, in another pixel PE adjacent to the pixel PE, blue light is photoelectrically converted by the photodiode PD1, and green light is photoelectrically converted by the photodiode PD2. Like this, since light beams different from each other in wavelength are photoelectrically converted by each of the photodiodes PD1 and PD2, three kinds of light beams of red, blue and green are photoelectrically converted by the two pixels. That is, by using the solid state image sensor having few pixels in comparison with a case of using only the light receiving element formed on the main surface of one semiconductor substrate, signals per different wavelength can be obtained in taking the image. Therefore, the improvement in the sensitivity performance, the fineness, and the high pixelation of the solid state image sensor become easy.

The upper surface of the plug PG3 is connected (joined) to the lower surface of the plug PG1. By doing so, the semiconductor element(s) and the wiring M1 on the semiconductor substrate SB2 side in each pixel PE are electrically connected to the semiconductor element(s) and the wiring M1 on the semiconductor substrate SB1 side through the plugs DPT, PG3, and PG1.

The solid state image sensor of the present embodiment can be formed by overlapping and joining a first laminated body and a second laminated body to each other. The first laminated body has the semiconductor substrate SB1, the insulating film IF1, the interlayer insulating film IL1, and the plug PG1 on the first rear surface side, and the second laminate body has the semiconductor substrate SB2, the insulating film IF3, the interlayer insulating film IL2, and the plug PG3 on the first rear surface side. In a joint surface of joining those laminated bodies to each other, the insulating films IF1 and IF3 each composed of a silicon oxide film are joined to each other, and the plugs PG1 and PG3 are joined to each other. Such hybrid joint realizes a joint of the first rear surface side of the upper semiconductor substrate SB1 and the second rear surface side of the lower semiconductor substrate SB2, thereby realizing electrical connection between the laminated bodies due to the fine connection part per pixel PE.

That is, the first laminated body including the semiconductor substrate SB1 and the second laminated body including the semiconductor substrate SB2 can be electrically connected to each other by the fine plugs PG1 and PG3 in each pixel PE without using the Si through-electrode. Therefore, the solid state image sensor can be made finer. Additionally, since the connection between the semiconductor substrates SB1 and SB2 is made without using the Si through-electrode, the current path(s) making electrical connection(s) between the semiconductor substrates SB1 and SB2 in each pixel PE can be shortened, so that power consumption and noises of the solid state image sensor can be reduced.

Similarly to the comparative example explained with reference to FIG. 32, when the main surface sides of the substrates are joined to each other, the photodiode PD1 formed on the first main surface of the semiconductor substrate SB1 laminated above becomes a rear-surface irradiation type light receiving element. Here, if blue light is photoelectrically converted by using the upper photodiode PD1, there is a problem of deteriorating sensitivity performance in comparison with a case of photoelectrically converting the blue light by using the front-surface irradiation type light receiving element.

In contrast, the present embodiment does not join the main surface sides of the substrates to each other but opposes and joins the rear surfaces of the semiconductor substrates SB1 and SB2 to each other, so that the photodiode PD formed on the upper semiconductor substrate SB1 can be made the front-surface irradiation type light receiving element. Therefore, in comparison with a case in which the photodiode PD1 formed on the upper semiconductor substrate SB1 is a rear-surface irradiation type, the sensitivity performance can be prevented from deteriorating in photoelectrically converting the blue light by the photodiode PD1.

Additionally, since the plug PG1 penetrating the element isolation region EI1 is herein formed, the plug PG1 and the semiconductor substrate SB1 are isolated from each other. Therefore, it is possible to prevent the plug PG1 and the semiconductor substrate SB1 from being short-circuited, and to prevent noises from being generated in the signal(s) obtained from the photodiode PD1 due to an influence of the current etc. flowing in the plug PG1.

Further, the thickness of the semiconductor substrate SB2 is about several tens μm and is large, so that the region in which the light irradiated to the semiconductor substrate SB2 is photoelectrically converted can be increased. Therefore, since the electric charges stored in the photodiode PD2 in taking the image can be increased, the sensitivity performance of the solid state image sensor can be improved. Here, depth of the n type semiconductor region NR configuring the photodiode PD2 may be larger than depth of the n type semiconductor region NR configuring the photodiode PD1.

Moreover, the manufacturing steps of the solid state image sensor according to the present embodiment need to use no SOI substrate, so that the manufacture costs of the solid state image sensor can be prevented from increasing.

Incidentally, similarly to the solid state image sensor of modification example 1 of embodiment 1 explained with reference to FIG. 11, the plug DP penetrating the element isolation region EI1 may be provided between the wiring M1 and the plug PG1.

<Modification 1>

Figure 30:
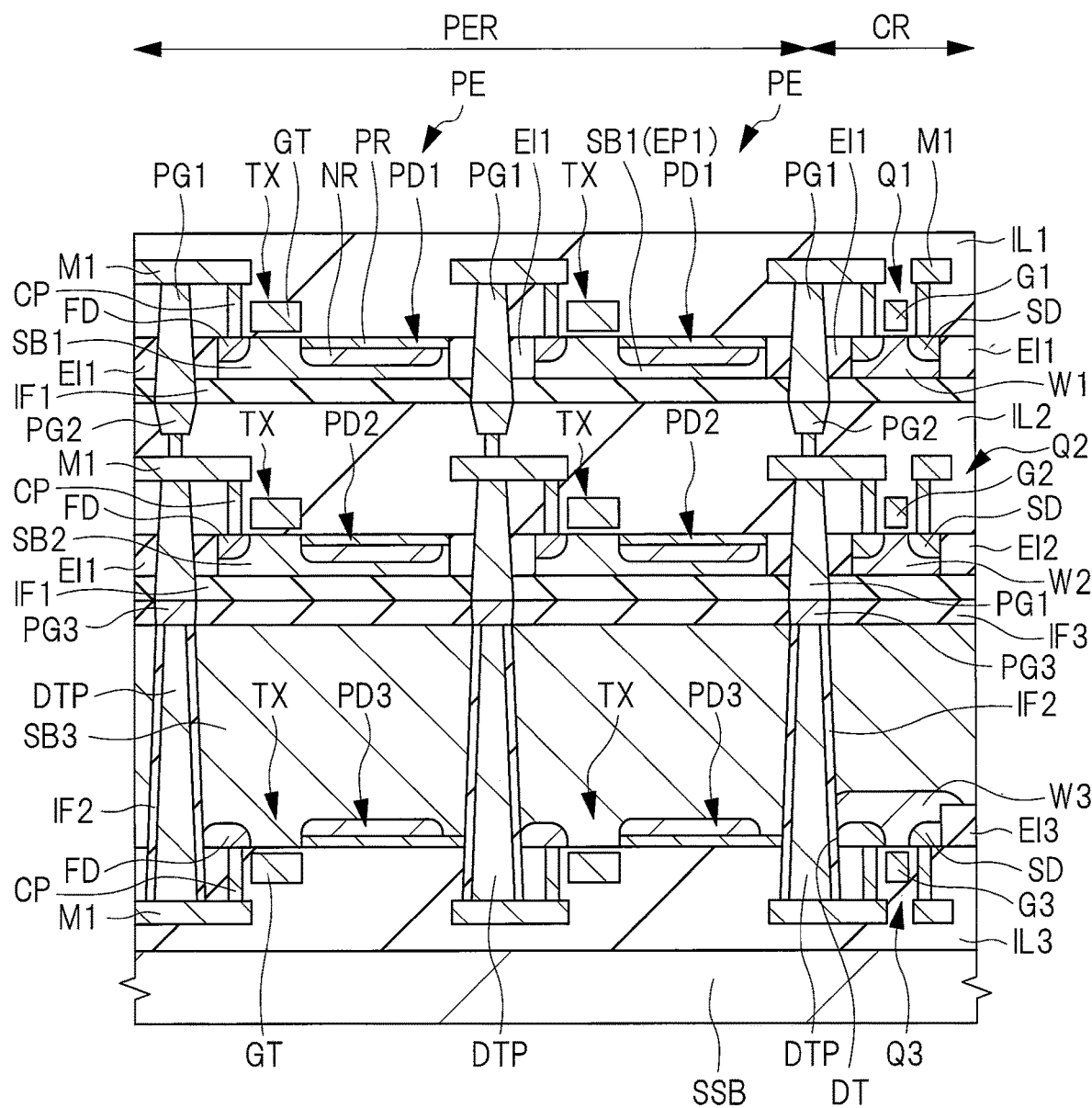
FIG. 30 is a sectional view illustrating a solid state image sensor that is modification example 1 of embodiment 3 according to the present invention.

Illustrated in FIG. 30 is a sectional view that is modification example 1 of the present embodiment. FIG. 30 is a sectional view of a location corresponding to FIG. 29. Herein explained will be a case of using a technique, in which two semiconductor substrates are laminated by opposing their rear surface sides to each other, and a technique, in which two semiconductor substrates are laminated by opposing the main surface side of the semiconductor substrate and the rear surface side of the other semiconductor substrate, to laminate three semiconductor substrates or more.

As shown in FIG. 30, the solid state image sensor of the present modification example has a structure of laminating, on the supporting substrate SSB, the semiconductor substrate SB3, the semiconductor substrate SB2 over the semiconductor substrate SB3, and the semiconductor substrate SB1 over the semiconductor substrate SB2. In each pixel PE, the photodiode PD3 is formed on the third main surface of the semiconductor substrate SB3; the photodiode PD2 is formed on the second main surface of the semiconductor substrate SB2; and the photodiode PD1 is formed on the first main surface of the semiconductor substrate SB1. That is, one pixel PE has three photodiodes PD1 to PD3 arranged alongside in the longitudinal direction. The first main surface of the semiconductor substrate SB1 and the second main surface of the semiconductor substrate SB2 are directed upward, while the third main surface of the semiconductor substrate SB3 is directed downward. That is, the photodiodes PD1 and PD2 are front-surface irradiation type (FSI) light receiving elements, and the photodiodes PD3 is the rear-surface irradiation type (BSI) light receiving element.

A structure of a first laminated body having the semiconductor substrate SB1 shown by FIG. 30, the insulating film IF1 covering the first rear surface of the semiconductor substrate SB1, the interlayer insulating film IL1 covering the first main surface of the semiconductor substrate SB1, and the plug PG1 exposed from the first rear surface side is the same as the structure of the first laminated body formed on the interlayer insulating film IL2 shown by FIG. 29 and including the semiconductor substrate SB1, the insulating film IF1, and the interlayer insulating film IL1.

A structure of a second laminated body having the semiconductor substrate SB2 shown by FIG. 30, the insulating film IF1 covering the second rear surface of the semiconductor substrate SB2, the interlayer insulating film IL2 covering the second main surface of the semiconductor substrate SB2, and the plug PG1 exposed from the second rear surface side is similar to the structure of the first laminated body formed on the interlayer insulating film IL2 shown by FIG. 29 and including the semiconductor substrate SB1, the insulating film IF1, and the interlayer insulating film IL1. However, in the interlayer insulating film IL2 shown by FIG. 30, the via-hole(s) are formed on or over the wiring M1, and the bottom surface of the plug PG2 embedded in the connection hole formed on the upper surface of the interlayer insulating film IL2 is connected to the upper surface of the via-hole.

Additionally, a structure of a third laminated body having the semiconductor substrate SB3 shown by FIG. 30, the insulating film IF3 covering the third rear surface of the semiconductor substrate SB3, the interlayer insulating film IL3 covering the third main surface of the semiconductor substrate SB3, and the plug PG3 exposed from the third rear surface side is the same as the structure of the second laminated body positioned between the insulating film IF1 shown by FIG. 29 and the supporting substrate SSB and including the semiconductor substrate SB2.

That is, as shown in FIG. 30, the semiconductor substrate SB3 has film thickness larger than those of the semiconductor substrates SB1 and SB2, and its film thickness is, for example, about several tens μm. The upper surface of the plug DTP penetrating the semiconductor substrate SB3 is connected to the lower surface of the plug PG3. In a joint surface of joining the third laminated body including the semiconductor substrate SB3 and the second laminated body including the semiconductor substrate SB2, the insulating films IF1 and IF3 composed of silicon oxide films are joined to each other, and the plug PG1 on the second laminated body side and the plug PG3 on the third laminated body side are joined to each other. Additionally, in a joint surface of joining the second laminated body including the semiconductor substrate SB2 and the first laminated body including the semiconductor substrate SB1, the insulting film IF1 and the interlayer insulating film IL2 composed of silicon oxide films are joined to each other, and the plug PG1 on the first laminated body side and the plug PG2 on the second laminated body side are joined to each other.

Such hybrid joint realizes joint of the first rear surface side of the semiconductor substrate SB1 and the second main surface side of the semiconductor substrate SB2, and realizes joint of the rear surface side of the semiconductor substrate SB2 and the third rear surface side of the semiconductor substrate SB3, thereby realizing electrical connection between the laminated bodies due to the fine connection part per pixel PE. Herein, the element etc. on the semiconductor substrate SB3 side and the element etc. on the semiconductor substrate SB2 side are electrically connected through the plug DTP, PG3, and PG1, and the element etc. on the semiconductor substrate SB2 side and the element etc. of the semiconductor substrate SB1 side are electrically connected through the plugs PG2 and PG1.

The present modification example can obtain almost the same as that of the solid state image sensor explained with reference to FIG. 29. Additionally, by using a technique of joining the rear surface sides of the substrates to each other and a technique of joining the main surface side of one substrate and the rear surface side of the other substrate, it is possible to form three light receiving elements or more laminated in one pixel PE and to photoelectrically convert light beams different from each other in wavelength by each of the light receiving elements.

In the present modification example, for example, the photodiode PD 1 photoelectrically converts blue light; the photodiode PD2 photoelectrically converts green light; and the photodiode PD3 photoelectrically converts red light. Like this, light beams having a plurality of kinds of wavelengths are received by one pixel PE, and mutually different electrical signals converted from their light beams can be obtained. Therefore, in the main surface of one semiconductor substrate, improvement in the sensitivity performance of the solid state image sensor, high integration, and fineness of the solid state image sensor become easy in comparison with a case of arranging alongside, on the main surface of one semiconductor substrate, a plurality of pixels photoelectrically converting the light beams different from each other in wavelength. Thus, the performance of the solid state image sensor can be improved.

Additionally, in laminating three semiconductor substrates or more by using a technique of opposing the rear surface sides of two substrates to each other to laminate the two substrates and a technique of opposing the main surface side of the substrate and the rear surface side of the other substrate to laminate the two substrates, the front-surface irradiation type light receiving element and the rear-surface irradiation type light receiving element can be freely arranged in the solid state image sensor composed of the laminated substrates.

Incidentally, not only the semiconductor substrate SB3 having the rear-surface irradiation type photodiode PD3 but also the semiconductor substrate SB1 or SB2 having the front-surface irradiation type photodiode PD1 or PD2 may have a film thickness of about several tens μm, and have the deep plug DTP.

Incidentally, the third laminated body including the semiconductor substrate SB3 is joined to the second rear surface side of the semiconductor substrate SB2, but the third laminated body may be positioned between the first laminated body and the second laminated body. In this case, a plug similar to the plug PG2 is formed on the lower surface of the interlayer insulating film IL3, and the plug and the plug PG2 on the upper surface of the second laminated body are connected. Additionally, the plug PG3 and the plug PG1 on the lower surface of the first laminated body including the semiconductor substrate SB1 are connected. By doing so, three laminated bodies can be electrically connected to each other.

<Modification Example 2>

Figure 31:
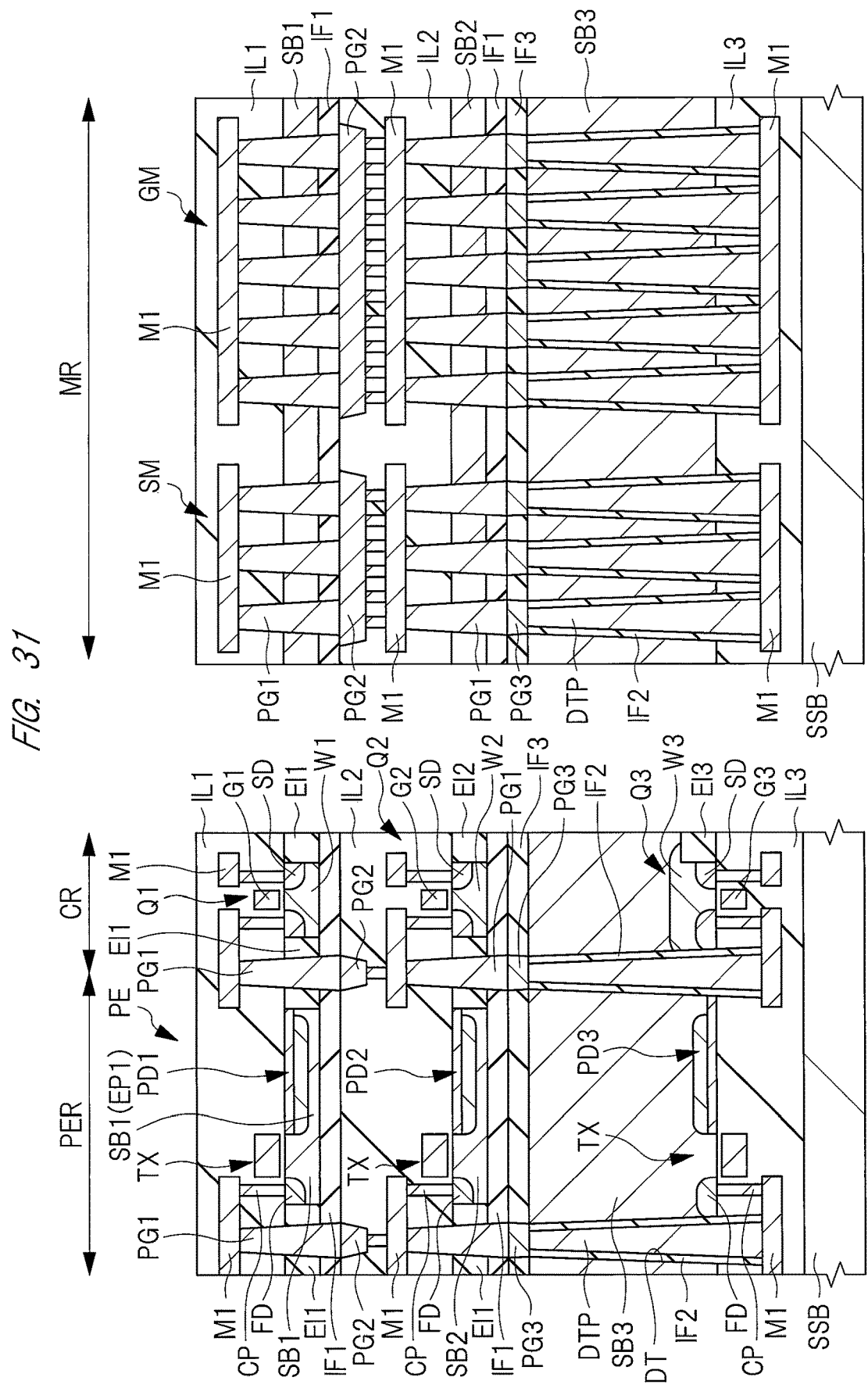
FIG. 31 is a sectional view illustrating a solid state image sensor that is modification example 2 of embodiment 3 according to the present invention.

Illustrated in FIG. 31 is a sectional view of a solid state image sensor that is modification example 2 of the present embodiment. FIG. 31 shows a pixel region PER, a peripheral circuit region CR, and a wiring region MR in this order from left in the drawing. In this drawing, the pixel region PER and the peripheral circuit region CR are illustrated in a state of separating from the wiring region MR, but those three regions are regions configuring one solid state image sensor composed of the same laminated substrates. The peripheral circuit region CR and the wiring region MR are herein illustrated separately, but the wiring region MR may be a part of the peripheral circuit region CR. Herein explained will be a case of forming a lower resistance wiring(s) in the wiring region MR.

A structure of the pixel region PER and the peripheral circuit region CR shown by FIG. 31 is the same as the structure of the pixel region PER and the peripheral circuit region CR shown by FIG. 30. Therefore, the present modification example can obtain almost the same effect as that of the solid state image sensor explained with reference to FIG. 30

In a semiconductor device, which has a laminated wiring(s), such as the solid state image sensor, widths or thicknesses of the upper via-holes (plugs) and the wirings are set so as to be larger than those of the lower via-holes and the wirings, and low resistance via-holes (plugs) and wirings are formed on or in an upper portion of a laminated wiring layer(s) in some cases. That is, for example, in a semiconductor device that has a first wiring layer formed on a semiconductor element and including the closest first-layered wiring to the semiconductor element and a second wiring layer including a second-layered wiring in the first wiring layer, a low resistance semi-global wiring thicker than the second-layered wiring is formed on the second wiring layer, and a low resistance global wiring thicker than the semi-global wiring is formed on the semi-global wiring in some cases.

However, if the thicknesses of the via-holes and the wirings at the upper portion of the solid state image sensor are made larger, the interlayer insulating film at the uppermost portion of the semiconductor device is made thicker, so that there are problems of attenuation of light irradiated to the light receiving element and deterioration in sensitivity performance. In contrast, in the present modification example, i.e., in the solid state image sensor having a structure of laminating the semiconductor substrates, the low resistance wirings are not laminated over the semiconductor element(s), and are formed so as to be arranged alongside in a lateral direction of the pixel region.

As shown in FIG. 31, as the above-mentioned low resistance wiring, the Si through-electrode is not used herein, and a plug having the same structure as that of the plug used for the electrical connection(s) between the laminated substrates in each pixel PE is formed in the wiring region MR. Formed in the wiring region MR are the semi-global wiring SM and the global wiring GM. The semi-global wiring SM and the global wiring GM are configured by: the wiring M1 in the interlayer insulating film IL3; the plugs DTP, PG3, and PG1; the wiring M1 in the interlayer insulating film IL2; the via-hole in the interlayer insulating film IL2; the plugs PG2 and PG1; and the wiring M1 in the interlayer insulating film IL1, all of which are formed in order from downside.

The wiring M1 in the interlayer insulating film IL3 configuring the semi-global wiring SM, and the wiring M1 in the interlayer insulating film IL2 are electrically connected through the plugs DTP, PG3, and PG1 connected in series in order from the interlayer insulating film IL3 side toward the interlayer insulating film 112 side. A plurality of current paths each configured by such plugs DTP, PG3, and PG1 as to connect the wiring M1 in the interlayer insulating film IL3 and the wiring M1 in the interlayer insulating film IL2 are connected in parallel between the wiring M1 in the interlayer insulating film IL3 and the wiring M1 in the interlayer insulating film IL2. Additionally, the wiring M1 and the plug PG1 in the interlayer insulating film IL2 configuring the semi-global wiring SM are connected in parallel by the plurality of via-holes. Further, the wiring M1 in the interlayer insulating film IL1 and the plug PG2 configuring the semi-global wiring SM are connected in parallel by the plurality of plugs PG1.

By the semi-global wiring SM, the wiring M1 in the interlayer insulating film IL3 and the wiring M1 in the interlayer insulating film IL1 are electrically connected through: the plugs DTP, PG3, and PG1; the wiring M1 in the interlayer insulating film IL2; and the via-hole, plugs PG2 and pG1 in the interlayer insulating film IL2.

The global wiring GM also has almost the same structure as that of the semi-global wiring SM. However, the number of plugs PG1, PG3, and DTP and via-holes configuring the global wiring GM is more than the number of plug PG1, PG3, and DTP and via-holes configuring the semi-global wiring SM. For this reason, resistance between the wiring M1 in the interlayer insulating film IL3 and the wiring M1 in the interlayer insulating film IL2 within the global wiring GM is lower than resistance between the wiring M1 in the interlayer insulating film IL3 and the wiring M1 in the interlayer insulating film IL2 within the semi-global wiring SM.

Like this, the low resistance wirings (conductive connection parts) can be provided in the wiring region MR by using the wiring M1, the plugs PG1 to PG3 and DTP, and the via-holes which are formed by the same step as the forming step of the plugs etc. provided for electrical connection(s) between the substrates in each pixel PE. In the present modification example, by varying the number of plugs PG1, PG3, and DTP and via-holes, the low resistance wiring having a desired resistance value can be easily formed.

Incidentally, the plural plugs PG1, PG3, and DTP and the plural via-holes arranged alongside in a certain direction are illustrated in the cross-section of FIG. 31, but the plural PG1, PG3, and DTP and the via-holes configuring the semi-global wiring SM and the global wiring GM may be arranged, for example, alongside in a matrix in a plan view and connected to the respective wirings M1.

Additionally, a format of making the plug PG2 extend in a lateral direction similarly to the wiring M1 is shown in FIG. 31. However, the semi-global wiring SM or global wiring GM may be configured by the plural plugs PG2 arranged similarly to the plug PG3. Inversely, the plug PG3 is caused to extend in a lateral direction similarly to the plug PG2 shown by FIG. 31, and the plural plugs PG1 and DTP may be connected to one plug PG3.

In the foregoing, the inventions made by the inventors of the present invention have been concretely described based on the embodiments. However, it is needless to say that the present invention is not limited to the foregoing embodiments and various modifications and alterations can be made within a range not departing from the gist of the present invention.

Besides, a part of contents described in the embodiments will be described below.

(Note 1) A solid state image sensor having a plurality of pixels arranged in a pixel region includes:

a first semiconductor substrate having a first main surface and a first rear surface opposite to the first main surface;

a first light receiving element formed on the first main surface of the first semiconductor substrate in each of the plural pixels;

a first insulating film covering the first rear surface of the first semiconductor substrate;

a first conductive connection part penetrating the first insulating film and electrically connected to the first light receiving element;

a second semiconductor substrate having a second main surface and a second rear surface opposite to the second main surface;

a semiconductor element formed near the second main surface of the second semiconductor substrate;

a second insulating film covering the second rear surface of the second semiconductor substrate; and a second conductive connection part penetrating the second insulating film and electrically connected to the semiconductor element, in which the first and second insulating films are joined to each other and the first and second conductive connection parts are joined to each other in a joint surface of first and second laminated bodies, the first laminated body including the first semiconductor substrate, first conductive connection part, and first insulating film, and the second laminated body including the second semiconductor substrate, second conductive connection part, and second insulating film.

(Note 2) A manufacturing method of a solid state image sensor having a plurality of pixels arranged in a pixel region includes:

(a) a step of preparing a first semiconductor substrate, the first semiconductor substrate having a first main surface and a first rear surface opposite to the first main surface, and having a first light receiving element formed on the first main surface, a first interlayer insulating film covering the first main surface, and a first insulating film covering the first rear surface;

(b) a step of preparing a second semiconductor substrate, the second semiconductor substrate having a second main surface and a second rear surface opposite to the second main surface, and having a semiconductor element formed near the second main surface, and a second interlayer insulating film covering the second main surface;

(c) a step of forming a first conductive connection part penetrating the first insulating film and electrically connected to the first light receiving element;

(d) a step of forming a first connection hole in an upper surface of the second interlayer insulating film and thereafter forming, in the first connection hole, a second conductive connection part electrically connected to the semiconductor element; and (e) a step of joining, after the (c) and (d) steps, a lower surface of the first insulating film and the upper surface of the second interlayer insulating film to each other and joining a lower surface of the first conductive connection part and an upper surface of the second conductive connection part to each other to laminate the first and second semiconductor substrates, in which each of the plural pixels has the first light receiving element.

(Note 3) In the manufacturing method of a solid state image sensor in accordance with (Note 2), the (a) step includes:

(a2) a step of preparing the first semiconductor substrate, the first semiconductor substrate having the first light receiving element and an element isolation region embedded in a trench formed in the first main surface;

(a3) a step of forming the first interlayer insulating film on the first main surface;

(a4) a step of forming a third connection hole penetrating the first interlayer insulating film and the element isolation region;

(a5) a step of embedding a third conductive connection part in the third connection hole;

(a6) a step of forming, over the third conductive connection part, a first wiring electrically connecting the third conductive connection part and the first light receiving element;

(a7) a step of exposing the third conductive connection part and the element isolation region by polishing the first rear surface;

(a8) a step of forming, after the (a7) step, the first insulating film covering the first rear surface; and (a9) a step of forming the first conductive connection part penetrating the first insulating film and connected to the third conductive connection part.

(Note 4) In the manufacturing method of a solid state image sensor in accordance with (Note 2), the (a) step includes:

(a2) a step of preparing the first semiconductor substrate having the first light receiving element;

(a3) a step of forming the first interlayer insulating film on the first main surface;

(a4) a step of forming a second connection hole penetrating the first interlayer insulating film and the first semiconductor substrate;

(a5) a step of embedding, in the second connection hole, a fourth conductive connection part through a second insulating film;

(a6) a step of forming, over the fourth conductive connection part, a first wiring electrically connecting the fourth conductive connection part and the first light receiving element;

(a7) a step of polishing the first rear surface to expose the fourth conductive connection part and the second insulating film;

(a8) a step of forming, after the (a7) step, the first insulating film covering the first rear surface; and (a9) a step of forming the first conductive connection part penetrating the first insulating film and connected to the fourth conductive connection part.

(Note 5) The manufacturing method of a solid state image sensor in accordance with (Note 4) further includes:

(a10) a step of introducing, after the (a4) step and before the (a5) step, a p type impurity into a surface of the first semiconductor substrate exposed from the second connection hole to form a p type semiconductor region, in which a conductive type of the first semiconductor substrate is a p type.

(Note 6) The manufacturing method of a solid state image sensor in accordance with (Note 4) further includes:

(a11) a step of forming, after the (a4) step and before (a5) step, a third insulating film covering a side surface of the second connection hole, in which a dielectric constant of the third insulating film is higher than a dielectric constant of silicon nitride.

What is claimed is:

1. A solid state image sensor having a plurality of pixels arranged in a pixel region, the solid state image sensor comprising:

a first semiconductor substrate having a first main surface and a first rear surface opposite to the first main surface;

a first light receiving element formed on the first main surface of the first semiconductor substrate in each of the plural pixels;

a first insulating film covering the first rear surface of the first semiconductor substrate;

a first conductive connection part penetrating the first insulating film and electrically connected to the first light receiving element;

a second semiconductor substrate having a second main surface and a second rear surface opposite to the second main surface;

a semiconductor element formed near the second main surface of the second semiconductor substrate;

a second interlayer insulating film covering the second main surface of the second semiconductor substrate;

a second conductive connection part embedded in a connection hole in an upper surface of the second interlayer insulating film and electrically connected to the semiconductor element, a first interlayer insulating film covering the first main surface of the first semiconductor substrate;

a first wiring formed in the first interlayer insulating film; and a third conductive connection part connected to the first wiring and the first conductive connection part and penetrating the first semiconductor substrate, wherein the first insulating film and the second interlayer insulating film are joined to each other and the first and second conductive connection parts are joined to each other in a joint surface of first and second laminated bodies, the first laminated body including the first semiconductor substrate, first conductive connection, and first insulating film, and the second laminated body including the second semiconductor substrate, second conductive connection part, and second interlayer insulating film, and wherein the first conductive connection part is electrically connected to the first light receiving element through the third conductive connection part and the first wiring.

2. The solid state image sensor according to claim 1, wherein the semiconductor element is an amplification transistor, selection transistor, or reset transistor, and the semiconductor element and the first and second conductive connection parts are formed in each of the plural pixels.

3. The solid state image sensor according to claim 1, further comprising:

an element isolation region penetrating the first semiconductor substrate, wherein the third conductive connection part penetrates the element isolation region.

4. The solid state image sensor according to claim 1, further comprising:

a fourth conductive connection part connected to the first wiring and the first conductive connection part and penetrating the first semiconductor substrate; and a second insulating film interposed between the fourth conductive connection part and the first semiconductor substrate and between the fourth conductive connection part and the first interlayer insulating film, wherein the first conductive connection part is electrically connected to the first light receiving element through the fourth conductive connection part and the first wiring.

5. The solid state image sensor according to claim 4, further comprising a p type semiconductor region formed on a surface of the first semiconductor substrate contacting with the second insulating film, wherein a conductive type of the first semiconductor substrate is a p type.

6. The solid state image sensor according to claim 4, further comprising a third insulating film interposed between the second insulating film and the first semiconductor substrate and between the second insulating film and the first interlayer insulating film, wherein a dielectric constant of the third insulating film is higher than a dielectric constant of silicon nitride.

7. The solid state image sensor according to claim 1, further comprising:

a first transfer transistor formed near the first main surface of the first semiconductor substrate;

first and second capacitive elements formed in the second laminated body;

a first metal film embedded in a first trench formed in a lower surface of the first insulating film; and a second metal film embedded in a second trench formed in the upper surface of the second interlayer insulating film, wherein the semiconductor element is a second transfer transistor, the first and second metal films are joined to each other in the joint surface, the first and second transfer transistors are connected to a cathode of the first light receiving element in series, one electrode of the first capacitive element is connected to a source electrode of the second transfer transistor, and one electrode of the second capacitive element is connected to a drain electrode of the second transfer transistor, and the first and second transfer transistors, first and second capacitive elements, and first and second metal films are formed in each of the plural pixels.

8. The solid state image sensor according to claim 7, wherein the first or second capacitive element includes:
a second wiring formed in the second interlayer insulating film; and
a third metal film formed just on the second wiring through a fourth insulating film in the second interlayer insulating film.

9. The solid state image sensor according to claim 1, further comprising:
a fifth insulating film covering the second rear surface of the second semiconductor substrate;
a fifth conductive connection part penetrating the fifth insulating film and electrically connected to a second light receiving element, the semiconductor element being the second light receiving element that is formed on the second main surface of the second semiconductor substrate in each of the plural pixels;
a third semiconductor substrate having a third main surface and a third rear surface opposite to the third main surface;
a third light receiving element formed on the third main surface of the third semiconductor substrate in each of the plural pixels;
a third interlayer insulating film covering the third main surface of the third semiconductor substrate; and
a sixth conductive connection part embedded in a second connection hole in an upper surface of the third interlayer insulating film and electrically connected to the third light receiving element,
wherein the fifth insulating film and the third interlayer insulating film are joined to each other and the fifth and sixth conductive connection parts are joined to each other in a joint surface of the second laminated body and a third laminated body, the second laminated body including the fifth insulating film and fifth conductive connection part, and the third laminated body including the third semiconductor substrate, sixth conductive connection part, and third interlayer insulating film.

10. The solid state image sensor according to claim 1, further comprising:
a fifth insulating film covering the second rear surface of the second semiconductor substrate;
a fifth conductive connection part penetrating the fifth insulating film and electrically connected to a second light receiving element, the semiconductor element being the second light receiving element that is formed on the second main surface of the second semiconductor substrate in each of the plural pixels;
a third semiconductor substrate having a third main surface and a third rear surface opposite to the third main surface;
a third light receiving element formed on the third main surface of the third semiconductor substrate in each of the plural pixels;
a sixth insulating film covering the third rear surface of the third semiconductor substrate; and
a seventh conductive connection part penetrating the sixth insulating film and electrically connected to the third light receiving element,
wherein the fifth and sixth insulating films are joined to each other and the fifth and seventh conductive connection parts are joined to each other in a joint surface of the second laminated body and a third laminated body, the second laminated body including the fifth insulating film and fifth conductive connection part, and the third laminated body including the third semiconductor substrate, seventh conductive connection part, and sixth insulating film.

11. The solid state image sensor according to claim 1, further comprising:
a first interlayer insulating film covering the first main surface of the first semiconductor substrate;
a third wiring formed in the first interlayer insulating film;
a fourth wiring formed in the second interlayer insulating film;
a plurality of eighth conductive connection parts penetrating the first insulating film; and
a plurality of ninth conductive connection parts embedded in a third connection hole in an upper surface of the second interlayer insulating film,
wherein the third and fourth wirings are electrically connected to each other through the plural eighth and ninth conductive connection parts in a first region located around the pixel region.

12. The solid state image sensor according to claim 1, wherein a surface of the first insulating film and a surface of the second interlayer film are directly jointed.

13. A manufacturing method of a solid state image sensor having a plurality of pixels arranged in a pixel region, the manufacturing method comprising:
(a) preparing a first semiconductor substrate, the first semiconductor substrate having a first main surface and a first rear surface opposite to the first main surface, and having a first light receiving element formed on the first main surface, a first interlayer insulating film covering the first main surface, and a first insulating film covering the first rear surface;
(b) preparing a second semiconductor substrate, the second semiconductor substrate having a second main surface and a second rear surface opposite to the second main surface, and having a semiconductor element formed near the second main surface, and a second interlayer insulating film covering the second main surface;
(c) forming a first conductive connection part penetrating the first insulating film and electrically connected to the first light receiving element;
(d) forming a first connection hole in an upper surface of the second interlayer insulating film and then forming, in the first connection hole, a second conductive connection part electrically connected to the semiconductor element; and
(e) joining, after the (c) and (d), a lower surface of the first insulating film and the upper surface of the second interlayer insulating film to each other and joining a lower surface of the first conductive connection part and an upper surface of the second conductive connection part to each other to laminate the first and second semiconductor substrates,
wherein each of the plural pixels has the first light receiving element,
wherein the first semiconductor substrate further includes:
a first wiring formed in the first interlayer insulating film; and
a third conductive connection part connected to the first wiring and the first conductive connection part and penetrating the first semiconductor substrate, and wherein the first conductive connection part is electrically connected to the first light receiving element through the third conductive connection part and the first wiring.

14. The manufacturing method of a solid state image sensor according to claim 13,
wherein the semiconductor element is an amplification transistor, selection transistor, or reset transistor, and
the semiconductor element and the first and second conductive connection parts are formed in each of the plural pixels.

15. The manufacturing method of a solid state image sensor according to claim 13, further comprising:
preparing a second semiconductor substrate during the (b), the second semiconductor substrate having a second light receiving element and a fifth insulating film that covers the second rear surface, the semiconductor element being the second light receiving element that is formed on the second main surface of the second semiconductor substrate in each of the plural pixels;

(a1) preparing a third semiconductor substrate, the third semiconductor substrate having a third main surface and a third rear surface opposite to the third main surface, and having a third light receiving element formed on the third main surface, and a third interlayer insulating film covering the third main surface;

(c1) forming a fifth conductive connection part penetrating the fifth insulating film and electrically connected to the second light receiving element;

(d1) forming a second connection hole in an upper surface of the third interlayer insulating film and then forming, in the second connection hole, a sixth conductive connection part electrically connected to the third light receiving element; and (e1) joining, after the (c1), (d), and (d1), a lower surface of the fifth insulating film and the upper surface of the third interlayer insulating film to each other and joining a lower surface of the fifth conductive connection part and an upper surface of the sixth conductive connection part to each other to laminate the second and third semiconductor substrates.

\* \* \* \* \*